US011289507B2

(12) United States Patent
Kanamori et al.

(10) Patent No.: US 11,289,507 B2
(45) Date of Patent: Mar. 29, 2022

(54) VERTICAL MEMORY DEVICES

(71) Applicant: SAMSUNG ELECTRONICS CO., LTD., Suwon-si (KR)

(72) Inventors: Kohji Kanamori, Suwon-si (KR); Shinhwan Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/853,047

(22) Filed: Apr. 20, 2020

(65) Prior Publication Data

US 2021/0118902 A1    Apr. 22, 2021

(30) Foreign Application Priority Data

Oct. 22, 2019  (KR) .................. 10-2019-0131640

(51) Int. Cl.
*H01L 27/11582* (2017.01)
*H01L 23/522* (2006.01)
(Continued)

(52) U.S. Cl.
CPC .. *H01L 27/11582* (2013.01); *H01L 21/02532* (2013.01); *H01L 21/02592* (2013.01); *H01L 21/02636* (2013.01); *H01L 21/02667* (2013.01); *H01L 21/31111* (2013.01); *H01L 21/31116* (2013.01); *H01L 21/31144* (2013.01);
(Continued)

(58) Field of Classification Search
CPC ......... H01L 27/11582; H01L 27/11573; H01L 27/11575; H01L 27/11565; H01L 27/11578; H01L 27/11568; H01L 27/1157; H01L 27/11521; H01L 27/11514; H01L 27/11551; H01L 27/11597; H01L 23/5226; H01L 23/528; H01L 21/02667; H01L 21/31111; H01L 21/02532; H01L 21/02592; H01L 21/02636; H01L 21/31116; H01L 29/40117

See application file for complete search history.

(56) References Cited

U.S. PATENT DOCUMENTS 8,994,099 B2    3/2015 Lee et al.
9,214,569 B2 *  12/2015 Kim .................. H01L 27/11517
(Continued)

FOREIGN PATENT DOCUMENTS

CN    109411481 A    3/2019

*Primary Examiner* — Galina G Yushina
(74) *Attorney, Agent, or Firm* — Lee IP Law, P.C.

(57) ABSTRACT

A vertical memory device including gate electrodes on a substrate, the gate electrodes being spaced apart in a first direction and stacked in a staircase arrangement; a channel extending through the gate electrodes in the first direction; a first contact plug extending through a pad of a first gate electrode to contact an upper surface of the first gate electrode, the first contact plug extending through a portion of a second gate electrode, and the second gate electrode being adjacent to the first gate electrode; a first spacer between the first contact plug and sidewalls of the first gate electrode and the second gate electrode facing the first contact plug, the first spacer electrically insulating the first contact plug from the second gate electrode; and a first burying pattern contacting bottom surfaces of the first contact plug and the first spacer, the first burying pattern including an insulating material.

20 Claims, 51 Drawing Sheets

(51) Int. Cl.
*H01L 23/528* (2006.01)
*H01L 27/11573* (2017.01)
*H01L 27/11575* (2017.01)
*H01L 27/11565* (2017.01)
*H01L 21/02* (2006.01)
*H01L 21/311* (2006.01)
*H01L 21/28* (2006.01)

(52) U.S. Cl.
CPC ........ *H01L 23/528* (2013.01); *H01L 23/5226* (2013.01); *H01L 27/11565* (2013.01); *H01L 27/11573* (2013.01); *H01L 27/11575* (2013.01); *H01L 29/40117* (2019.08)

(56) References Cited

U.S. PATENT DOCUMENTS

| | | | |
|---|---|---|---|
| 9,337,207 B2* | 5/2016 | Park | H01L 27/11556 |
| 9,991,271 B2 | 6/2018 | Kang et al. | |
| 10,056,333 B2 | 8/2018 | Mizukami et al. | |
| 10,192,928 B2 | 1/2019 | Fukuda et al. | |
| 10,262,936 B2 | 4/2019 | Yazawa | |
| 10,283,566 B2 | 5/2019 | Sel et al. | |
| 2017/0323900 A1* | 11/2017 | Kanamori | H01L 27/0688 |
| 2018/0012903 A1* | 1/2018 | Kim | H01L 23/5283 |
| 2018/0197874 A1 | 7/2018 | Oshiki et al. | |
| 2019/0157283 A1* | 5/2019 | Jung | H01L 27/11573 |

* cited by examiner

VERTICAL MEMORY DEVICES

CROSS-REFERENCE TO RELATED APPLICATION

Korean Patent Application No. 10-2019-0131640, filed on Oct. 22, 2019, in the Korean Intellectual Property Office, and entitled: "Vertical Memory Devices," is incorporated by reference herein in its entirety.

BACKGROUND

1. Field

Embodiments relate to a vertical memory device.

2. Description of the Related Art

In a VNAND flash memory device, when openings for forming contact plugs that may contact upper surfaces of gate electrodes to be electrically connected thereto are formed, the upper surfaces of the gate electrodes may have different heights.

SUMMARY

The embodiments may be realized by providing a vertical memory device including a substrate; gate electrodes on the substrate, the gate electrodes being spaced apart from each other in a first direction that is substantially perpendicular to an upper surface of the substrate and the gate electrodes being stacked in a staircase arrangement; a channel extending through the gate electrodes in the first direction; at least one first contact plug extending through a pad of a first gate electrode among the gate electrodes to contact an upper surface of the first gate electrode, the at least one first contact plug extending through at least a portion of a second gate electrode among the gate electrodes, and the second gate electrode being adjacent to the first gate electrode such that the second gate electrode is a next closest gate electrode under the first gate electrode in the first direction; a first spacer between the at least one first contact plug and sidewalls of the first gate electrode and the second gate electrode facing the at least one first contact plug, the first spacer electrically insulating the at least one first contact plug from the second gate electrode; and a first burying pattern contacting bottom surfaces of the at least one first contact plug and the first spacer, the first burying pattern including an insulating material.

The embodiments may be realized by providing a vertical memory device including a substrate; gate electrodes on the substrate and spaced apart from each other in a vertical direction substantially perpendicular to an upper surface of the substrate, the gate electrodes being stacked in a staircase shape; a blocking pattern covering a lower surface, an upper surface, and a sidewall of each of the gate electrodes; a channel extending through the gate electrodes in the vertical direction; a contact plug extending through a pad of a first gate electrode among the gate electrodes to directly contact an upper surface of the first gate electrode, the contact plug extending through at least a portion of a second gate electrode among the gate electrodes, and the second gate electrode being adjacent to the first gate electrode such that the second gate electrode is a next closest gate electrode under the first gate electrode in the vertical direction; and a first spacer between the contact plug and sidewalls of openings in the first gate electrode and the second gate electrode facing the contact plug, the first spacer electrically insulating the contact plug from the second gate electrode, wherein the blocking pattern does not cover the sidewalls of openings in the first gate electrode and the second gate electrode facing the contact plug such that the first spacer directly contacts the sidewalls of openings in the first and second gate electrodes, the sidewalls of openings in the first and second gate electrodes facing the contact plug.

The embodiments may be realized by providing a vertical memory device including a lower circuit pattern on a substrate; a common source plate (CSP) on the lower circuit pattern; gate electrodes spaced apart from each other on the CSP in a first direction substantially perpendicular to an upper surface of the substrate, the gate electrodes being stacked in a staircase shape; a channel extending through the gate electrodes in the first direction; at least one first contact plug extending through a pad of a first gate electrode among the gate electrodes to contact an upper surface of the first gate electrode, the at least one first contact plug extending through at least a portion of a second gate electrode among the gate electrodes, and the second gate electrode being adjacent to the first gate electrode such that the second gate electrode is a next closest gate electrode under the first gate electrode in the first direction; and a first spacer between the at least one first contact plug and sidewalls of the first gate electrode and the second gate electrode facing the at least one first contact plug, the first spacer electrically insulating the at least one first contact plug from the second gate electrode; a second contact plug extending through a third gate electrode at a lowermost level among the gate electrodes to contact an upper surface of the third gate electrode, the second contact plug extending to a portion of the CSP; a second spacer extending from a sidewall of the third gate electrode facing the second contact plug to the portion of the CSP to surround the second contact plug; and a first insulation pattern in the CSP, the first insulation pattern contacting bottom surfaces of the second contact plug and the second spacer.

The embodiments may be realized by providing a vertical memory device including gate electrodes spaced apart from each other on a substrate in a first direction substantially perpendicular to an upper surface of the substrate, the gate electrodes being stacked in a staircase shape, and each of the gate electrodes extending in a second direction substantially parallel to the upper surface of the substrate; a channel extending through the gate electrodes in the first direction; and first contact plugs disposed in the second direction, each of the first contact plugs extending through corresponding ones of the gate electrodes, wherein the corresponding ones of the gate electrodes include a first gate electrode distal to the substrate and second gate electrodes proximate to the substrate, respectively, each of the first contact plugs extends through a pad of a corresponding one of the first gate electrodes, and a number of the second gate electrodes through which one of the first contact plugs extends is equal to or more than a number of the second gate electrodes through which another one of the first contact plugs extends, the one of the first contact plugs extending through a pad of one of the first gate electrodes distal to the substrate, and the another one of the first contact plugs extending through a pad of one of the first gate electrodes proximate to the substrate.

The embodiments may be realized by providing a vertical memory device including transistors on a substrate; a lower circuit pattern on the substrate, the lower circuit pattern being electrically connected to the transistors; a common source plate (CSP) on the lower circuit pattern; a channel connection pattern and a support layer sequentially stacked on the CSP; gate electrodes spaced apart from each other on the support layer in a vertical direction substantially perpendicular to an upper surface of the substrate, the gate electrodes being stacked in a staircase shape; channels electrically connected with each other by the channel connection pattern, each of the channels extending through the gate electrodes, the support layer and the channel connection pattern in the vertical direction on the CSP; a first contact plug extending through a pad of a first gate electrode among the gate electrodes to contact an upper surface of the first gate electrode, the first contact plug extending through at least a portion of a second gate electrode among the gate electrodes, and the second gate electrode being adjacent to the first gate electrode such that the second gate electrode is a next closest gate electrode under the first gate electrode in the vertical direction; a spacer between the first contact plug and sidewalls of the first gate electrode and the second gate electrode facing the first contact plug, the spacer electrically insulating the first contact plug from the second gate electrode; a burying pattern contacting bottom surfaces of the first contact plug and the spacer and including an insulating material; a dummy channel spaced apart from the first contact plug on the pad of the first gate electrode, the dummy channel extending through ones of the gate electrodes under the first gate electrode, the support layer, and the channel connection pattern to contact the CSP; a second contact plug extending in the vertical direction on the CSP, the second contact plug being electrically connected to the CSP; and a through via extending in the vertical direction on the lower circuit pattern, the through via being electrically connected to the lower circuit pattern.

BRIEF DESCRIPTION OF THE DRAWINGS

Features will be apparent to those of skill in the art by describing in detail exemplary embodiments with reference to the attached drawings in which.

DETAILED DESCRIPTION

Vertical memory devices and methods of manufacturing the same in accordance with example embodiments will be described more fully hereinafter with reference to the accompanying drawings.

Hereinafter throughout the specifications (and not necessarily in the claims), a vertical direction substantially perpendicular to an upper surface of a substrate may be defined as a first direction, and two directions intersecting with each other among horizontal directions substantially parallel to the upper surface of the substrate may be defined as second and third directions, respectively. In example embodiments, the second and third directions may be orthogonal to each other.

FIGS. 1 to 35 are plan views and cross-sectional views of stages in a method of manufacturing a vertical memory device in accordance with example embodiments. Specifically, FIGS. 1, 6, 8, 13, 16, 31 and 33 are the plan views, and FIGS. 2-5, 7, 9-12, 14-15, 17-30, 32 and 34-35 are the cross-sectional views.

Figure 13:
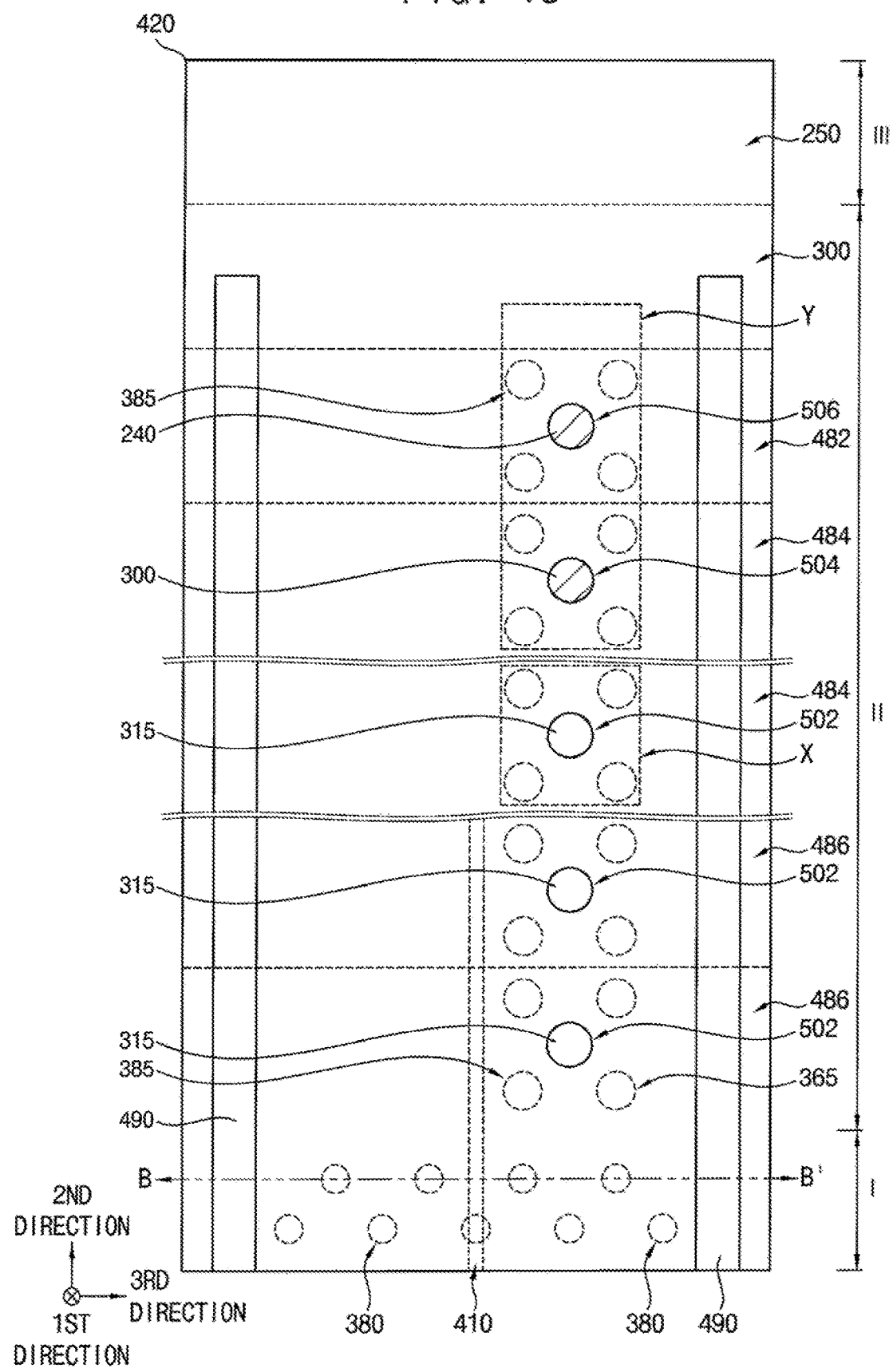
Figure 14:
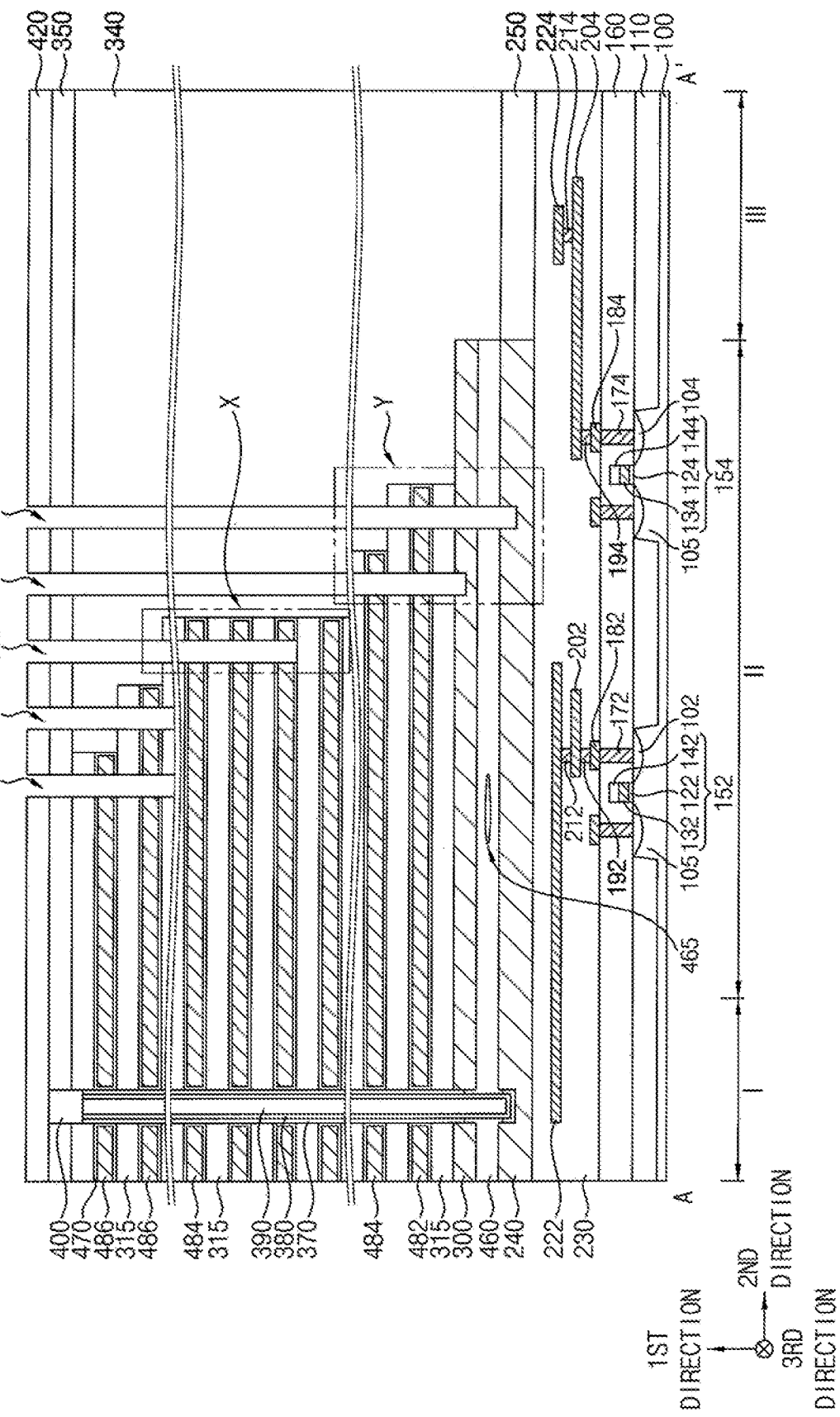
Figure 15:
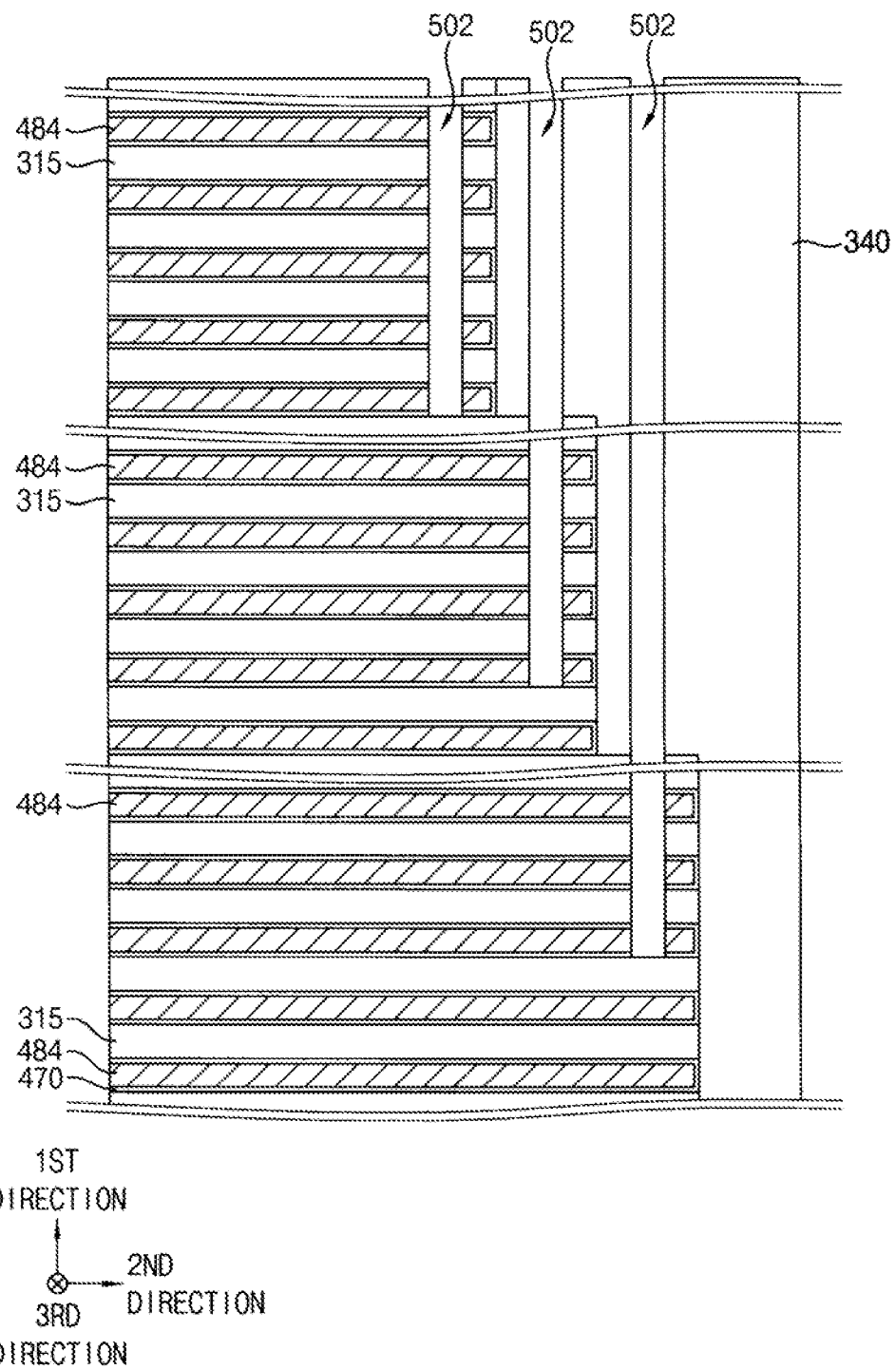
Figure 16:
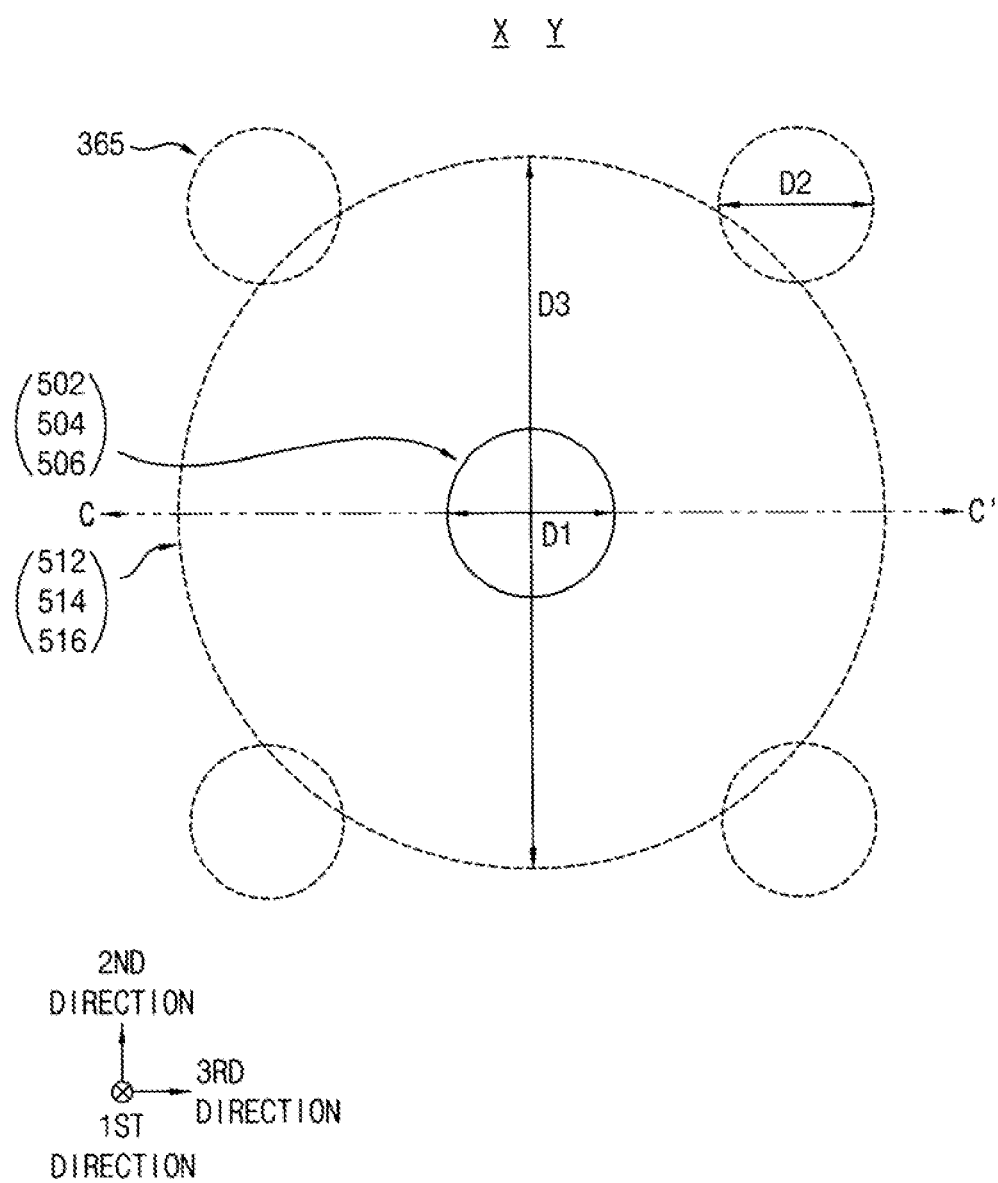

FIGS. 2-5, 7, 14, 32 and 34-35 are cross-sectional views taken along lines A-A' of corresponding plan views, respectively, and FIGS. 9-12 are cross-sectional views taken along B-B' of corresponding plan views, respectively. FIG. 15 is a cross-sectional view of a part of FIG. 14, FIG. 16 is a plan view of a region X or a region Y of FIG. 13, FIGS. 17, 19, 21, 23, 25, 27 and 29 are cross-sectional views taken along lines C-C' of the region X of corresponding plan views, respectively, and FIGS. 18, 20, 22, 24, 26, 28 and 30 are cross-sectional views taken along lines C-C' of the region Y of corresponding plan views, respectively.

Figure 1:
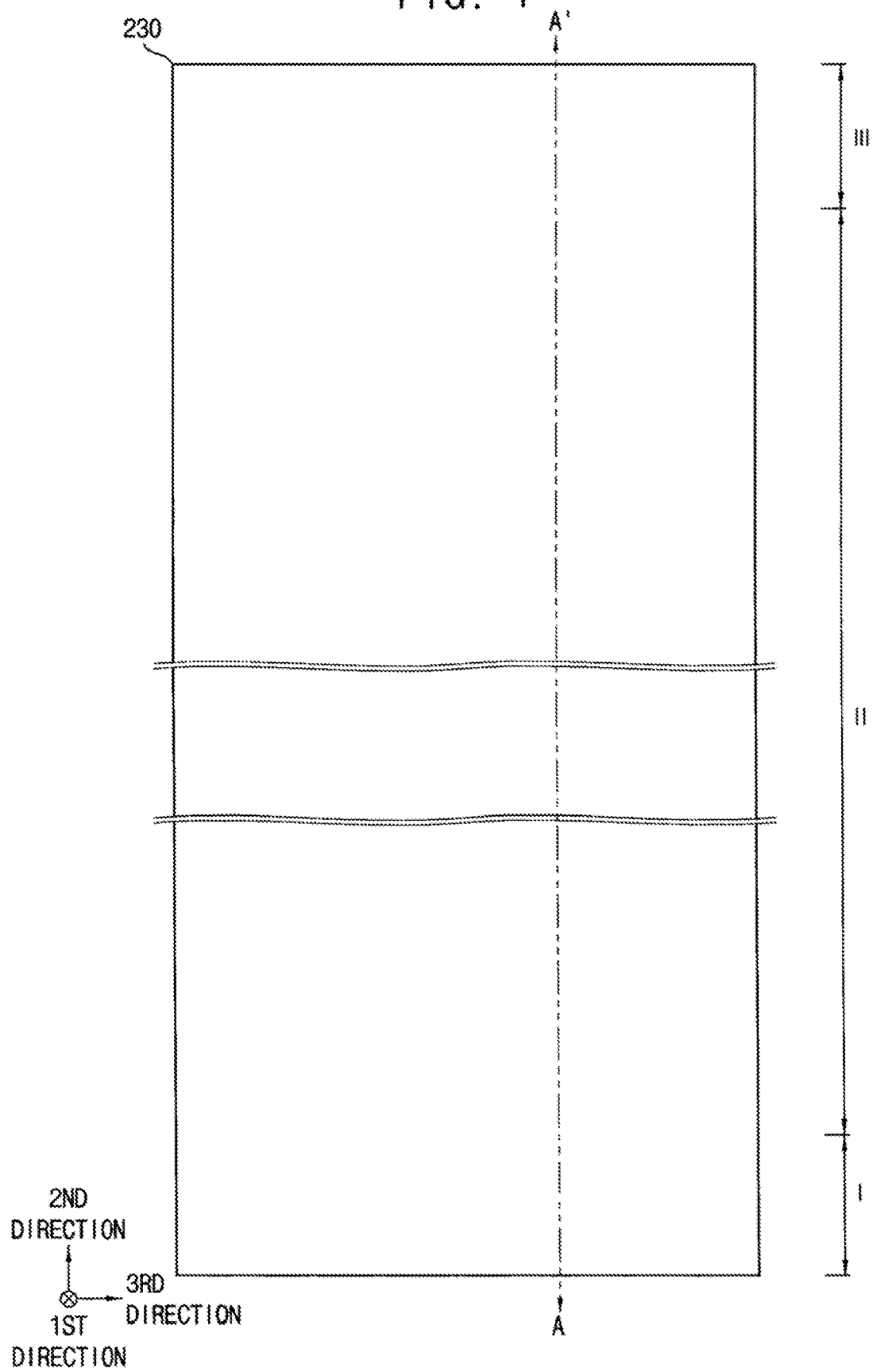
FIGS. 1 to 35 illustrate plan views and cross-sectional views of stages in a method of manufacturing a vertical memory device in accordance with example embodiments.
Figure 2:
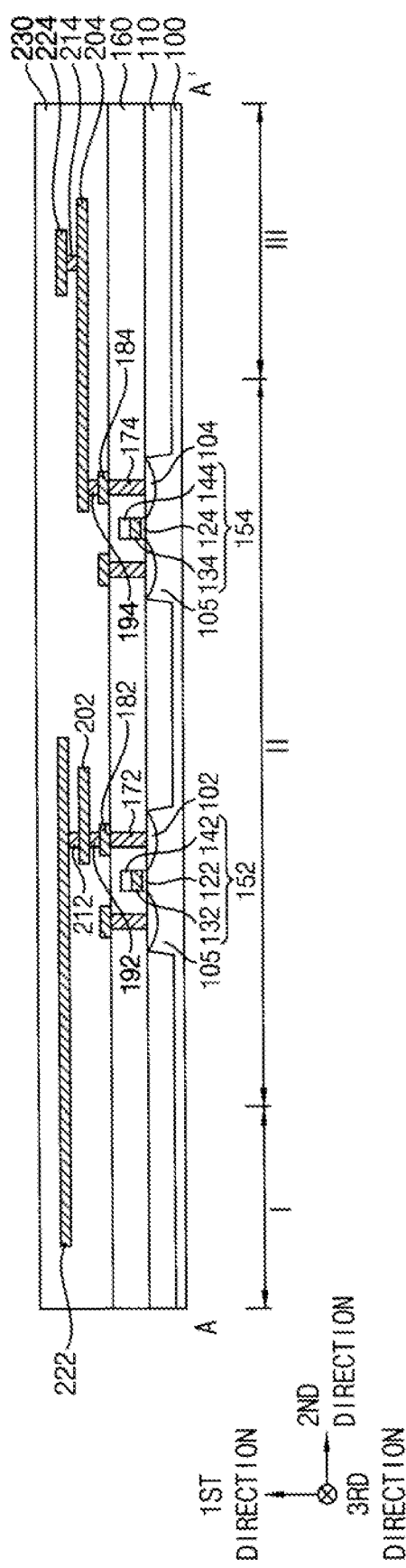

Referring to FIGS. 1 and 2, a lower circuit pattern may be formed on a substrate 100, and first and second insulating interlayers 160 and 230 may be sequentially formed on the substrate 100 to cover the lower circuit pattern.

The substrate 100 may include semiconductor materials e.g., silicon, germanium, silicon-germanium, or the like, or III-V compounds e.g., GaP, GaAs, GaSb, or the like. In an implementation, the substrate 100 may be a silicon-on-insulator (SOI) substrate or a germanium-on-insulator (GOI) substrate.

The substrate 100 may include a field region on which an isolation pattern 110 is formed, and an active region 105 on which no isolation pattern is formed. The isolation pattern 110 may be formed by e.g., a shallow trench isolation (STI) process, and may include an oxide, e.g., silicon oxide.

In an implementation, the substrate 100 may include first, second and third regions I, II and III. The first region I may be a cell array region on which memory cells may be formed, the second region II may be an extension region or a pad region that may surround at least partially the first region I and on which upper contact plugs for transferring electrical signals to the memory cell may be formed, and the third region III may be a peripheral circuit region that may surround at least partially the second region 11 and on which an upper circuit pattern for applying electrical signals to the memory cell via the upper contact plugs may be formed. The first and second regions I and II may form a cell region, and the third region, e.g., the peripheral circuit region may at least partially surround the cell region. Each of FIGS. 1 and 2 shows portions of the first to third regions I, II and III.

In an implementation, the vertical memory device may have a cell over periphery (COP) structure. For example, the lower circuit pattern may be formed on the substrate 100, and the memory cells, the upper contact plugs, and the upper circuit pattern may be formed on the lower circuit pattern.

The lower circuit pattern may include, e.g., transistors, lower contact plugs, lower wirings, lower vias, or the like. In an implementation, a first transistor including a first lower gate structure 152 on the substrate 100 and a first impurity region 102 at an upper portion of the active region 105 adjacent thereto, and a second transistor including a second lower gate structure 154 on the substrate 100 and a second impurity region 104 at an upper portion of the active region 105 adjacent thereto, may be formed.

In an implementation, as illustrated in FIGS. 1 and 2, the first and second transistors may be formed on the second region II of the substrate 100, In an implementation, the first and second transistors may be formed on the first region I and/or the third region 111 of the substrate 100.

The first lower gate structure 152 may include a first lower gate insulation pattern 122, a first lower gate electrode 132 and a first lower gate mask 142 sequentially stacked on the substrate 100, and the second lower gate structure 154 may include a second lower gate insulation pattern 124, a second lower gate electrode 134 and a second lower gat mask 144 sequentially stacked on the substrate 100.

The first insulating interlayer 160 may cover the first and second transistors on the substrate 100, and first and second lower contact plugs 172 and 174 may be formed through the first insulating interlayer 160 to contact the first and second impurity regions 102 and 104, respectively.

First and second lower wirings 182 and 184 may be formed on the first insulating interlayer 160 to contact upper surfaces of the first and second lower contact plugs 172 and 174, respectively. A first lower via 192, a third lower wiring 202, a third lower via 212 and a fifth lower wiring 222 may be sequentially stacked on the first lower wiring 182, and a second lower via 194, a fourth lower wiring 204, a fourth lower via 214 and a sixth lower wiring 224 may be sequentially stacked on the second lower wiring 184.

The first and second lower contact plugs 172 and 174, the first to fourth lower vias 192, 194, 212 and 214, and the first to sixth lower wirings 182, 184, 202, 204, 222 and 224 may include a conductive material, e.g., a metal, a metal nitride, a metal silicide, doped poly silicon, or the like.

The second insulating interlayer 230 may be formed on the first insulating interlayer 160 to cover the first to sixth lower wirings 182, 184, 202, 204, 222 and 224 and the first to fourth lower vias 192, 194, 212 and 214. The first and second insulating interlayers 160 and 230 may form a lower insulating interlayer structure. In an implementation, the first and second insulating interlayers 160 and 230 may include substantially the same material to form a single layer (e.g., without a distinct interface therebetween).

The first and second lower gate structures 152 and 154, the first and second lower contact plugs 172 and 174, the first to fourth lower vias 192, 194, 212 and 214, and the first to sixth lower wirings 182, 184, 202, 204, 222, 224, which may form the lower circuit pattern, may be formed by a patterning process and/or a damascene process.

Figure 3:
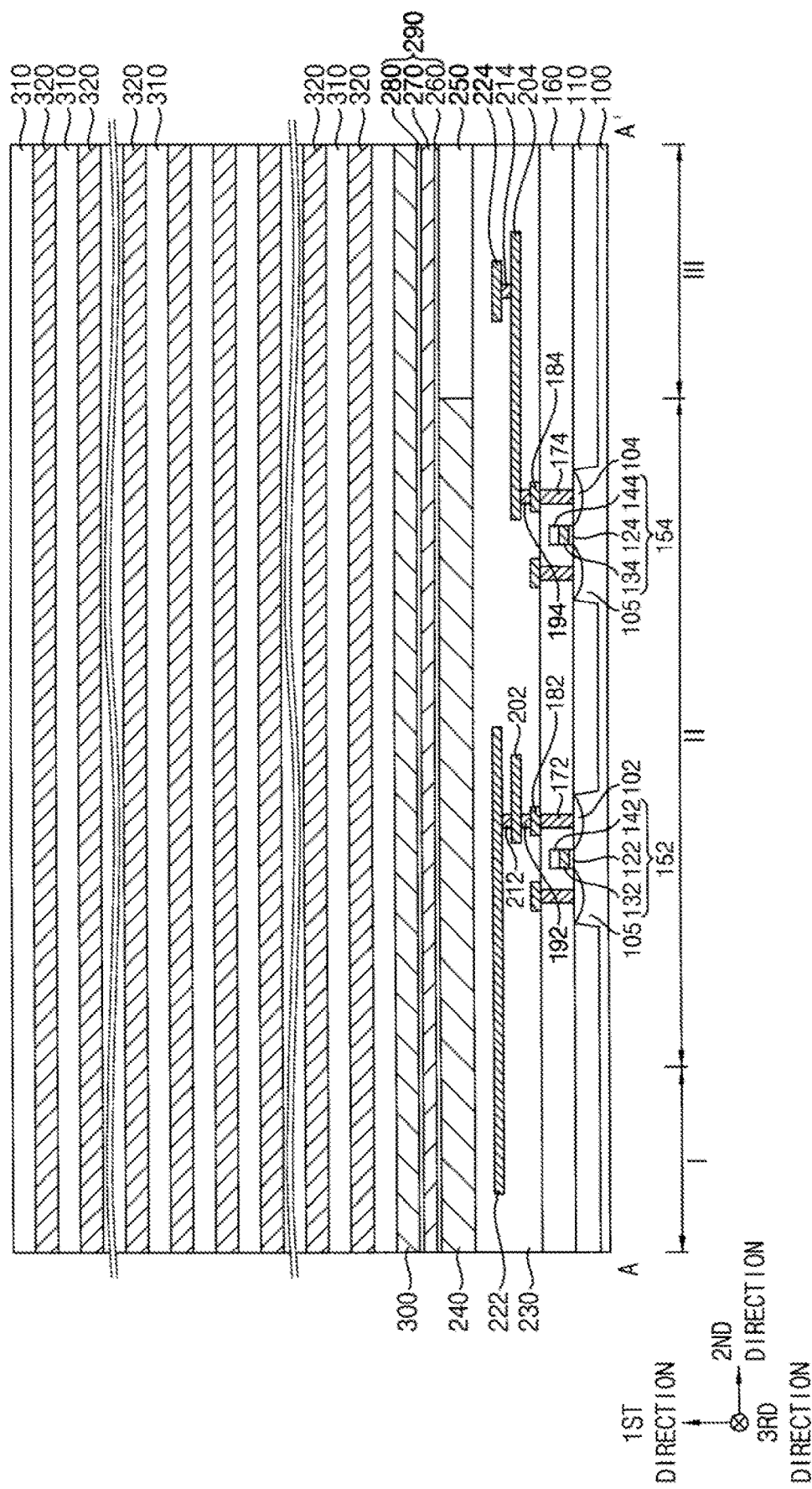

Referring to FIG. 3, a common source plate (CSP) 240 and a third insulating interlayer pattern 250 may be formed on the second insulating interlayer 230.

The CSP 240 may be formed on the second insulating interlayer 230, and then may be patterned so as to remain only on the first and second regions I and II of the substrate 100. The third insulating interlayer pattern 250 may be formed by forming a third insulating interlayer on the second insulating interlayer 230 and planarizing the third insulating interlayer until an upper surface of the CSP 240 is exposed.

The CSP 240 may include, e.g., polysilicon doped with n-type impurities, and the third insulating interlayer pattern 250 may include an oxide, e.g., silicon oxide.

A sacrificial layer structure 290 and a support layer 300 may be formed on the CSP 240 and the third insulating interlayer pattern 250.

The sacrificial layer structure 290 may include first, second and third sacrificial layers 260, 270, and 280 sequentially stacked. The first and third sacrificial layers 260 and 280 may include an oxide, e.g., silicon oxide, and the second sacrificial layer 270 may include a nitride, e.g., silicon nitride.

In an implementation, the support layer 300 may include a material having an etching selectivity with respect to the first to third sacrificial layers 260, 270 and 280, e.g., polysilicon doped with n-type impurities. In an implementation, the support layer 300 may be formed by depositing amorphous silicon doped with n-type impurities and performing a heat treatment, or the amorphous silicon doped with n-type impurities may be crystallized by heat generated during deposition processes of other layers, so that the support layer 300 may include polysilicon doped with n-type impurities. In an implementation, a portion of the support layer 300 may extend through the sacrificial layer structure 290 to contact an upper surface of the CSP 240, which may form a support pattern.

A first insulation layer 310 and a fourth sacrificial layer 320 may be alternately and repeatedly formed on the support layer 300, and thus a mold layer including the first insulation layers 310 and the fourth sacrificial layers 320 may be formed. In an implementation, the first insulation layer 310 may include an oxide, e.g., silicon oxide, and the fourth sacrificial layer 320 may include a material having an etching selectivity with respect to the first insulation layer 310, e.g., a nitride such as silicon nitride.

Figure 4:
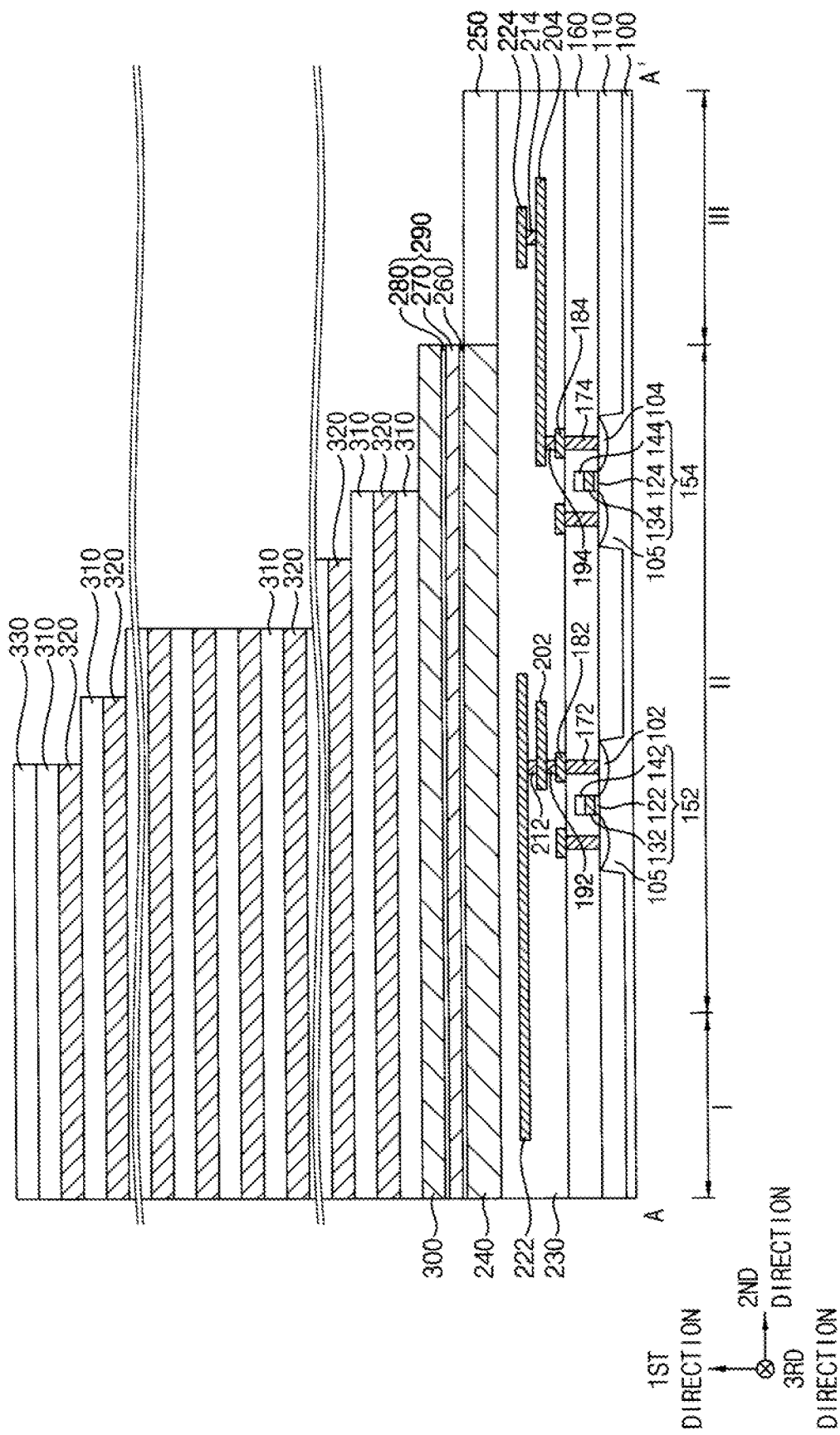

Referring to FIG. 4, an etch stop layer 330 may be formed on an uppermost one of the first insulation layers 310 (e.g., the first insulation layer 310 distal to or farthest from the substrate 100 in the first or vertical direction), a photoresist pattern may be formed to partially cover the etch stop layer 330, and the etch stop layer 330, the uppermost one of the first insulation layers 310, and an uppermost one of the fourth sacrificial layers 320 thereunder may be etched using the photoresist pattern as an etching mask. A portion of one of the first insulation layers 310 directly under the uppermost one of the fourth sacrificial layers 320 may be exposed.

After a trimming process for reducing an area of the photoresist pattern by a given ratio is performed, an etching process may be performed such that the etch stop layer 330, the uppermost one of the first insulation layers 310, the uppermost one of the fourth sacrificial layers 320, the exposed one of the first insulation layers 310 and one of the fourth sacrificial layers 320 thereunder may be etched using the reduced photoresist pattern as an etching mask. As the trimming process and the etching process are repeatedly performed, a mold including a plurality of step layers each of which may include the fourth sacrificial layer 320 and the first insulation layer 310 sequentially stacked and having a staircase shape or arrangement may be formed.

Hereinafter, a "step layer" may be referred to an entire portion of the fourth sacrificial layer 320 and the first insulation layer 310 at the same level, which may include not only an exposed portion but also an non-exposed portion, and an end portion of each of the step layers that may not be overlapped with upper step layers in the first direction to be exposed may be referred to as a "step." In an implementation, the steps may be arranged in the second direction, and further may be arranged in the third direction.

The mold may be formed on the support layer 300 on the first and second regions I and II of the substrate 100, and an upper surface of an edge or end portion of the support layer 300 may not be covered by the mold to be exposed. The steps of the mold may be formed on the second region II of the substrate 100.

Figure 5:
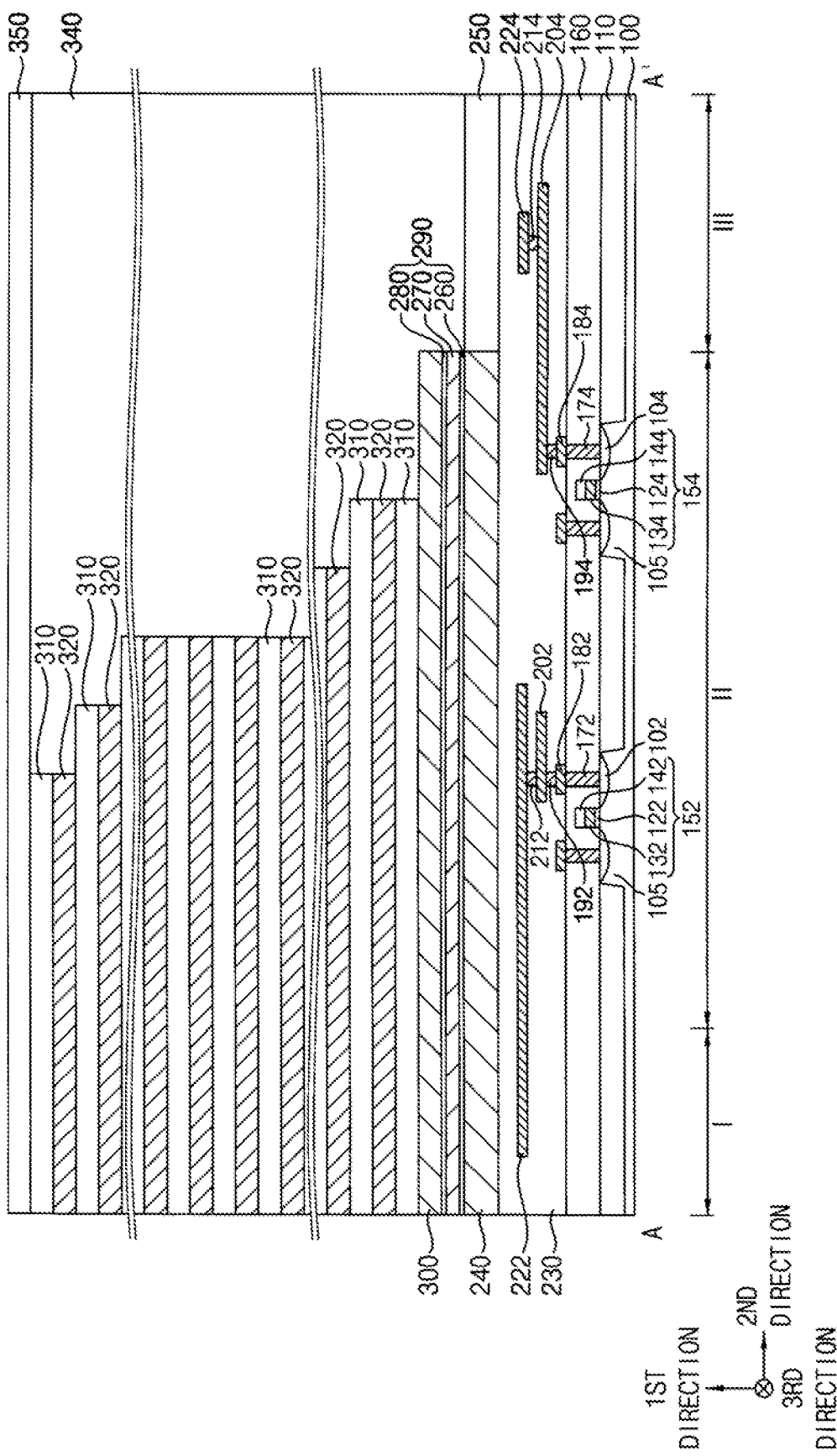

Referring to FIG. 5, a fourth insulating interlayer 340 may be formed on the third insulating interlayer pattern 250 and the CSP 240 to cover the mold, the exposed upper surface of the support layer 300, a sidewall of the sacrificial layer structure 290, and the etch stop layer 330, and may be planarized until an upper surface of the uppermost one of the first insulation layers 310 is exposed. For example, the etch stop layer 330 may be removed, and a sidewall of the mold may be covered by the fourth insulating interlayer 340. The fourth insulating interlayer 340 may include an oxide, e.g., silicon oxide.

A fifth insulating interlayer 350 may be formed on the mold and the fourth insulating interlayer 350. The fifth insulating interlayer 350 may include an oxide, e.g., silicon oxide.

Figure 6:
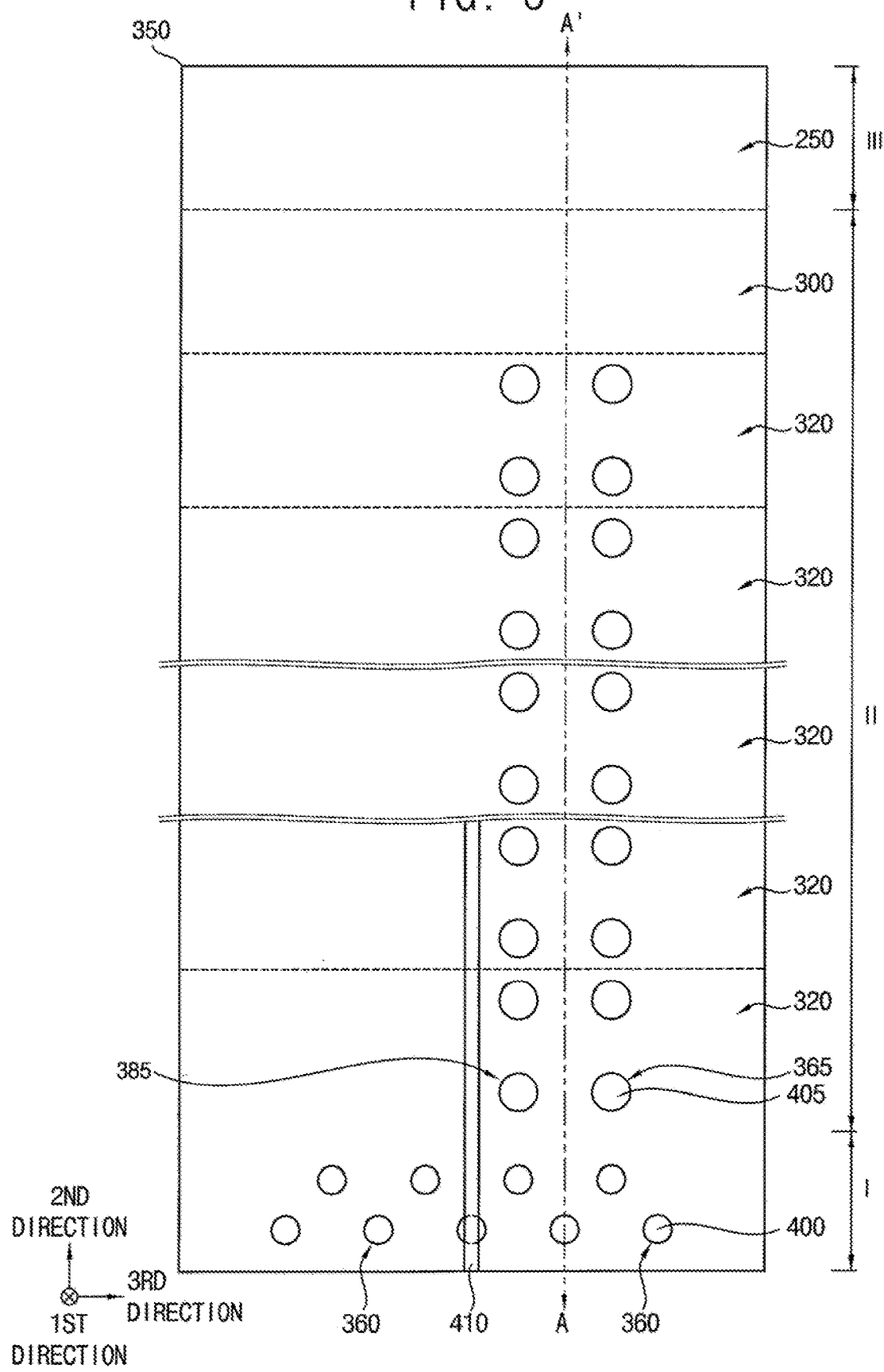
Figure 7:
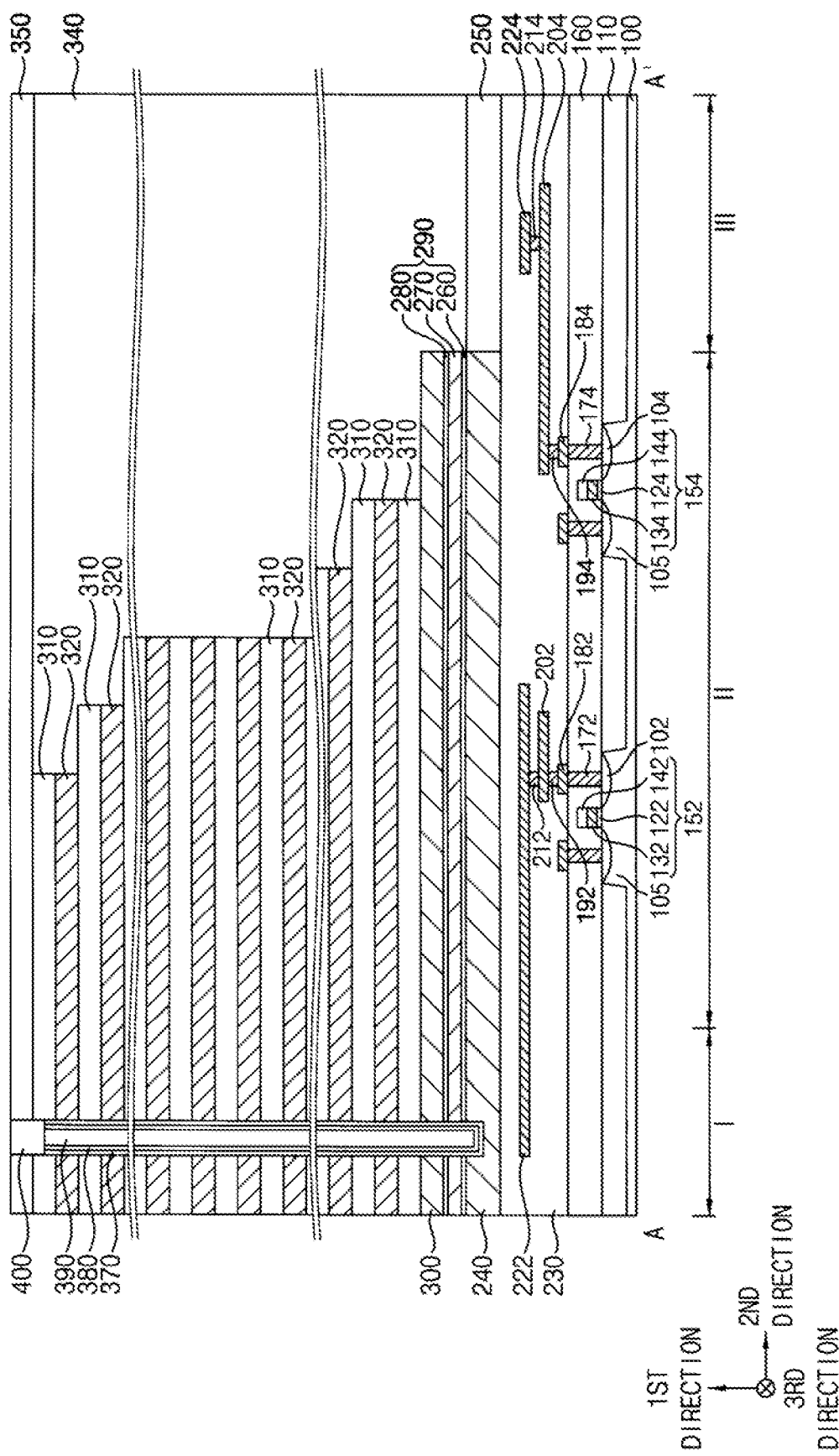

Referring to FIGS. 6 and 7, a first etching mask may be formed on the fifth insulating interlayer 350, and an etching process may be performed using the first etching mask so that a channel hole 360 may be formed through the fifth insulating interlayer 350, the first insulation layers 310, the fourth sacrificial layers 320, the support layer 300, and the sacrificial layer structure 290 (e.g., and partially into the CSP 240) to expose an upper surface of the CSP 240 on the first region I of the substrate 100, and a dummy channel hole 365 may be formed through the fourth and fifth insulating interlayers 340 and 350, the first insulation layers 310, the fourth sacrificial layers 320, the support layer 300, and the sacrificial layer structure 290 to expose an upper surface of the CSP 240 on the second region II of the substrate 100.

In an implementation, a plurality of channel holes 360 may be formed (e.g., to be arranged or spaced apart) in the second and third directions, and a plurality of dummy channel holes 365, e.g., four dummy channel holes 365 may be formed at four vertices, respectively, of a rectangle on each step of the mold.

After removing the first etching mask, a charge storage structure layer and a channel layer may be formed on sidewalls of the channel holes 360 and the dummy channel holes 365, an upper surface of the CSP 240 and an upper surface of the fifth insulating interlayer 350, and a filling layer may be formed on the channel layer to fill the channel holes 360 and the dummy channel holes 365. The filling layer, the channel layer, and the charge storage structure layer may be planarized until the upper surface of the fifth insulating interlayer 350 is exposed to form a charge storage structure 370, a channel 380, and a filling pattern 390 sequentially stacked on each of the channel holes 360 and to form a dummy charge storage structure, a dummy channel 385, and a dummy filling pattern sequentially stacked on each of the dummy channel holes 365.

In an implementation, the charge storage structure 370 may include a tunnel insulation pattern, a charge storage pattern and a first blocking pattern sequentially stacked in a horizontal direction substantially parallel to the upper surface of the substrate 100 from an outer sidewall of the channel 380. The tunnel insulation pattern may include an oxide, e.g., silicon oxide, the charge storage pattern may include a nitride, e.g., silicon nitride, and the first blocking pattern may include an oxide, e.g., silicon oxide. The dummy charge storage structure may also include a dummy tunnel insulation pattern (not shown), a dummy charge storage pattern (not shown) and a dummy first blocking pattern (not shown) sequentially stacked in the horizontal direction from an outer sidewall of the dummy channel 385.

An upper portion of a first pillar structure including the charge storage structure 370, the channel 380, and the filling pattern 390 sequentially stacked in each of the channel holes 360 may be removed to form a first trench, and an upper portion of a second pillar structure including the dummy charge storage structure, the dummy channel 385 and the dummy filling pattern sequentially stacked in each of the dummy channel holes 365 may be removed to form a second trench. First and second capping patterns 400 and 405 may be formed to fill the first and second trenches, respectively.

The first and second capping patterns 400 and 405 may include polysilicon doped with n-type impurities.

A second etching mask may be formed on the fifth insulating interlayer 350, the fifth insulating interlayer 350 and ones of the first insulation layers 310 and the fourth sacrificial layers 320 may be etched to form a first opening therethrough extending in the second direction, and a first division pattern 410 may be formed to fill the first opening.

In an implementation, the first division pattern 410 may extend through upper portions of ones of the channels 380. In an implementation, the first division pattern 410 may extend through the fifth insulating interlayer 350, ones of the fourth sacrificial layers 320 at upper two levels, respectively, and ones of the first insulation layers 310 at upper two levels, respectively, and further a portion of one of the first insulation layers 310 at a third level from above. The first division pattern 410 may extend in the second direction on the first and second regions I and II of the substrate 100, and may extend through upper two step layers of the mold. The fourth sacrificial layers 320 at the upper two levels, respectively, may be separated in the third direction.

Figure 8:
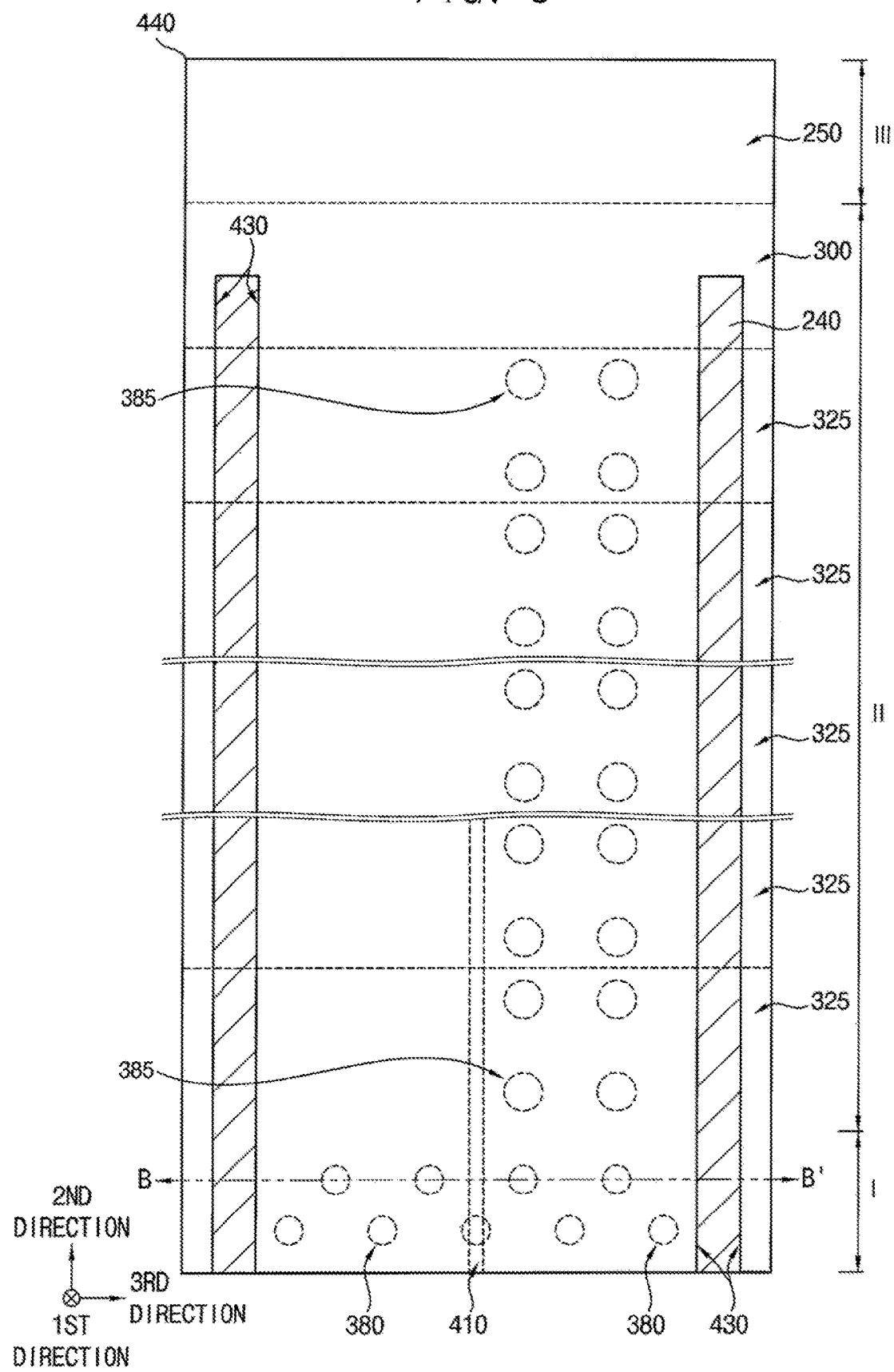
Figure 9:
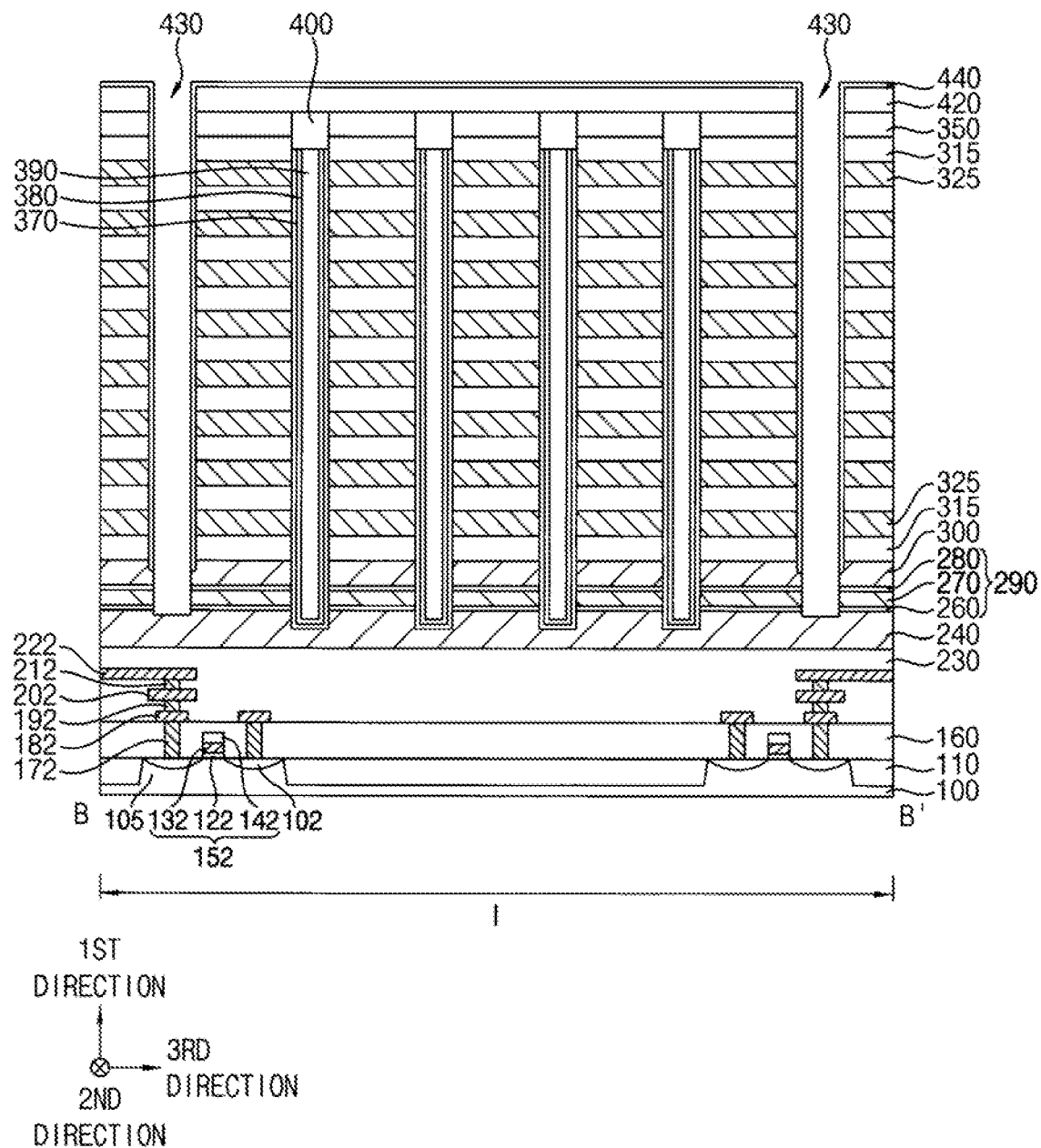

Referring to FIGS. 8 and 9, a sixth insulating interlayer 420 may be formed on the fifth insulating interlayer 350, the first and second capping patterns 400 and 405 and the first division pattern 410, and a second opening 430 may be formed through the fourth to sixth insulating interlayers 340, 350 and 420 by, e.g., a dry etching process on the first and second regions I and II of the substrate 100. The sixth insulating interlayer 420 may include an oxide, e.g., silicon oxide.

The dry etching process may be performed until the second opening 430 exposes an upper surface of the support layer 300, and the second opening 430 may extend through (e.g., partially into) an upper portion of the support layer 300. As the second opening 430 is formed, the first insulation layers 310 and the fourth sacrificial layers 320 of the mold may be exposed by the second opening 430.

In an implementation, the second opening 430 may extend lengthwise along the second direction on the first and second regions I and II of the substrate 100, and a plurality of second openings 430 may be formed (e.g., spaced apart in the third direction). As the second opening 430 is formed, the first insulation layer 310 may become a first insulation pattern 315 extending in the second direction, and the fourth sacrificial layer 320 may become a fourth sacrificial pattern 325 extending in the second direction.

After forming a first spacer layer on a sidewall of the second opening 430 and the sixth insulating interlayer 420, a portion of the first spacer layer on a bottom of the second opening 430 may be removed to form a sacrificial first spacer 440, and an upper portion of the support layer 300 may be partially exposed.

The exposed portion of the support layer 300 and a portion of the sacrificial layer structure 290 thereunder may be removed so that the second opening 430 may be enlarged downwardly (e.g., toward the substrate in the first direction). The second opening 430 may expose an upper surface of the CSP 240, and further extend through (e.g., partially into) an upper portion of the CSP 240.

In an implementation, the first spacer 440 may include amorphous silicon or polysilicon. When the sacrificial first spacer 440 includes amorphous silicon, it could be crystallized during deposition processes of other layers. In an implementation, the sacrificial first spacer 440 may include polysilicon.

When the sacrificial layer structure 290 is partially removed, the sidewall of the second opening 430 may be covered by the sacrificial first spacer 440, and the first insulation patterns 315 and the fourth sacrificial patterns 325 of the mold may not be removed.

Figure 10:
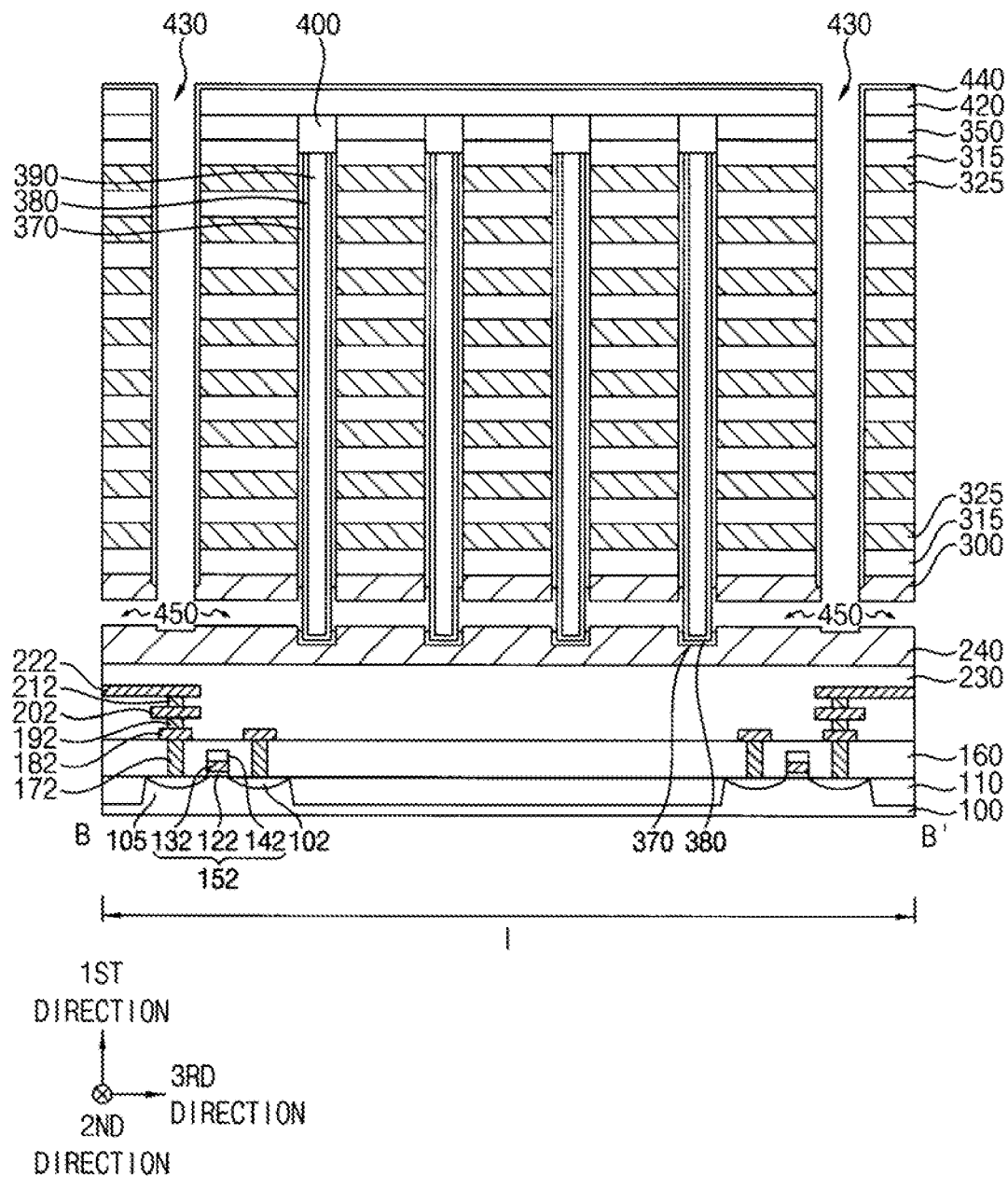

Referring to FIG. 10, the sacrificial layer structure 290 may be removed through the second opening 430 by, e.g., a wet etching process to form a first gap 450.

The wet etching process may be performed using e.g., hydrofluoric acid (HF) and/or phosphoric acid ($H_3PO_4$).

As the first gap 450 is formed, a lower surface of the support layer 300 and an upper surface of the CSP 240 may be exposed. A sidewall of the charge storage structure 370 may be partially exposed by the first gap 450, and the exposed sidewall of the charge storage structure 370 may be also removed by the wet etching process to expose an outer sidewall of the channel 380. The charge storage structure 370 may be divided into an upper portion (extending through the mold to cover most portion of the outer sidewall of the channel 380) and a lower portion (covering a bottom surface of the channel 380 on the CSP 240).

Figure 11:
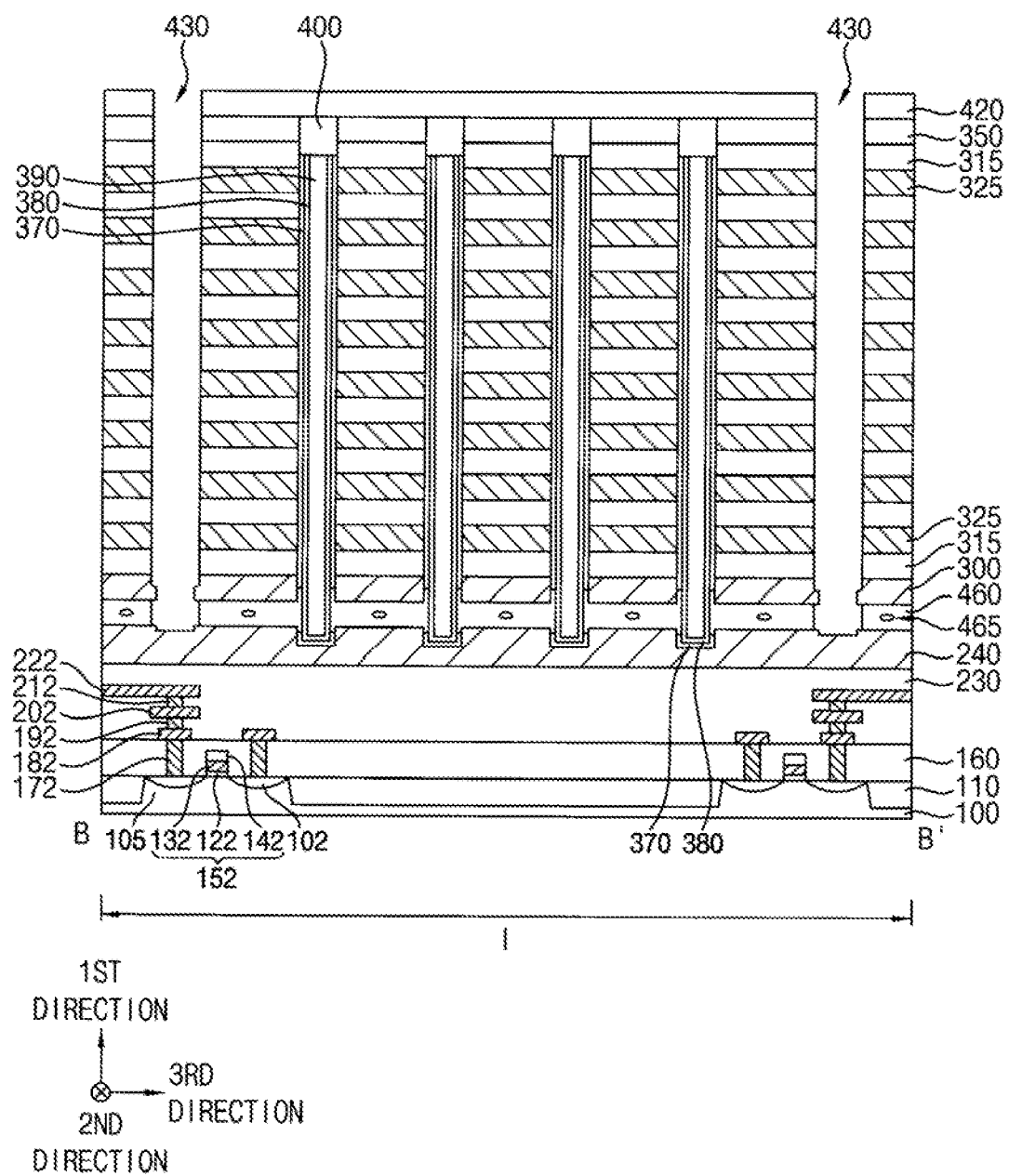

Referring to FIG. 11, the sacrificial first spacer 440 may be removed, a channel connection layer may be formed on a sidewall of the second opening 430 and in the first gap 450, and a portion of the channel connection layer in the second opening 430 may be removed by, e.g., an etch back process to form a channel connection pattern 460 in the first gap 450.

As the channel connection pattern 460 is formed, some of the channels 380 between neighboring ones of the second openings 430 in the third direction may be connected with each other.

The channel connection pattern 460 may include, e.g., amorphous silicon doped with n-type impurities, and may be crystallized through heat generated by other deposition processes to include polysilicon doped with n-type impurities.

An air gap 465 may be formed in the channel connection pattern 460.

Figure 12:
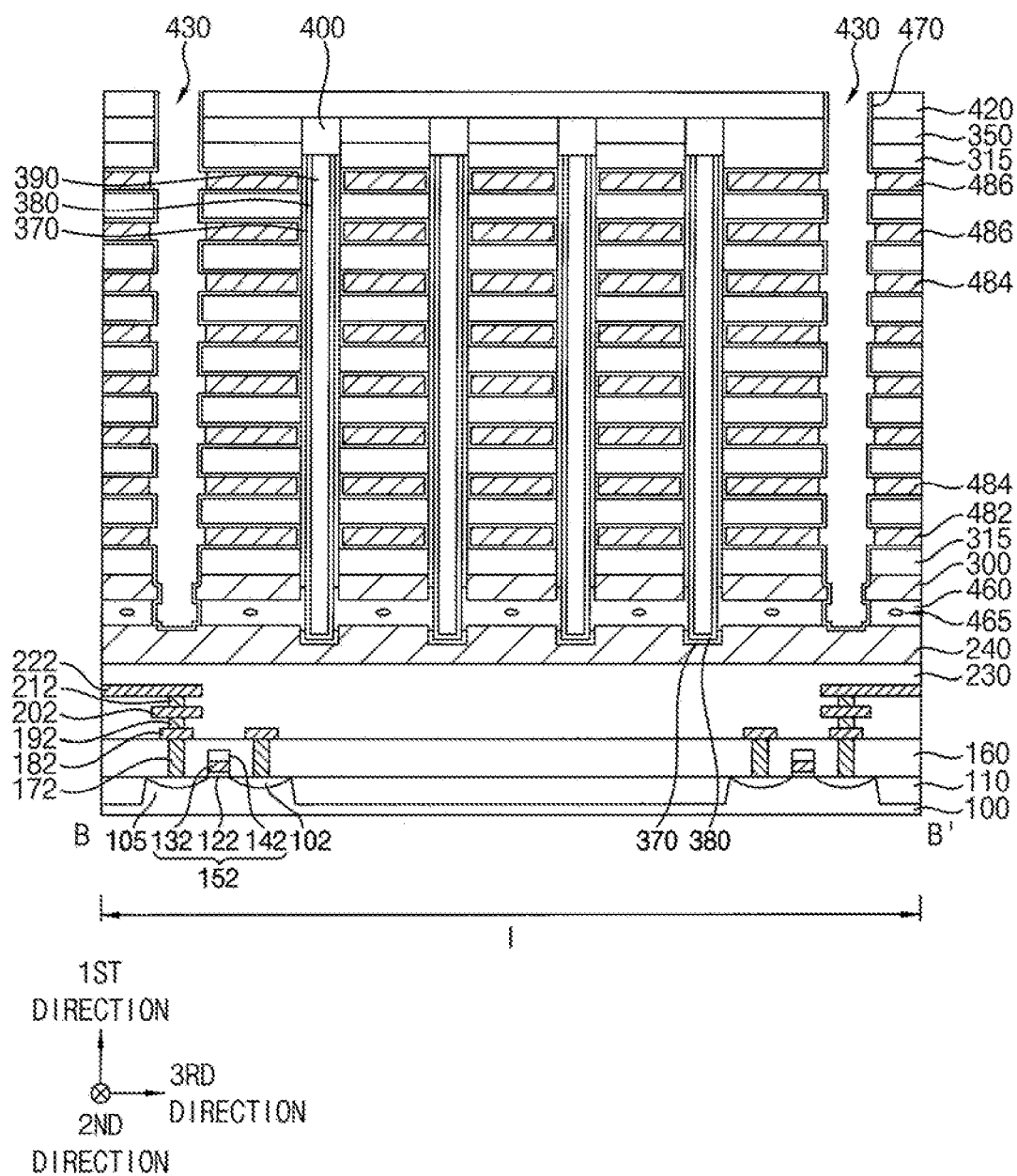

Referring to FIG. 12, the fourth sacrificial patterns 325 exposed by the second opening 430 may be removed to form a second gap between the first insulation patterns 315 at respective levels, and an outer sidewall of the charge storage structure 370 and an outer sidewall of the dummy charge storage structure may be partially exposed by the second gap.

In an implementation, the fourth sacrificial patterns 325 may be removed by a wet etching process using, e.g., phosphoric acid ($H_3PO_4$) or sulfuric acid ($H_2SO_4$).

A second blocking layer may be formed on the exposed outer sidewalls of the charge storage structure 370 and the dummy charge storage structure, inner walls of the second gaps, surfaces of the first insulation patterns 315, a sidewall of the support layer 300, a sidewall of the channel connection pattern 460, an upper surface of the CSP 240 and an upper surface of the sixth insulating interlayer 420, and a gate electrode layer may be formed on the second blocking layer.

The second blocking layer may include a metal oxide, e.g., aluminum oxide. The gate electrode layer may include a gate barrier layer and a gate conductive layer sequentially stacked. The gate barrier layer may include a metal nitride, and the gate conductive layer may include a metal.

The gate electrode layer may be partially removed to form a gate electrode in each of the second gaps. In an implementation, the gate electrode layer may be partially removed by a wet etching process.

In an implementation, the gate electrode may extend in the second direction, and a plurality of gate electrodes may be formed to be spaced apart from each other in the first direction to form a gate electrode structure. The gate electrode structure may have a staircase shape including the gate electrode as a step layer, and a step of the step layer that is not overlapped with upper step layers, e.g., an end portion of the gate electrode in the second direction, may be referred to as a pad.

In an implementation, a plurality of gate electrode structures may be formed in the third direction, and may be spaced apart from each other in the third direction by the second opening 430. The gate electrode structure may include first, second and third gate electrodes 482, 484 and 486 sequentially stacked in the first direction. In an implementation, the first gate electrode 482 may be formed at a lowermost level (e.g., proximate to the substrate 100 in the first direction) to serve as a ground selection line (GSL), the third gate electrode 486 may be formed at an uppermost level (e.g., distal to the substrate 100) and a second level from above to serve as a string selection line (SSL), and the second gate electrode 484 may be formed at a plurality of levels, respectively, between the first and third gate electrodes 482 and 486 to serve as a word line.

A second division layer may be formed on the second blocking layer to fill the second opening 430, and the second division layer and the second blocking layer may be planarized until an upper surface of the sixth insulating interlayer 420 is exposed to form a second division pattern 490 and the second blocking pattern 470, respectively. The second division pattern 490 may separate each of the first to third gate electrodes 482, 484 and 486 in the third direction, and may include an oxide, e.g., silicon oxide.

Referring to FIGS. 13 and 14, the fourth to sixth insulating interlayers 340, 350 and 420, ones of the first insulation patterns 315, and ones of the gate electrodes on the second region II of the substrate 100 may be etched to form third to fifth openings 502, 504, and 506 exposing the first insulation pattern 315, the support layer 300 and the CSP 240, respectively.

In an implementation, the fifth opening 506 may extend through a pad of the first gate electrode 482, and may also extend through one of the first insulation patterns 315 under the first gate electrode 482, the support layer 300, the channel connection pattern 460, and a portion of the CSP 240. The fourth opening 504 may extend through a pad of a lowermost one of the second gate electrodes 484 and the first gate electrode 482, and may also extend through one of the first insulation patterns 315 therebetween and one of the first insulation patterns 315 under the first gate electrode 482, and a portion of the support layer 300. A plurality of third openings 502 may be formed to be spaced apart from each other in the second direction. Each of the third openings 502 may extend through a pad of one of the second gate electrodes 484 at a certain level, ones of the second gate electrodes 484 thereunder and ones of the first insulation patterns 315 therebetween and thereunder, or a pad of one of the third gate electrodes 486 at a certain level, one of the third gate electrodes 486 thereunder and a plurality of second gate electrodes 484, and each of the third openings 502 may also extend through ones of the first insulation patterns 315 therebetween and thereunder.

The third to fifth openings 502, 504 and 506 may be formed by the etching process, and may have different depths according to the types of structures through which the third to fifth openings 502, 504 and 506 extend. In an implementation, each of the third and fourth openings 502 and 504 may extend through at least two gate electrodes stacked in the first direction.

Referring to FIG. 15, in example embodiments, the closer third openings 502 is to the first region I of the substrate 100, the more of the second and third gate electrodes 484 and 486 stacked in the first direction the third openings 502 may extend through, but the shallower the depths of the third openings 502 may be. For example, the fourth insulating interlayer 340 including an insulating material may be removed at a higher rate than the gate electrode including a metal during the etching process, and the farther the third openings 502 may be, the deeper the third openings 502 may be. In an implementation, according to the heights of the gate electrodes through which the third openings 502 extend, the closer the third openings 502 may be to the first region I of the substrate 100, the more of the gate electrodes the third openings 502 may extend through.

Referring to FIG. 16, each of the third to fifth openings 502, 504 and 506 may be formed between the dummy channel holes 365 in which the dummy channels 385 extending through the steps of the gate electrodes may be formed, and a first diameter D1 (e.g., in a direction orthogonal to the first direction) of each of the third to fifth openings 502, 504 and 506 may be similar to a second diameter D2 of each of the dummy channel holes 365.

Hereinafter, referring to cross-sectional views showing the regions X and Y of FIG. 13, a method of forming upper contact plugs in the third opening 502 and in the fourth and fifth openings 504 and 506 will be described in detail. The fifth and sixth insulating interlayers 350 and 420 may not be shown, and the fifth and sixth insulating interlayers 350 and 420 may include the same material as the fourth insulating interlayer 340 so as to be etched similarly to the fourth insulating interlayer 340.

Figure 17:
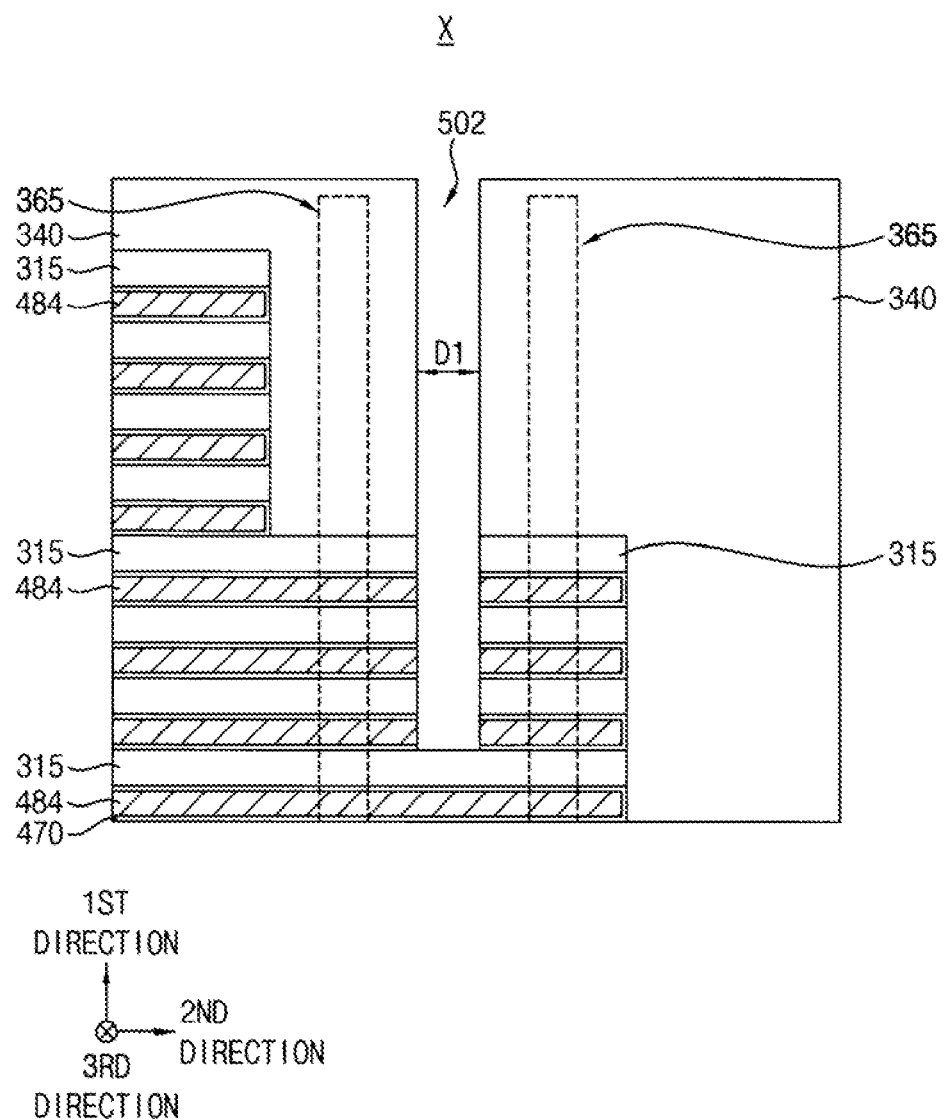
Figure 18:
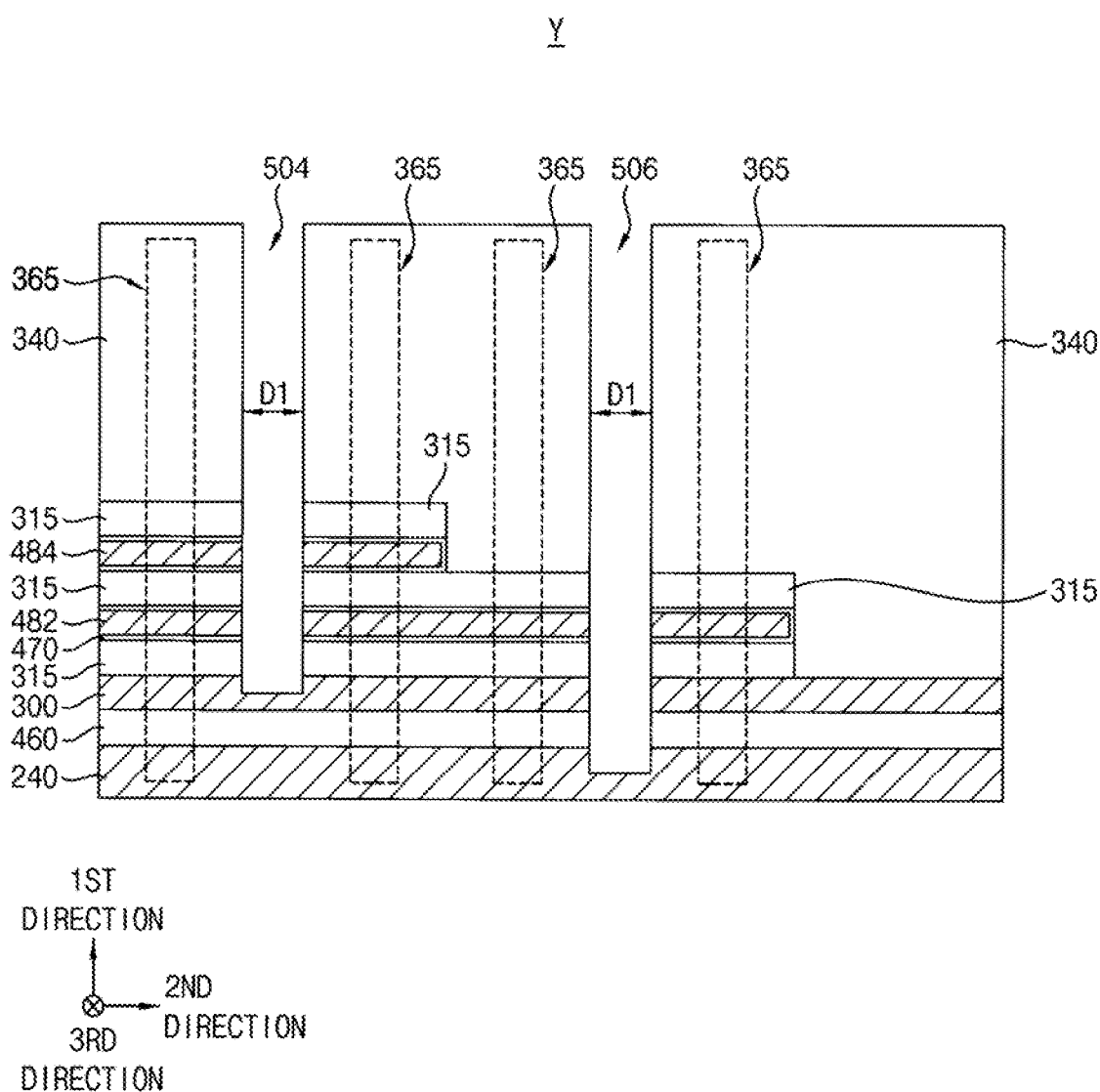

Referring to FIGS. 17 and 18, the third opening 502 may extend through the fourth insulating interlayer 340, a plurality of second gate electrodes 484, e.g., ones of the second gate electrodes 484 at three levels (e.g., at three different distances from the substrate 100 in the first direction), respectively, and ones of the first insulation patterns 315 thereon to expose one of the first insulation pattern 315 thereunder.

The fourth opening 504 may extend through the fourth insulating interlayer 340, a lowermost one of the second gate electrodes 484, the first gate electrode 482, and ones of the first insulation patterns 315 thereon and thereunder to expose the support layer 300. The fifth opening 506 may extend through the fourth insulating interlayer 340, the first gate electrode 482, and ones of the first insulation patterns 315 thereon and thereunder, the support layer 300, and the channel connection pattern 460 to expose the CSP 240.

In an implementation, the fourth opening 504 may not expose the support layer 300 but may expose one of the first insulation patterns 315 under the first gate electrode 482, if it only extends through the lowermost one of the second gate electrodes 484 and the first gate electrode 482. In an implementation, the fifth opening 506 may not expose the CSP 240, but may expose the channel connection pattern 460 or the support layer 300.

Figure 19:
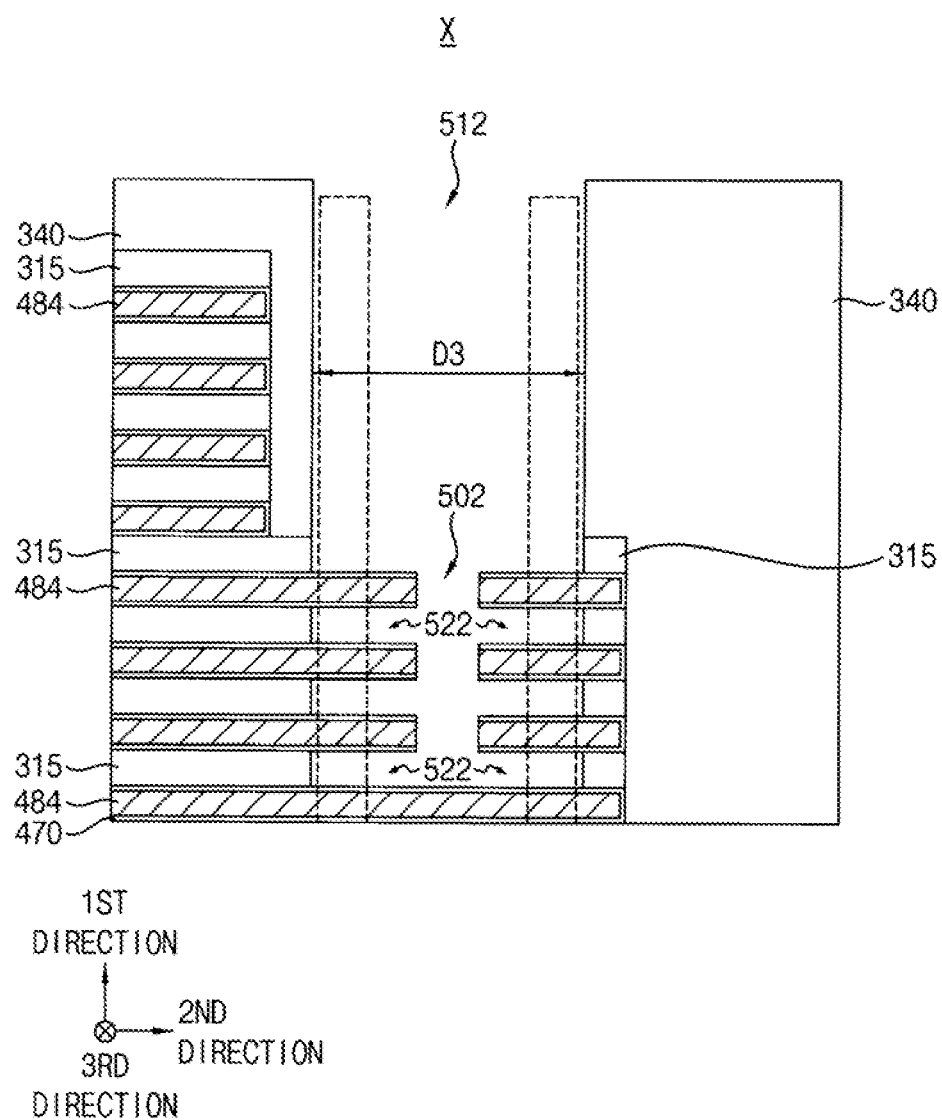
Figure 20:
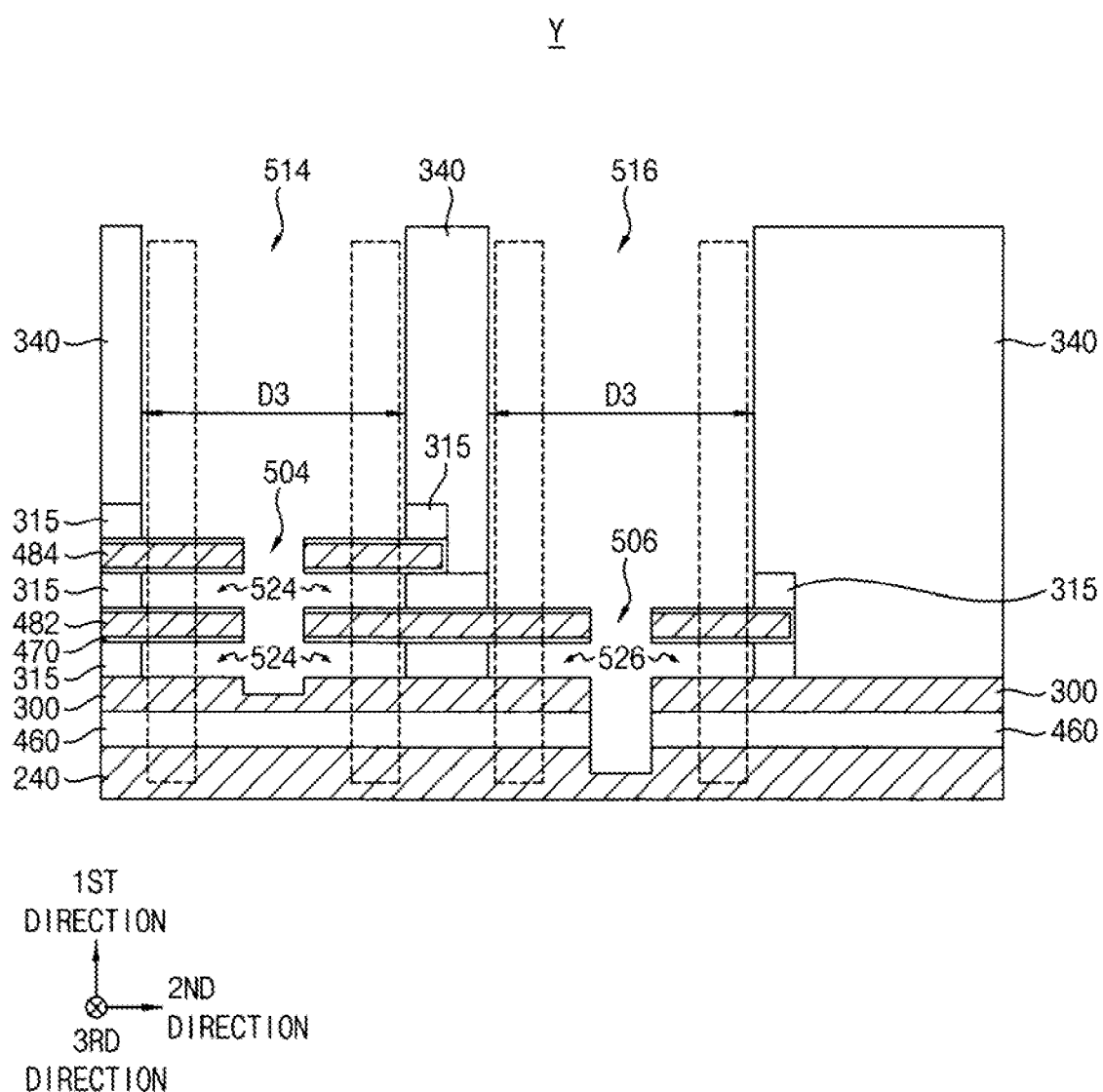

Referring to FIGS. 16, 19 and 20, the fourth insulating interlayer 340 may be etched by, e.g., a wet etching process so as to enlarge upper widths of the third to fifth openings 502, 504, and 506, and ones of the first insulation patterns 315 exposed by the third to fifth openings 502, 504 and 506 may be also partially etched to form third to fifth gaps 522, 524 and 526, respectively. Hereafter, upper portions of the third to fifth openings 502, 504 and 506 having a third diameter D3 greater than the first diameter D1 of lower portions of the third to fifth openings 502, 504 and 506 may be referred to as sixth to eighth openings 512, 514 and 516, respectively.

In a implementation, widths in the second direction of the sixth to eighth openings 512, 514 and 516 may be less than or equal to widths in the second direction of the steps, e.g., the widths of the pads of the second gate electrodes 484 in the second direction.

Figure 21:
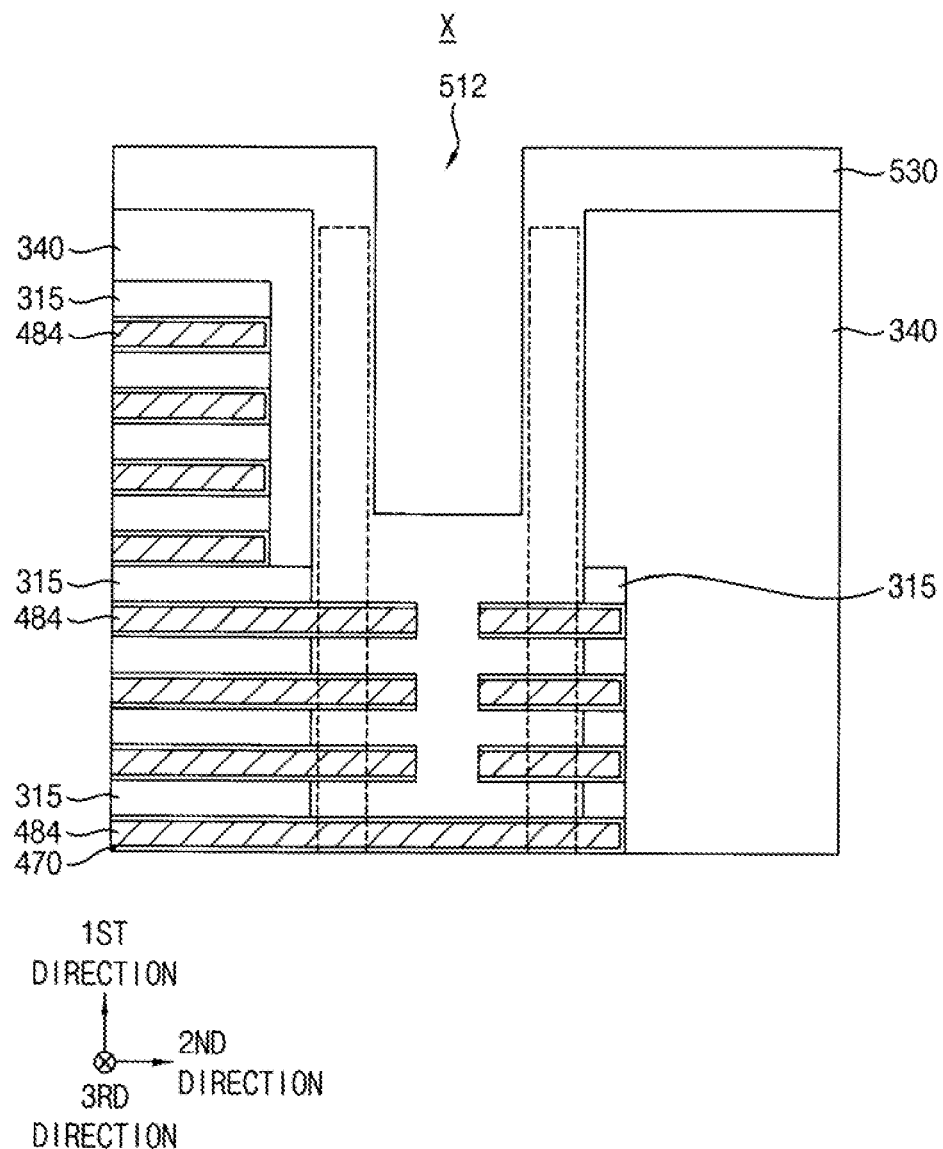
Figure 22:
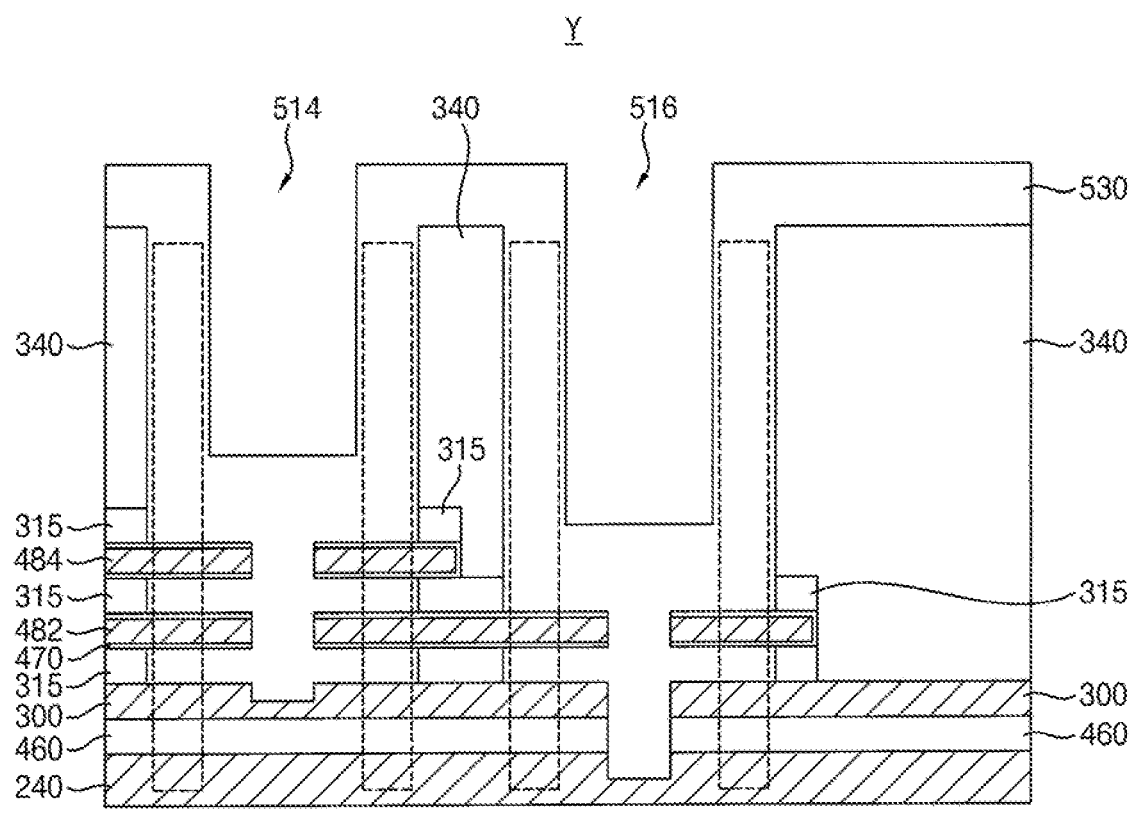

Referring to FIGS. 21 and 22, a second spacer layer 530 may be formed on bottoms and sidewalls of the sixth to eighth openings 512, 514 and 516 and an upper surface of the fourth insulating interlayer 340 to fill the third to fifth openings 502, 504 and 506 and the third to fifth gaps 522, 524 and 526.

The second spacer layer 530 may include an oxide, e.g., silicon oxide.

Figure 23:
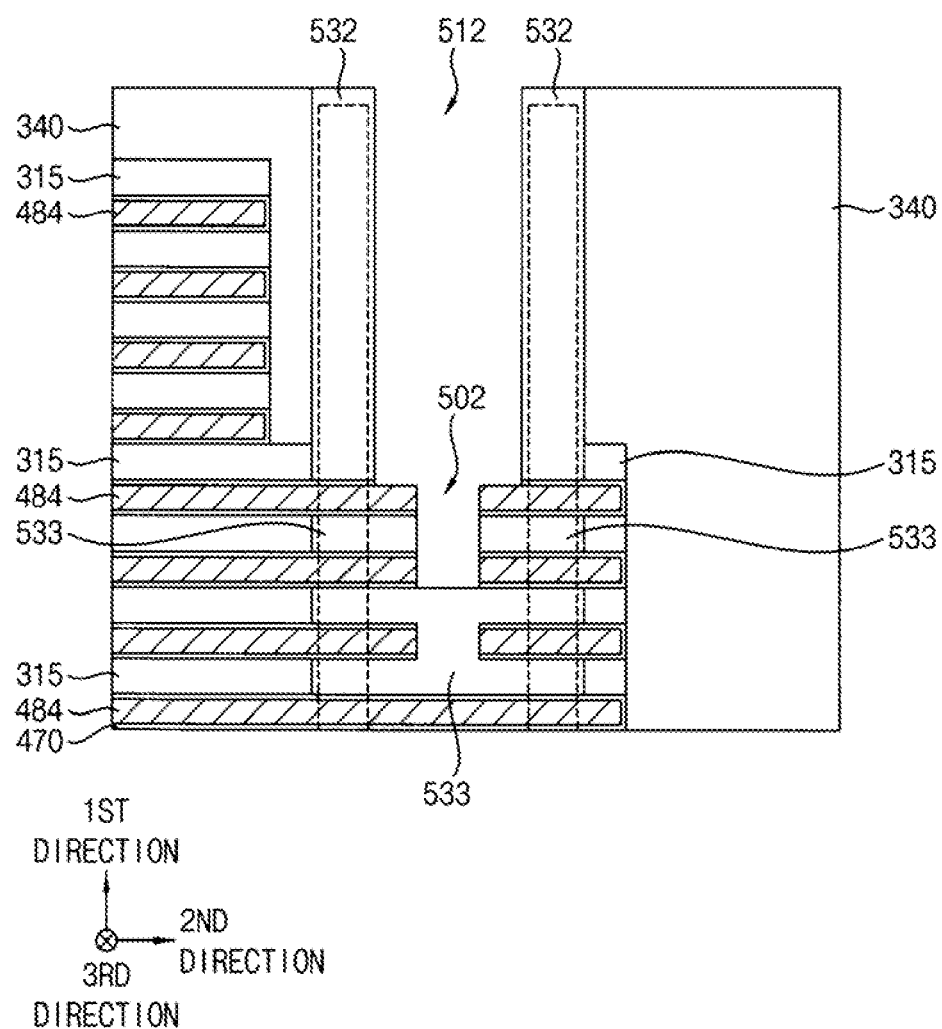
Figure 24:
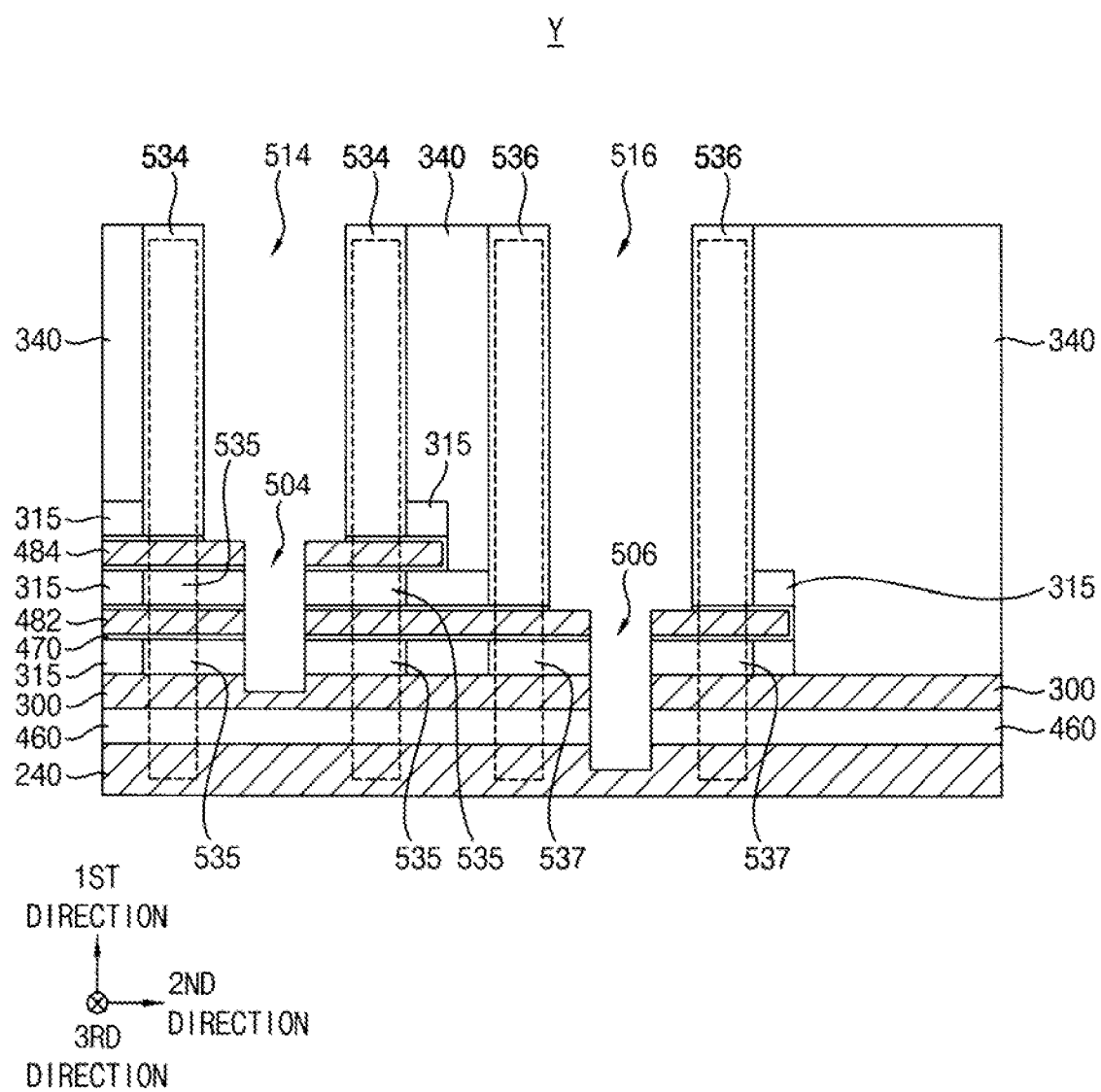

Referring to FIGS. 23 and 24, an etch back process may be performed on the second spacer layer 530, and during the etch back process, the second blocking pattern 470 may be also partially etched to expose an upper surface of the gate electrode.

By the etch back process, a portion of the second spacer layer 530 on the bottom of the sixth opening 512, a portion of the second blocking pattern 470 on an upper surface of an uppermost one among the second gate electrodes 484 under the sixth opening 512, and an upper portion of the second spacer layer 530 in the third opening 502 may be removed, so that a second spacer 532 may be formed on a sidewall of the sixth opening 512, an upper portion of the third opening 502 may be formed again, and the upper surface of the uppermost one among the second gate electrodes 484 under the sixth opening 512 may be partially exposed. A sidewall of one of the second gate electrodes 484 directly under the uppermost one of the second gate electrodes 484 under the sixth opening 512 may be exposed by the third opening 502. Additionally, a first burying pattern 533 may remain between the second gate electrodes 484 and in a lower portion of the third opening 502.

By the etch back process, a portion of the second spacer layer 530 on the bottom of the seventh opening 514, a portion of the second blocking pattern 470 on an upper surface of the second gate electrode 484 under the seventh opening 514, and a portion of the second spacer layer 530 in the fourth opening 504 may be removed, so that a third spacer 534 may be formed on a sidewall of the seventh opening 514, the fourth opening 504 may be formed again, and the upper surface of the second gate electrode 484 under the seventh opening 514 may be partially exposed. Additionally, a second burying pattern 535 may remain between the first and second gate electrodes 482 and 484 and between the support layer 300 and the first gate electrode 482.

Additionally, by the etch back process, a portion of the second spacer layer 530 on the bottom of the eighth opening 516, a portion of the second blocking pattern 470 on an upper surface of the first gate electrode 482 under the eighth opening 516, and a portion of the second spacer layer 530 in the fifth opening 506 may be removed, so that a fourth spacer 536 may be formed on a sidewall of the eighth opening 516, the fifth opening 506 may be formed again, and the upper surface of the first gate electrode 482 under the eighth opening 516 may be partially exposed. Additionally, a third burying pattern 537 may remain between the support layer 300 and the first gate electrode 482.

Figure 25:
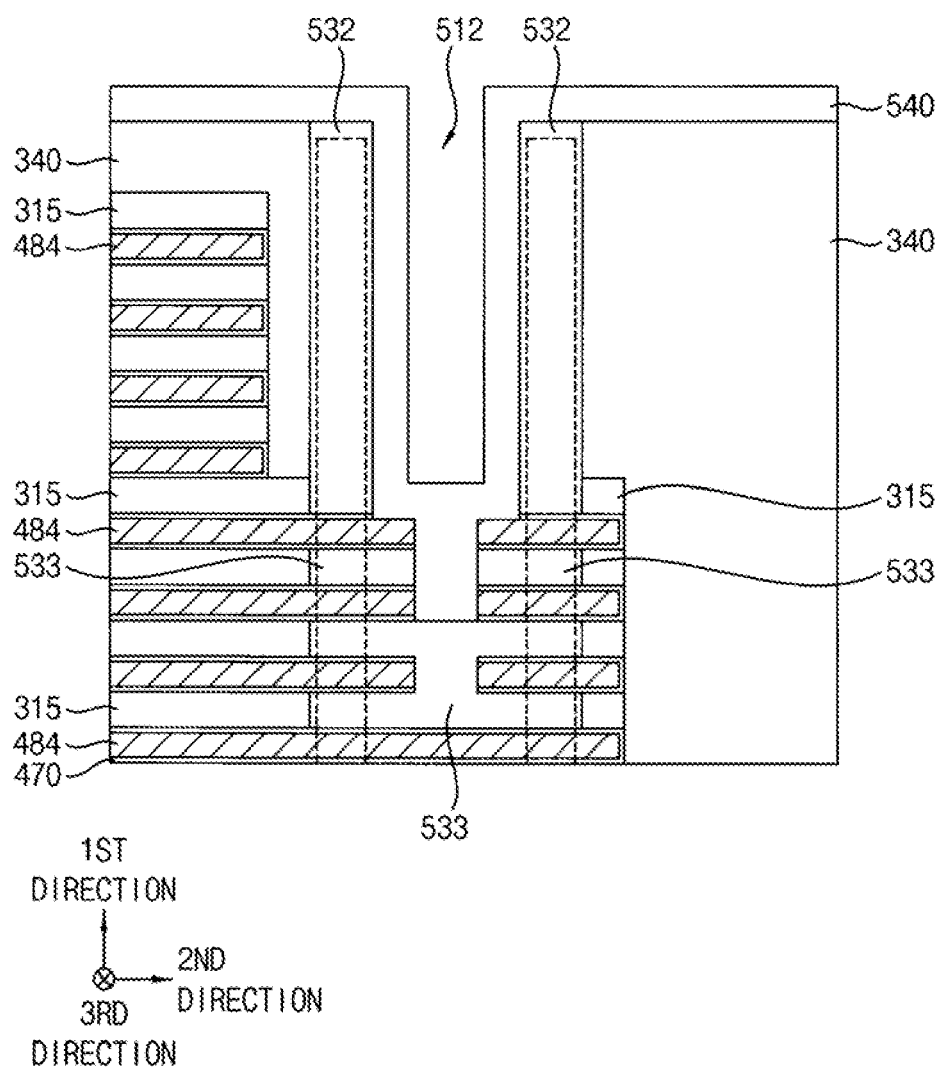
Figure 26:
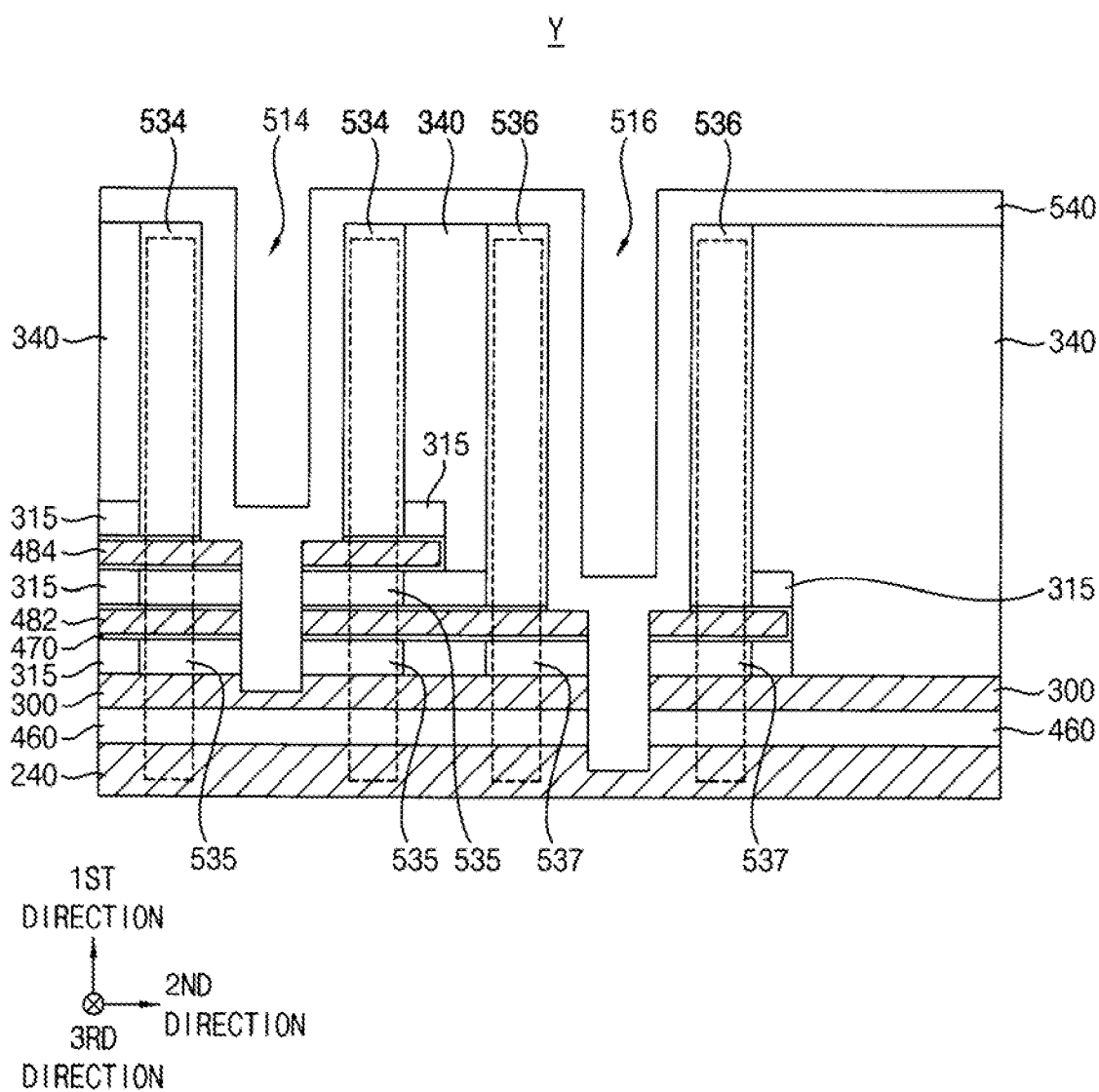

Referring to FIGS. 25 and 26, a third spacer layer 540 may be formed on the bottoms and the sidewalls of the sixth to eighth openings 512, 514 and 516 and the upper surface of the fourth insulating interlayer 340 to fill the third to fifth openings 502, 504 and 506.

The third spacer layer 540 may include an oxide, e.g., silicon oxide.

Figure 27:
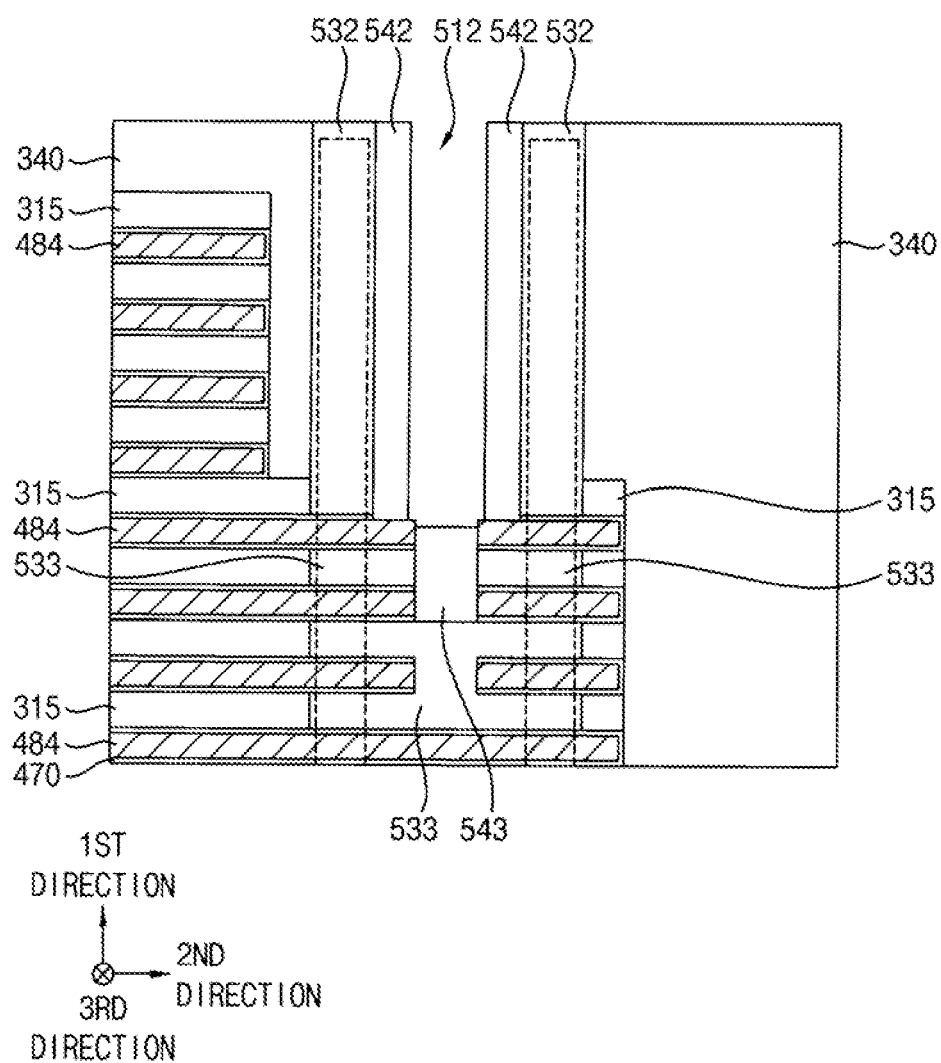
Figure 28:
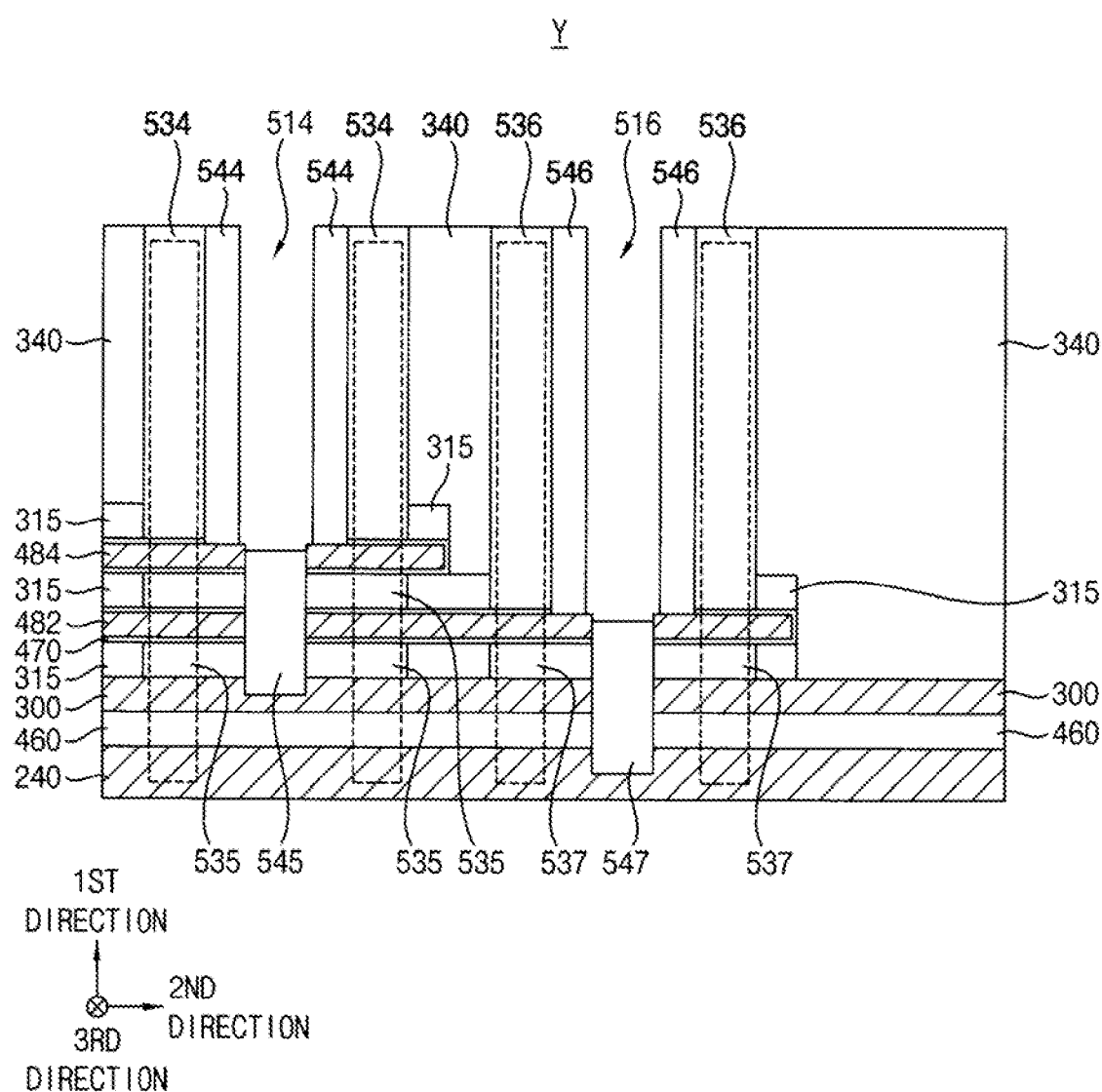

Referring to FIGS. 27 and 28, an etch back process may be performed on the third spacer layer 540 to expose an upper surface of the gate electrode.

By the etch back process, a portion of the third spacer layer 540 on the bottom of the sixth opening 512 may be removed, so that a fifth spacer 542 may be formed on an inner sidewall of the second spacer 532 and an upper surface of an uppermost one of the second gate electrodes 484 under the sixth opening 512 may be partially exposed. A fourth burying pattern 543 may remain on the first burying pattern 533 in the third opening 502.

By the etch back process, a portion of the third spacer layer 540 on the bottom of the seventh opening 514 may be removed, so that a sixth spacer 544 may be formed on an inner sidewall of the third spacer 534 and an upper surface of the second gate electrode 484 under the seventh opening 514 may be partially exposed. A fifth burying pattern 545 may remain in the fourth opening 504.

Additionally, by the etch back process, a portion of the third spacer layer 540 on the bottom of the eighth opening 516 may be removed, so that a seventh spacer 546 may be formed on an inner sidewall of the fourth spacer 536 and an upper surface of the first gate electrode 482 under the eighth opening 516 may be partially exposed. A sixth burying pattern 547 may remain in the fifth opening 506.

Figure 29:
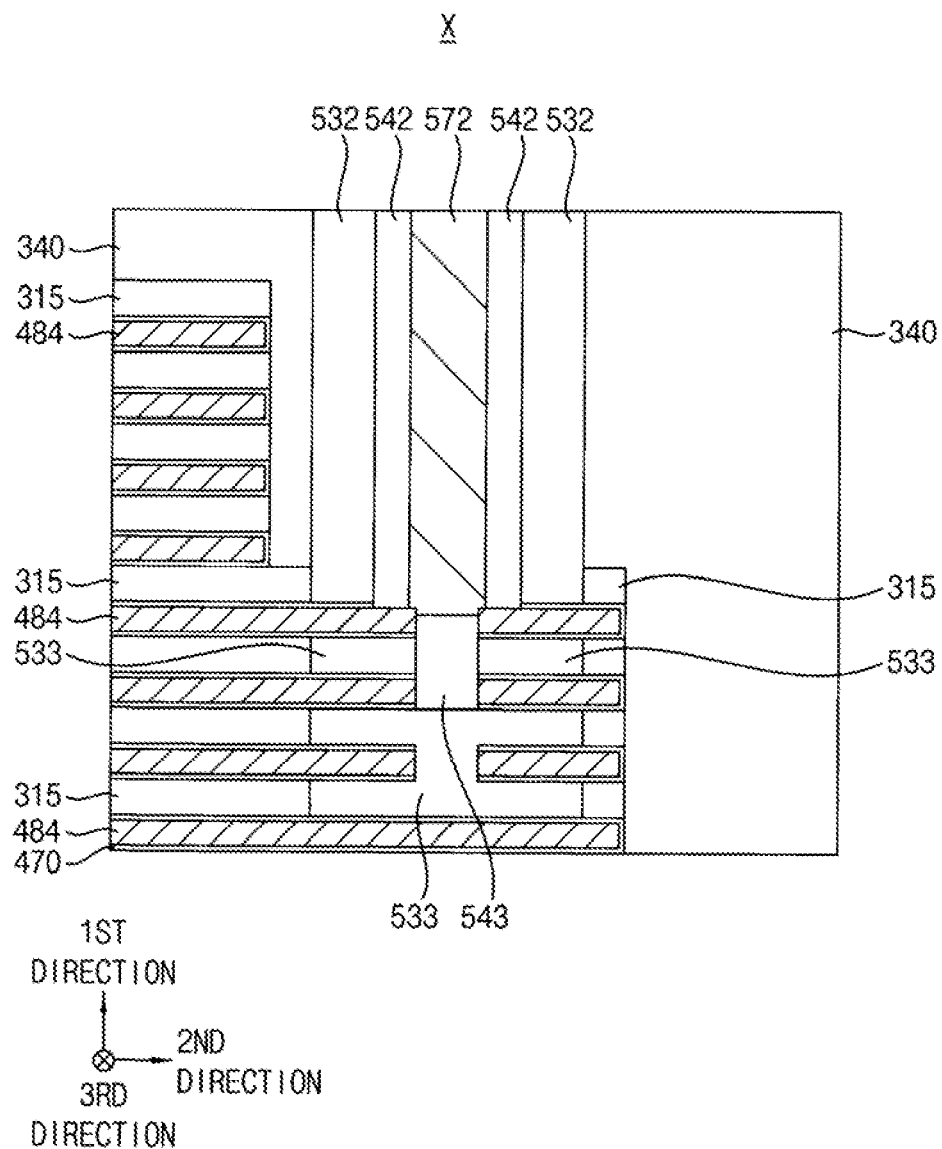
Figure 30:
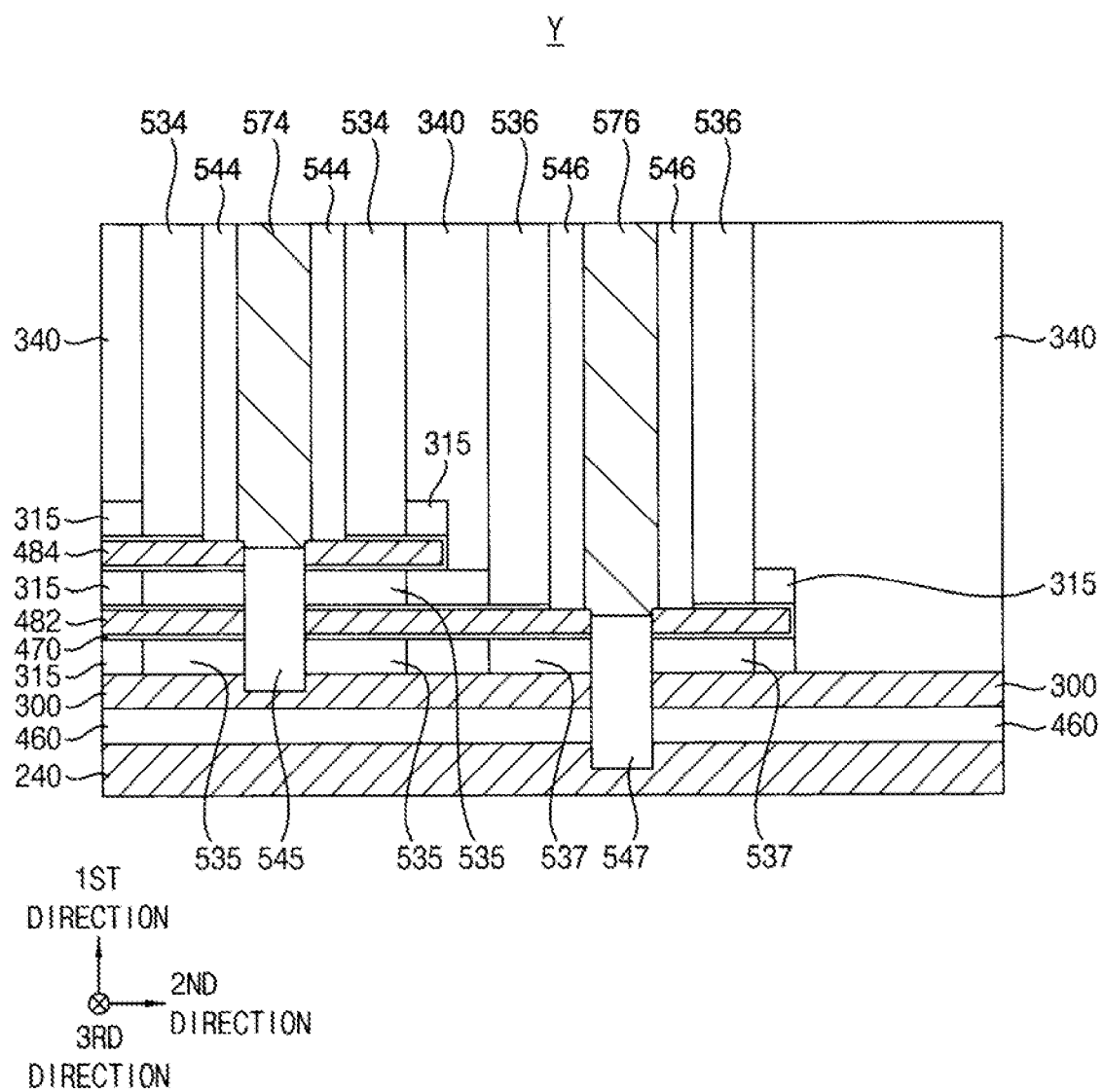

Referring to FIGS. 29 and 30, first, second, and third upper contact plugs 572, 574 and 576 may be formed to fill the sixth, seventh, and eighth openings 512, 514 and 516, respectively.

In an implementation, each of the first to third upper contact plugs 572, 574 and 576 may include a metal pattern and a barrier pattern covering a lower surface and a sidewall of the metal pattern, and the barrier pattern may include a metal nitride.

Figure 31:
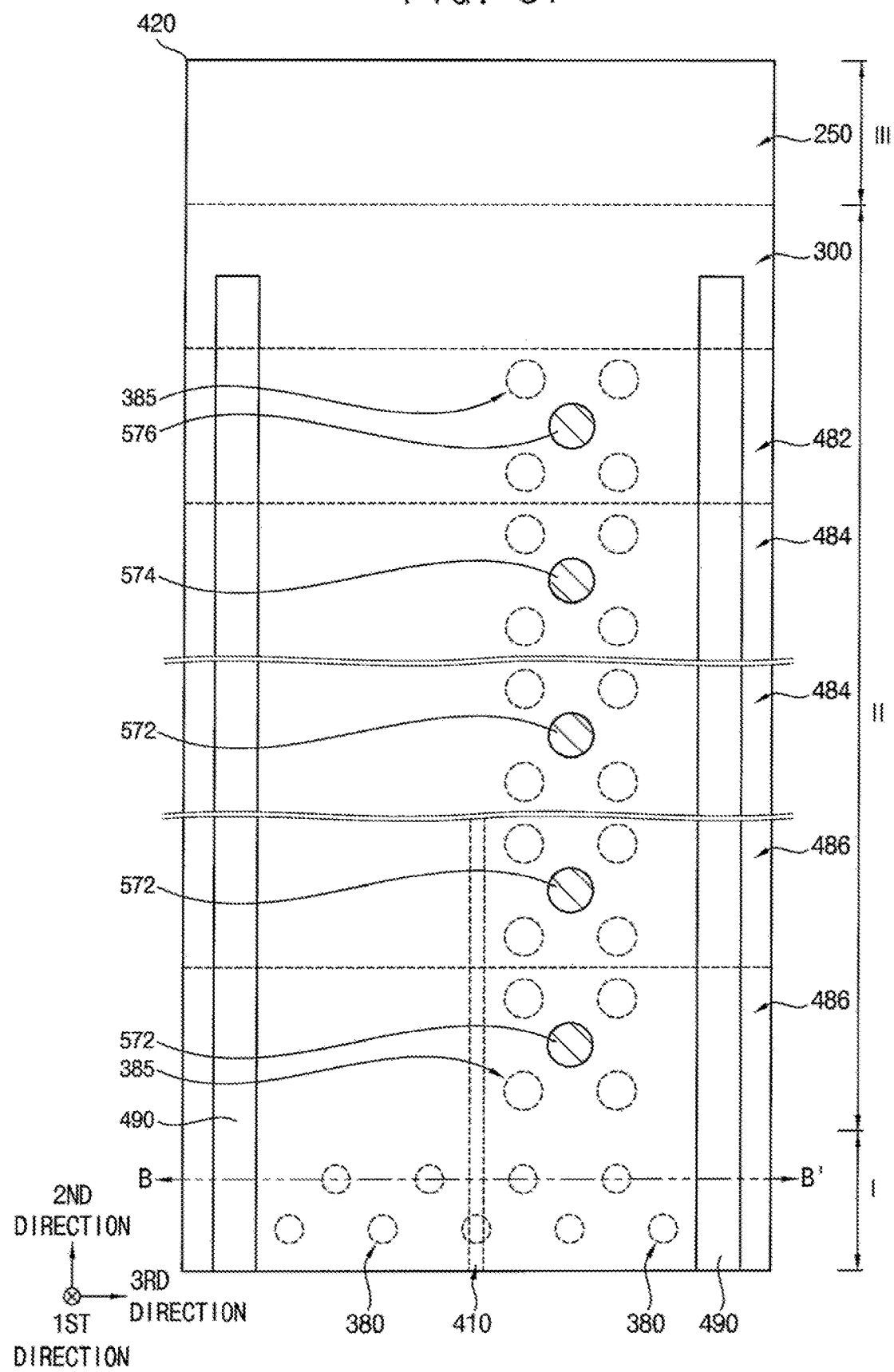
Figure 32:
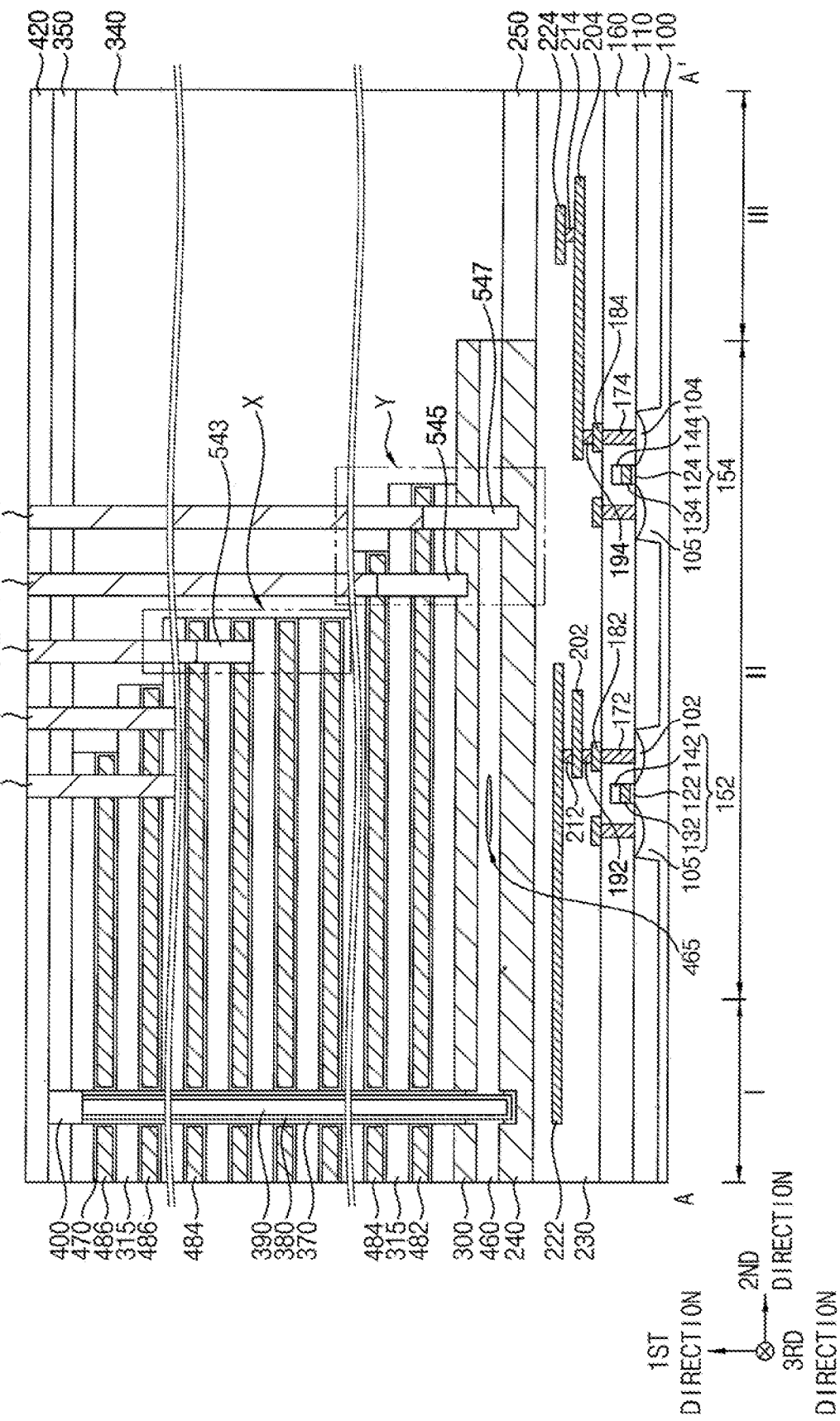

FIGS. 31 and 32 show the first to third upper contact plugs 572, 574 and 576 and the fourth to sixth burying patterns 543, 545 and 547 are formed on the first to third regions I, II and III of the substrate 100. In order to avoid complexity of drawings, the first to third burying patterns 533, 535 and 537 and the second to seventh spacers 532, 534, 536, 542, 544 and 546 are not shown, but FIGS. 29 and 30 may be referred to.

Figure 33:
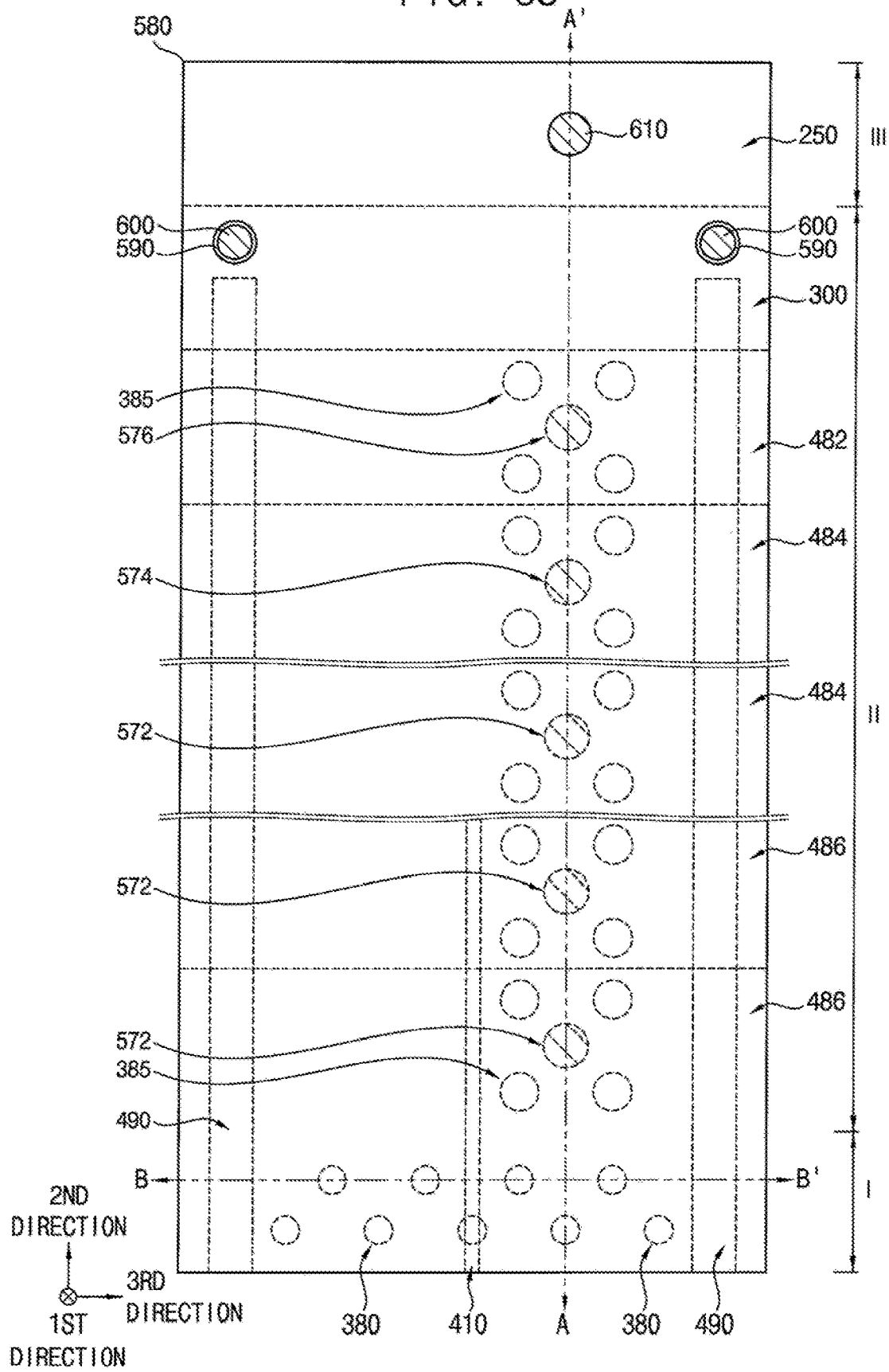
Figure 34:
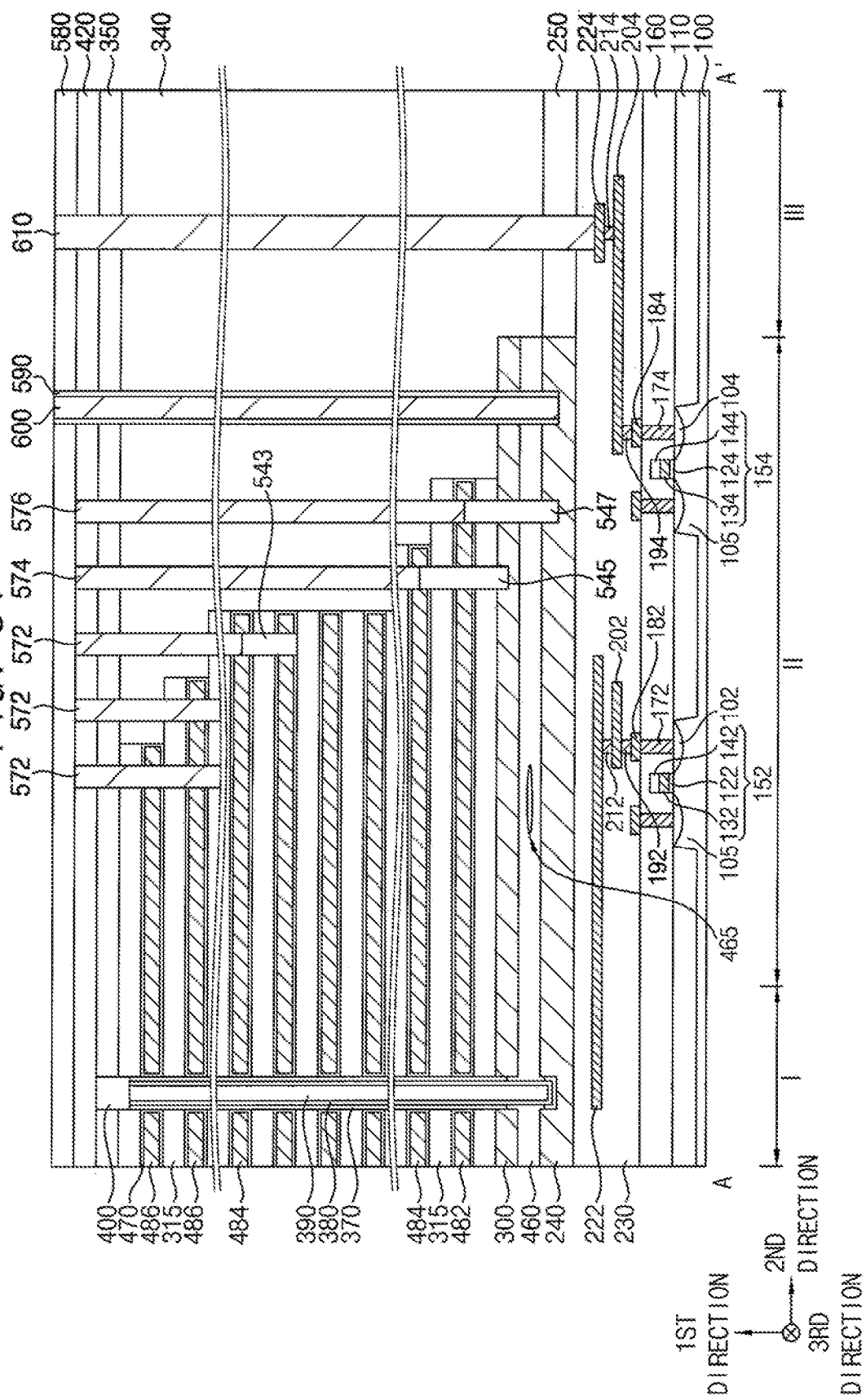

Referring to FIGS. 33 and 34, a seventh insulating interlayer 580 may be formed on the sixth insulating interlayer 420 and the first to third upper contact plugs 572, 574 and 576, and a fourth upper contact plug 600 extending through the fourth to seventh insulating interlayers 340, 350, 420 and 580, the support layer 300 and the channel connection pattern 460 to contact an upper surface of the CSP 240, and a through via 610 extending through the fourth to seventh insulating interlayers 340, 350, 420 and 580, the third insulating interlayer pattern 250, and an upper portion of the second insulating interlayer 230 to contact an upper surface of the sixth lower wiring 224 may be formed.

In an implementation, the fourth upper contact plug 600 may be formed to be aligned with the second division pattern 490 in the second direction, and may be electrically connected to the CSP 240. In an implementation, in order to be electrically insulated from the support layer 300 and/or the channel connection pattern 460, an eighth spacer 590 may be further formed on a sidewall of the fourth upper contact plug 600, and the eighth spacer 590 may include an insulating material.

The fourth upper contact plug 600 and the through via 610 may include, e.g., a metal, a metal nitride, doped polysilicon, or the like.

In an implementation, as illustrated in the drawings, upper surfaces of the fourth upper contact plug 600 and the through via 610 may be higher (e.g., farther from the substrate 100 in the first direction) than upper surfaces of the first to third upper contact plugs 572, 574 and 576. In an implementation, the upper surfaces of the fourth upper contact plug 600 and the through via 610 may be lower than or coplanar with the upper surfaces of the first to third upper contact plugs 572, 574 and 576.

Figure 35:
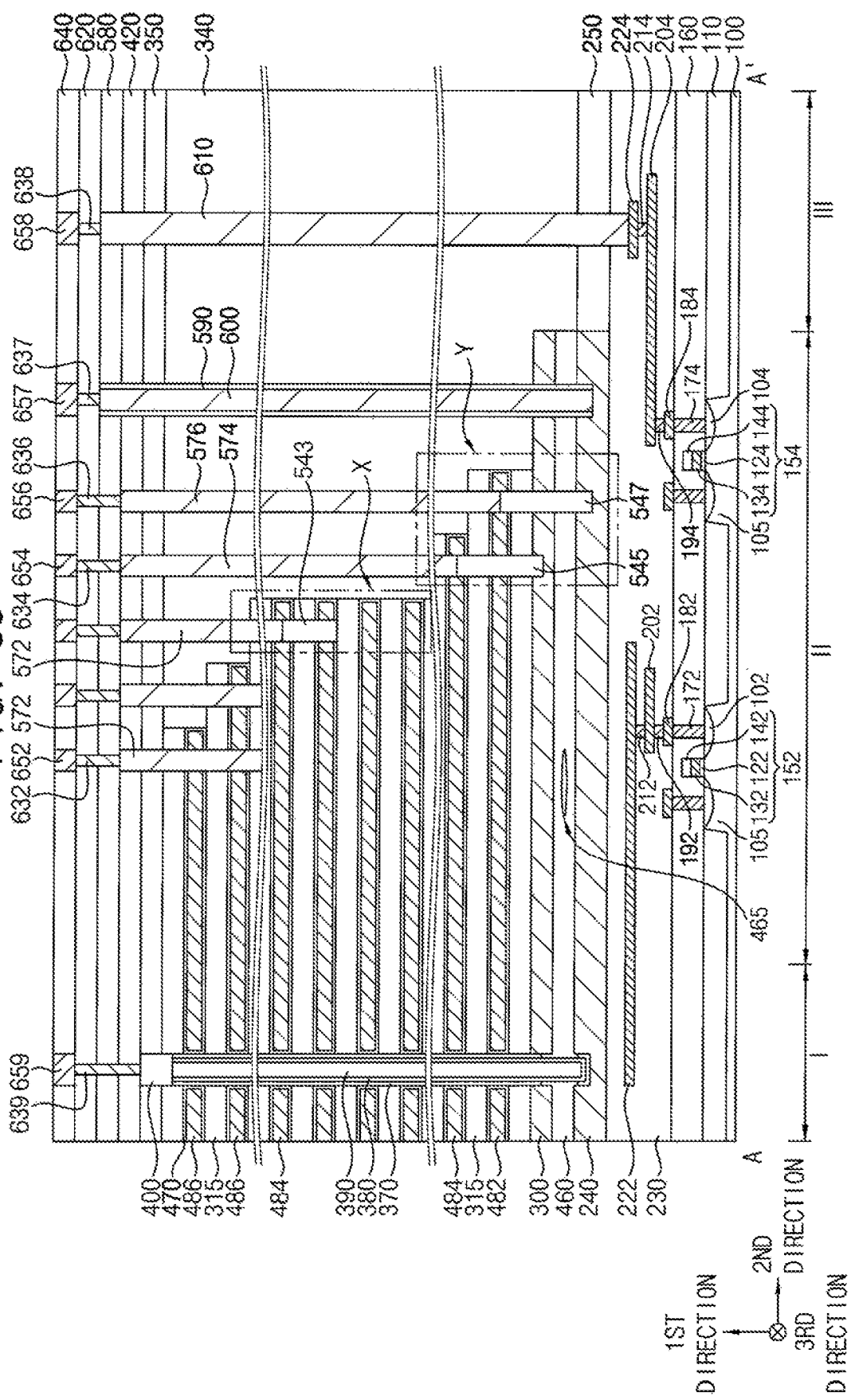

Referring to FIG. 35, an eighth insulating interlayer 620 may be formed on the seventh insulating interlayer 580, the fourth upper contact plug 600 and the through via 610. First to third upper vias 632, 634 and 636 extending through the seventh and eighth insulating interlayers 580 and 620 to contact upper surfaces of the first to third upper contact plugs 572, 574 and 576, respectively, fourth and fifth upper vias 637 and 638 extending through the eighth insulating interlayer 620 to contact upper surfaces of the fourth upper contact plug 600 and the through via 610, respectively, and a sixth upper via 639 extending through the sixth to eighth insulating interlayers 420, 580 and 620 to contact an upper surface of the first capping pattern 400 may be formed.

A ninth insulating interlayer 640 may be formed on the eighth insulating interlayer 620 and the first to sixth upper vias 632, 634, 636, 637, 638 and 639, and first to sixth upper wirings 652, 654, 656, 657, 658 and 659 extending through the ninth insulating interlayer 640 to contact upper surfaces of the first to sixth upper vias 632, 634, 636, 637, 638 and 639, respectively, may be formed.

In an implementation, the sixth upper wiring 659 may extend lengthwise in the third direction, a plurality of sixth upper wirings 659 may be formed in the second direction. The sixth upper wiring 659 may serve as a bit line of the vertical memory device.

The eighth and ninth insulating interlayers 620 and 640 may include an oxide, e.g., silicon oxide, and the first to sixth upper vias 632, 634, 636, 637, 638 and 639, and the first to sixth upper wirings 652, 654, 656, 657, 658 and 659 may include, e.g., a metal, a metal nitride, doped polysilicon, or the like.

In an implementation, as illustrated in the drawings, the first to sixth upper vias 632, 634, 636, 637, 638 and 639, and the first to sixth upper wirings 652, 654, 656, 657, 658 and 659 may be formed by a single damascene process. In an implementation, at least some of them may be formed by a dual damascene process.

Additional upper vias and additional upper wirings may be formed on the ninth insulating interlayer 640 and the first to sixth upper wirings 652, 654, 656, 657, 658 and 659, so as to complete the fabrication of the vertical memory device.

As illustrated above, in the method of manufacturing the vertical memory device, each of the first upper contact plugs 572 may be formed by etching not only a corresponding one of the gate electrodes 482, 484 and 486 but also underlying gate electrodes to form the third opening 502, enlarging the upper width of the third opening 502 to form the sixth opening 512, forming the second spacer layer 530 in the sixth opening 512, performing an etch back process on the second spacer layer 530 to expose an upper surface of the corresponding one of the gate electrodes 482, 484 and 486 but to keep the first burying pattern 533 remaining between the underlying gate electrodes, forming the third spacer layer 540, performing an etch back process on the third spacer layer 540 to form the fourth burying pattern 543 between the underlying gate electrodes. Thus, each of the first upper contact plugs 572 and the underlying gate electrodes may be electrically insulated from each other.

Accordingly, each of the first upper contact plugs 572 may be electrically connected to only a desired gate electrode, and an electrical short with other underlying gate electrodes may be avoided.

The vertical memory device may have the following structural features. The vertical memory device may include transistors on the substrate 100, a lower circuit pattern electrically connected to the transistors on the substrate 100, the CSP 240 on the lower circuit pattern, the channel connection pattern 460 and the support layer 300 sequentially stacked on the CSP 240, the gate electrodes 482, 484 and 486 spaced apart from each other in the first direction on the support layer 300 to be stacked in a staircase shape and extending in the second direction, the channels 380 extending through the gate electrodes 482, 484 and 486, the support layer 300 and the channel connection pattern 460 on the CSP 240 in the first direction and being electrically connected to each other by the channel connection pattern 460, the charge storage structure 370 covering an outer sidewall of each of the channels 380, the first upper contact plugs 572 arranged in the second direction each of which may contact only a pad of a corresponding one of the gate electrodes 482, 484 and 486 to be electrically connected thereto, the fourth burying pattern 543 contacting a bottom surface of each of the first upper contact plugs 572 and extending at least partially through one of the gate electrodes 482, 484 and 486 under the corresponding one thereof, the first burying pattern 533 under the fourth burying pattern 543, the fourth upper contact plug 600 extending in the first direction on the CSP 240 to be electrically connected thereto, and the through via 610 extending in the first direction on a portion of the lower circuit pattern, that is, the sixth lower wiring 224.

In an implementation, the vertical memory device may include the dummy channel 385 spaced apart from the first upper contact plugs 572 on the pad of the corresponding one of the gate electrodes 482, 484 and 486 and extending in the first direction through the underlying gate electrodes, the support layer 300 and the channel connection pattern 460 to contact the CSP 240.

Figure 36:
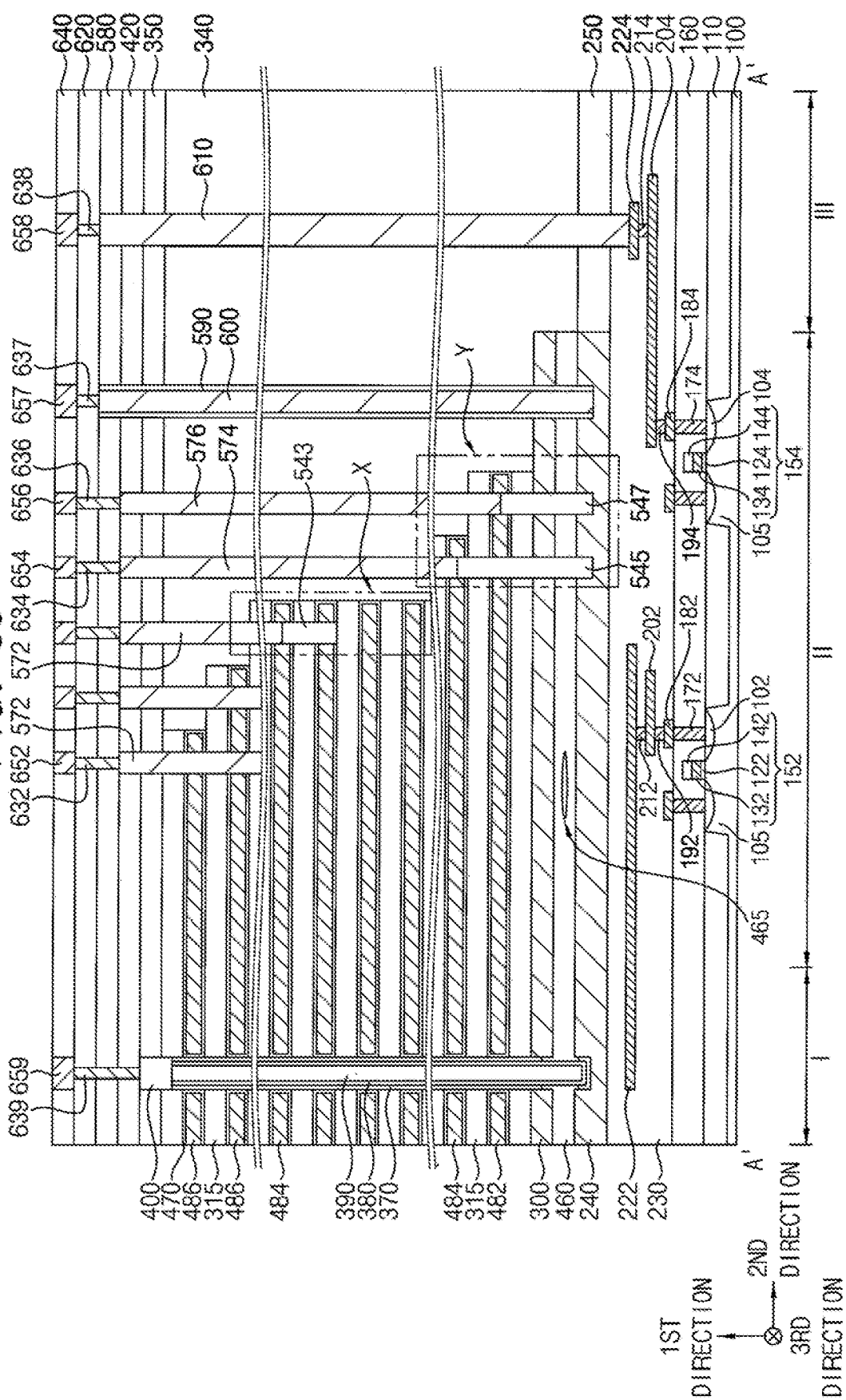
FIG. 36 illustrates a cross-sectional view of a vertical memory device in accordance with example embodiments.

FIG. 36 is a cross-sectional view of a vertical memory device in accordance with example embodiments. This vertical memory device may be substantially the same as or similar to that of FIG. 35, except for some elements, and thus like reference numerals refer to like elements, and repeated descriptions may be omitted herein.

Referring to FIG. 36, like the sixth burying pattern 547 under the third upper contact plug 576, a bottom surface of the fifth burying pattern 545 under the second upper contact plug 574 may contact the CSP 240, and a height (e.g., from the substrate 100 in the first direction) of the bottom surface of the fifth burying pattern 545 may be similar to that of the sixth burying pattern 547.

Figure 37:
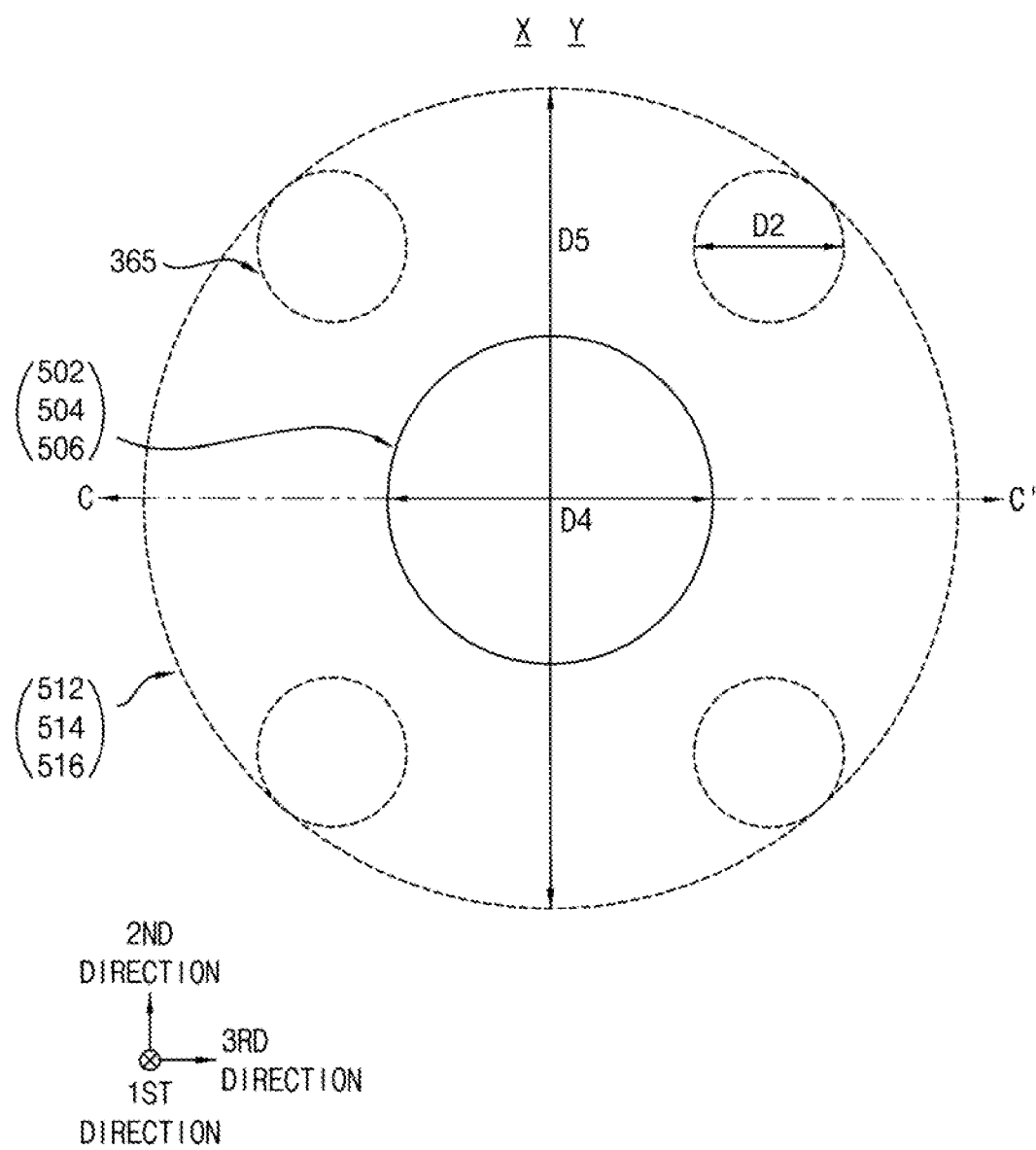
FIGS. 37 to 48 illustrate plan views and cross-sectional views of stages in a method of manufacturing a vertical memory device in accordance with example embodiments.
Figure 46:
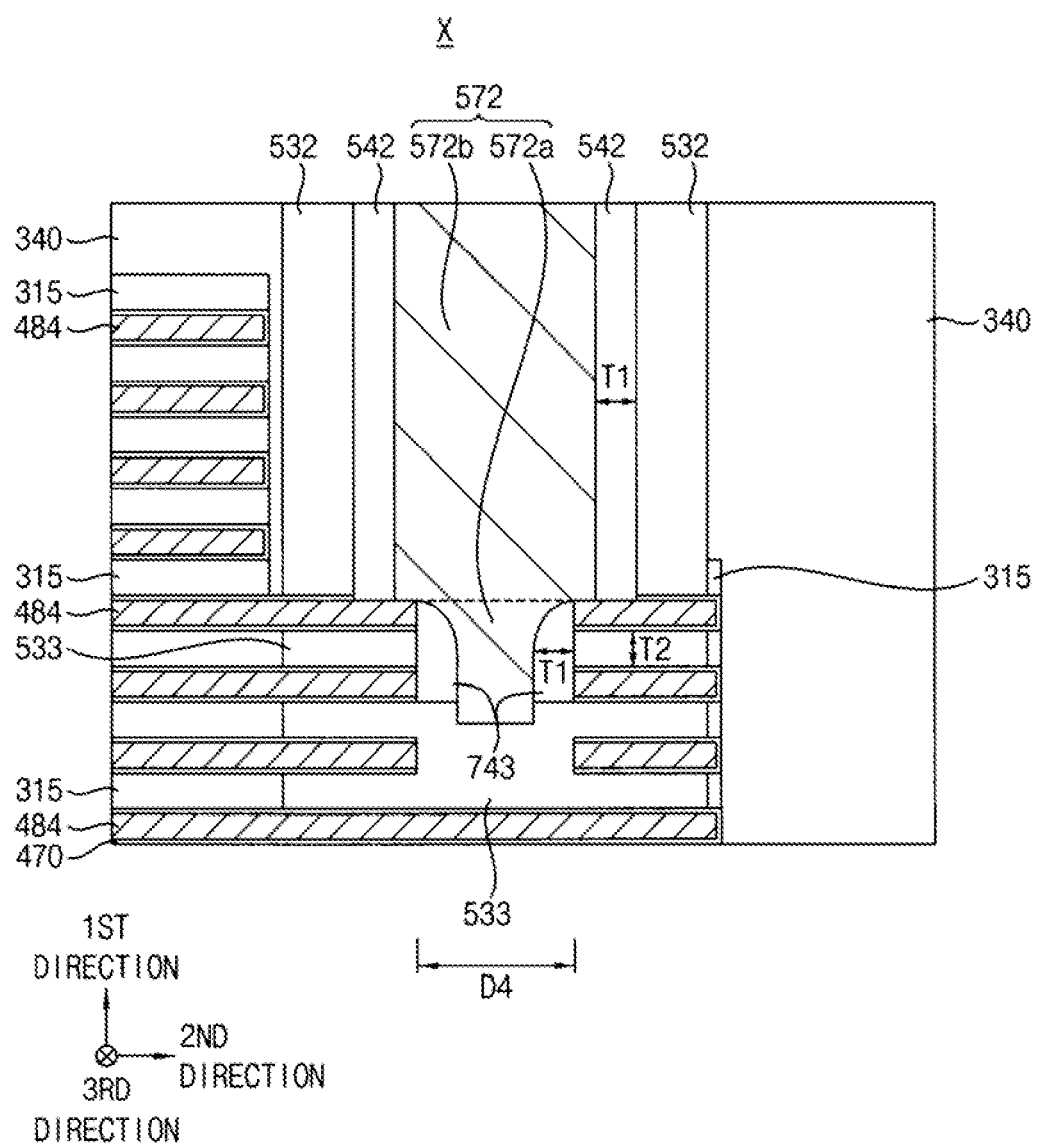
Figure 47:
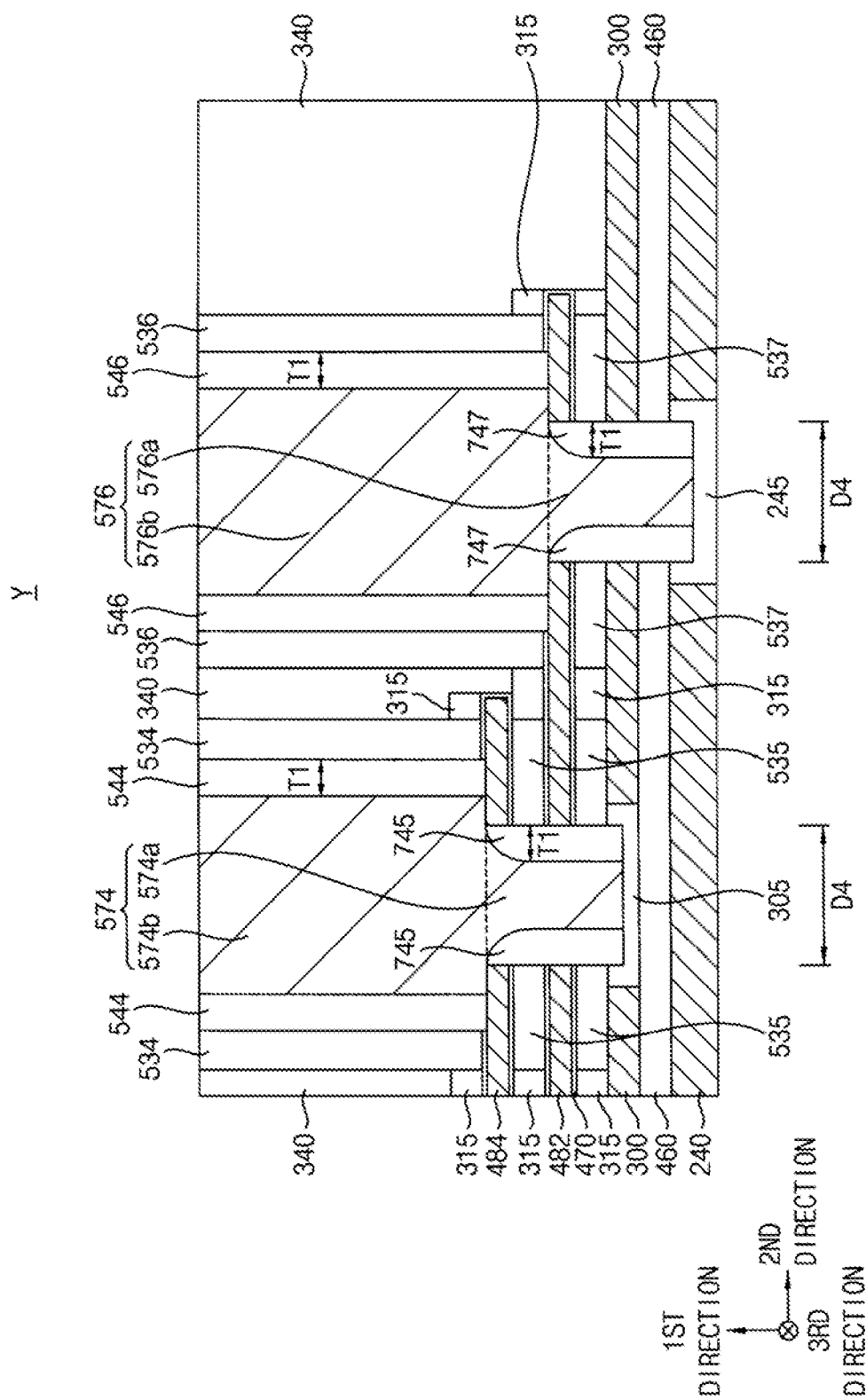
Figure 48:
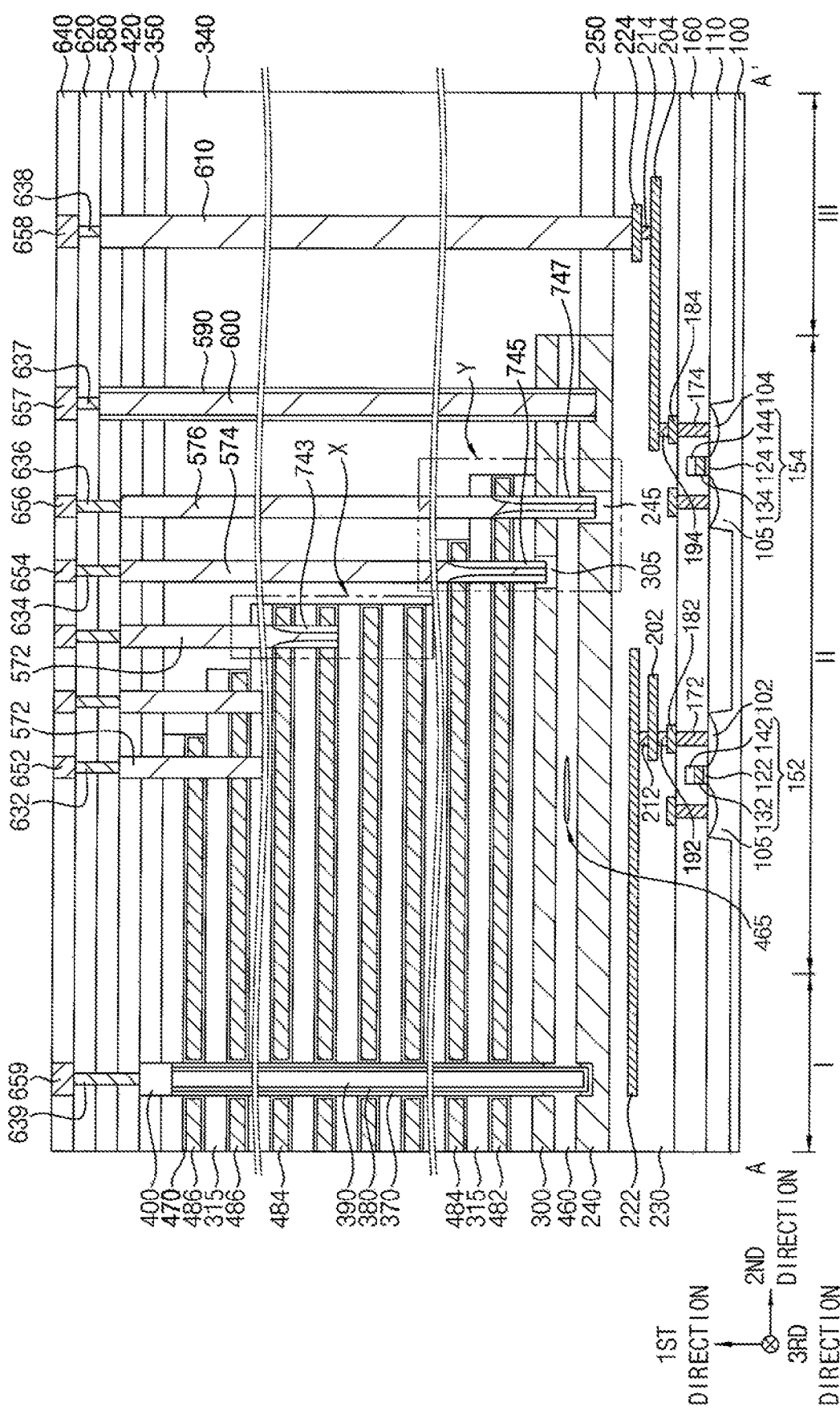

FIGS. 37 to 48 are plan views and cross-sectional views of stages in a method of manufacturing a vertical memory device in accordance with example embodiments. FIG. 37 is a plan view of the region X or Y of FIG. 13, FIGS. 38, 40, 42, 44 and 46 are cross-sectional views taken along a line C-C' of the region X, and FIGS. 39, 41, 43, 45 and 47 are cross-sectional views taken along a line C-C' of the region Y. FIG. 48 is a cross-sectional view taken along a line A-A' of a corresponding plan view.

This method may include processes substantially the same as or similar to those illustrated with reference to FIGS. 1 to 35, and repeated descriptions thereon may be omitted herein.

Processes substantially the same as or similar to FIGS. 1 to 15 may be performed.

Referring to FIG. 37, a fourth diameter D4 of each of the third to fifth openings 502, 504 and 506 may be greater, e.g., much greater, than the second diameter D2 of each of the dummy channel holes 365 in which the dummy channel 385 extending through the pad of the gate electrodes is formed. For example, the fourth diameter D4 may be about three times as large as the second diameter D2.

Figure 38:
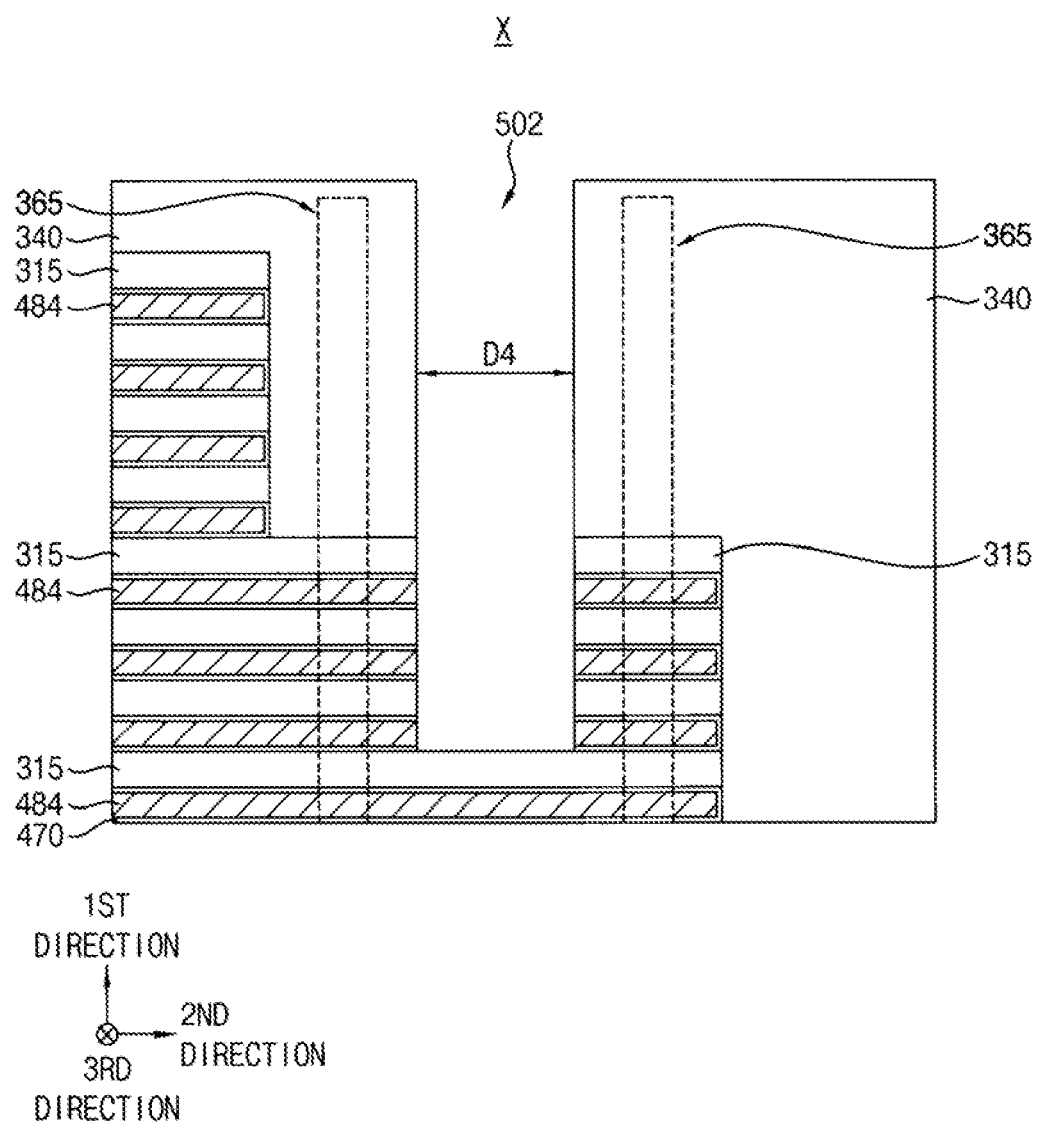
Figure 39:
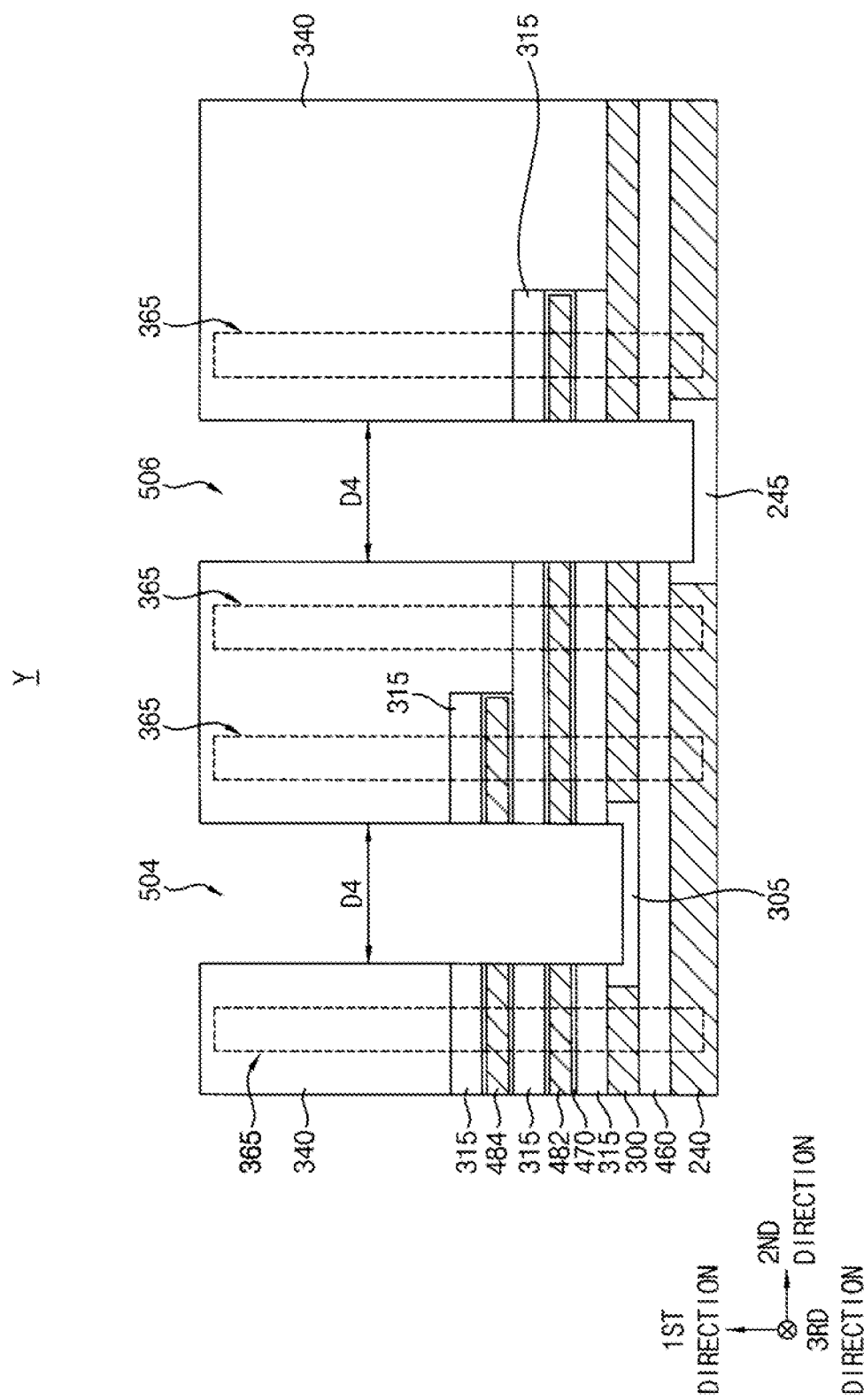

Referring to FIGS. 38 and 39, processes substantially the same as or similar to those illustrated with reference to FIGS. 17 and 18 may be performed. The fourth opening 504 may extend through the fourth insulating interlayer 340, the lowermost one of the second gate electrodes 484, the first gate electrode 482, and ones of the first insulation patterns 315 thereon or thereunder to expose a third insulation pattern 305 in the support layer 300. The fifth opening 506 may extend through the fourth insulating interlayer 340, the first gate electrode 482, ones of the first insulation patterns 315 thereon or thereunder, the support layer 300, and the channel connection pattern 460 to expose a second insulation pattern 245 in the CSP 240.

In an implementation, the second and third insulation patterns 245 and 305 may include a nitride, e.g., silicon nitride or an oxide, e.g., silicon oxide.

However, if the fifth opening 506 extends through only the channel connection pattern 460 or the support layer 300, the second insulation pattern 245 may be formed therein, and the fifth opening 506 may expose the second insulation pattern 245.

Figure 40:
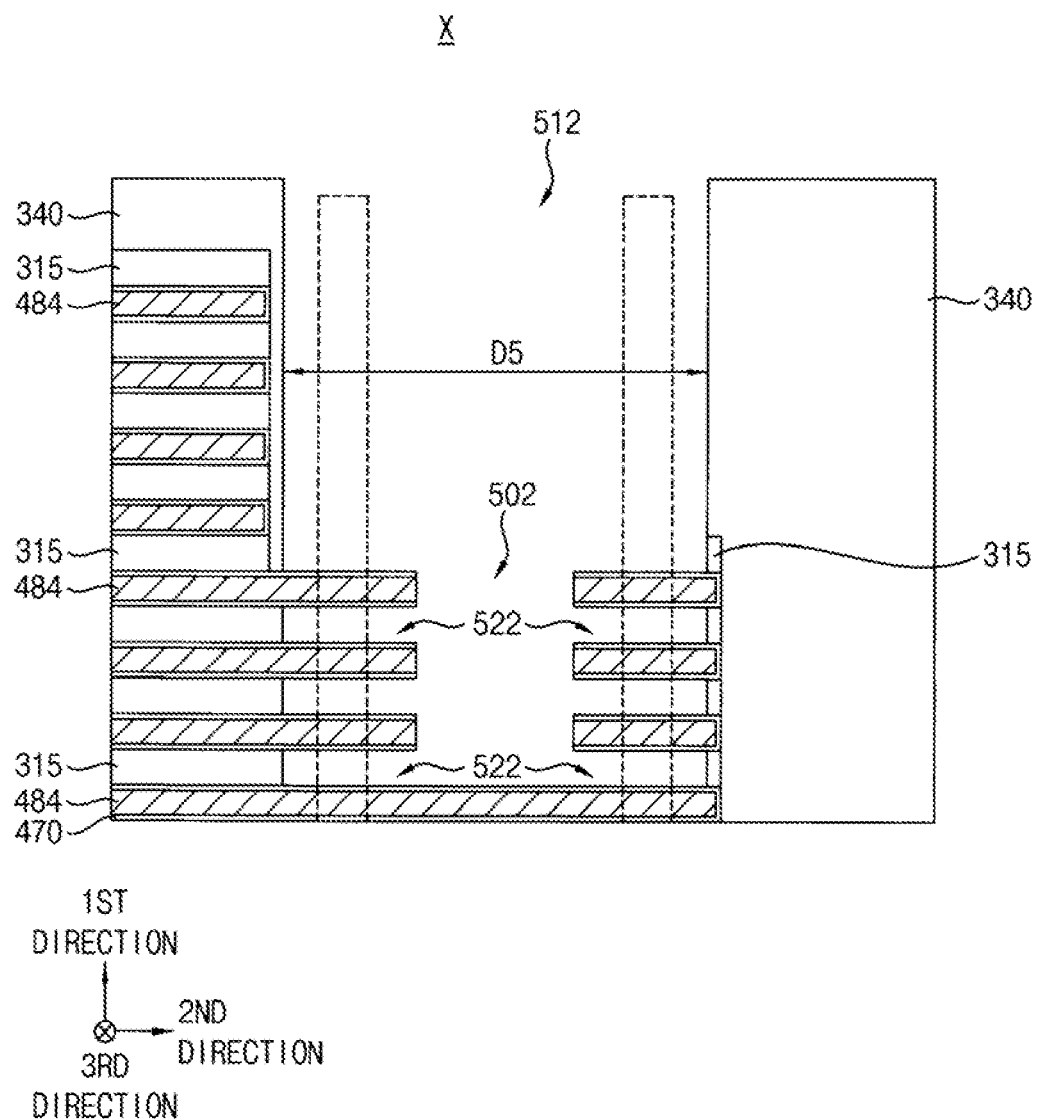
Figure 41:
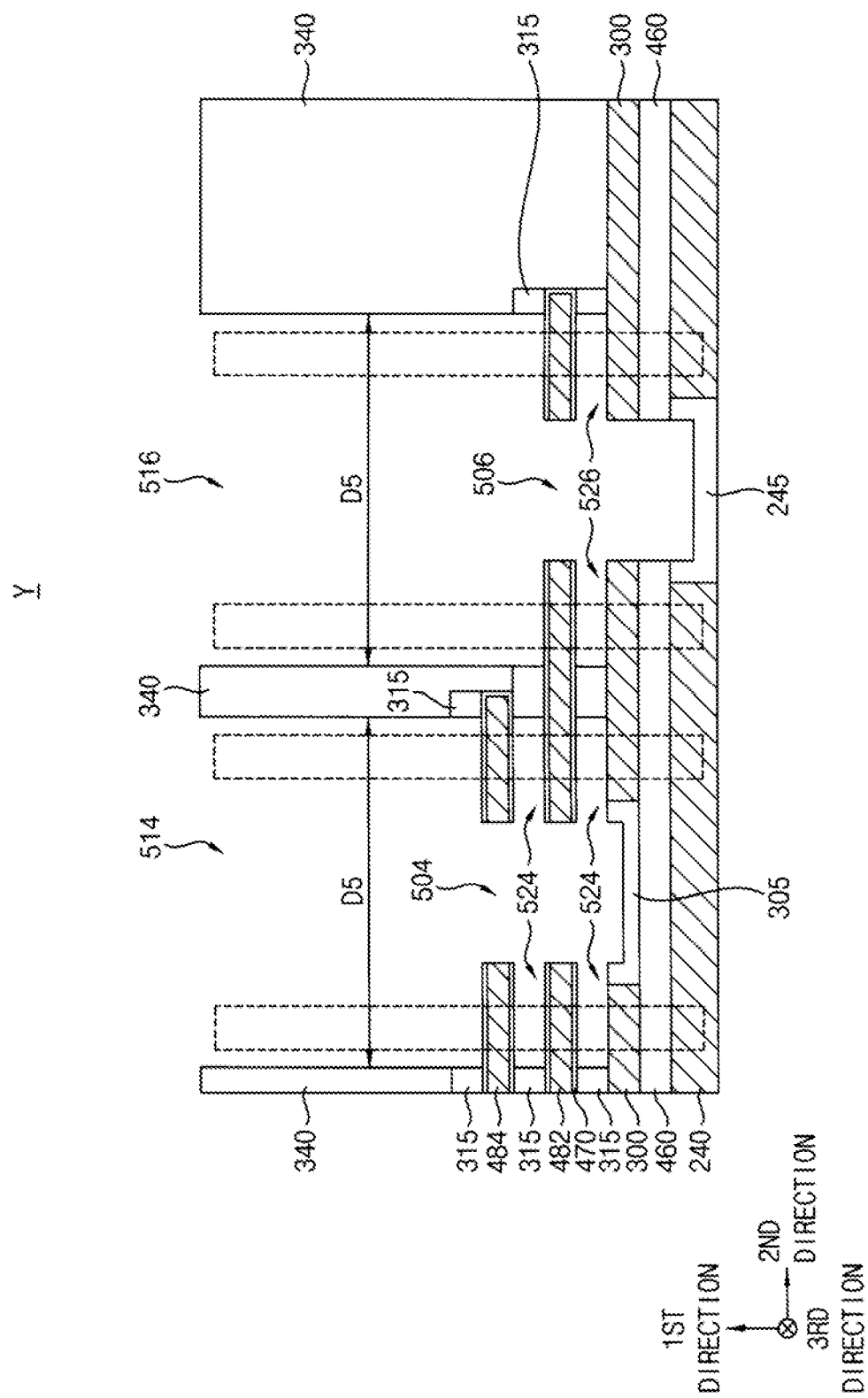

Referring to FIGS. 37, 40 and 41, processes substantially the same as or similar to those illustrated with reference to FIGS. 16, 19 and 20 may be performed. The upper widths of the third to fifth openings 502, 504 and 506 may be enlarged to form the sixth to eighth openings 512, 514 and 516 having a fifth diameter D5, and the first insulation patterns 315 exposed by the third to fifth openings 502, 504 and 506 may be partially removed to form the third to fifth gaps 522, 524 and 526, respectively.

Figure 42:
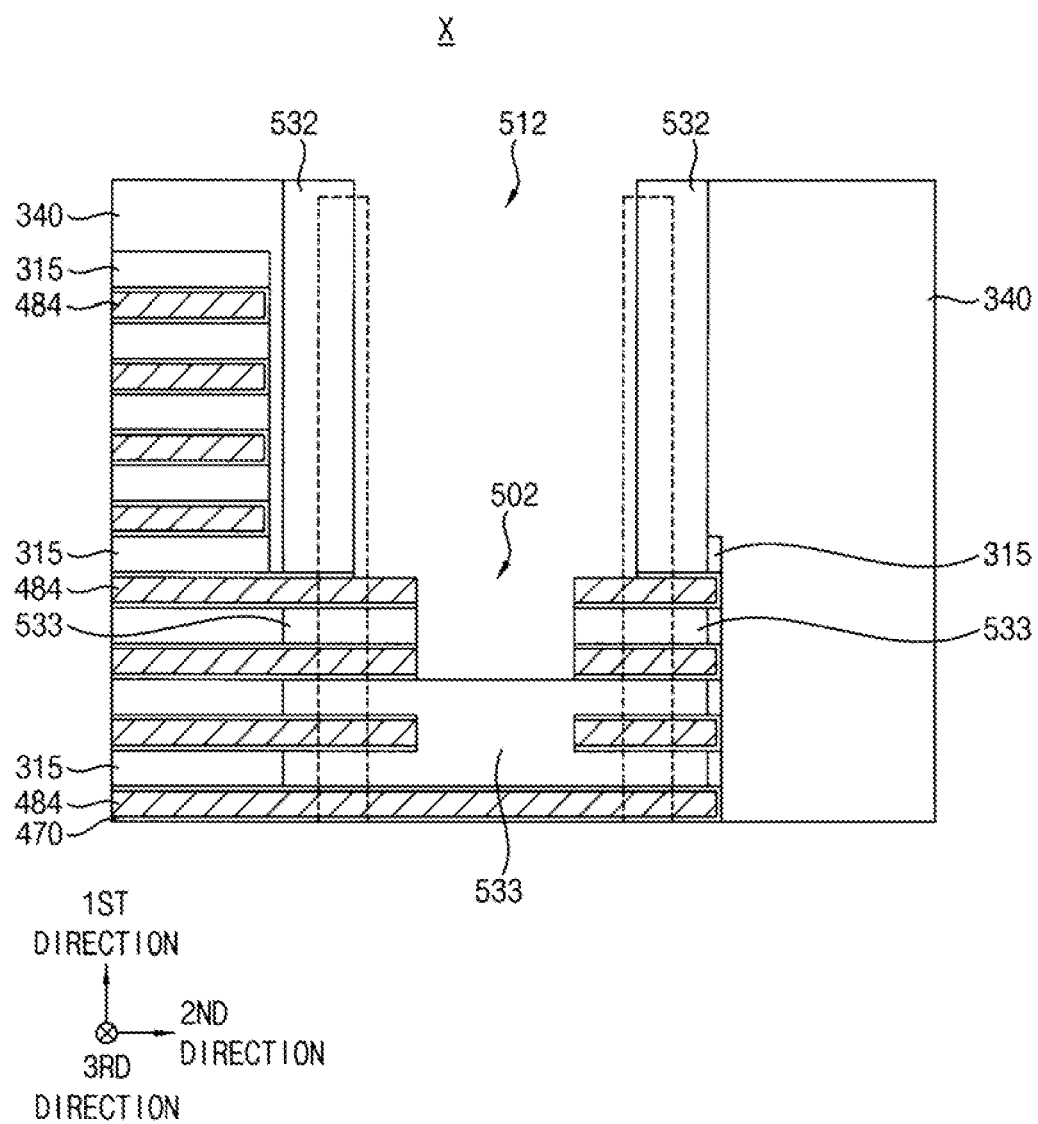
Figure 43:
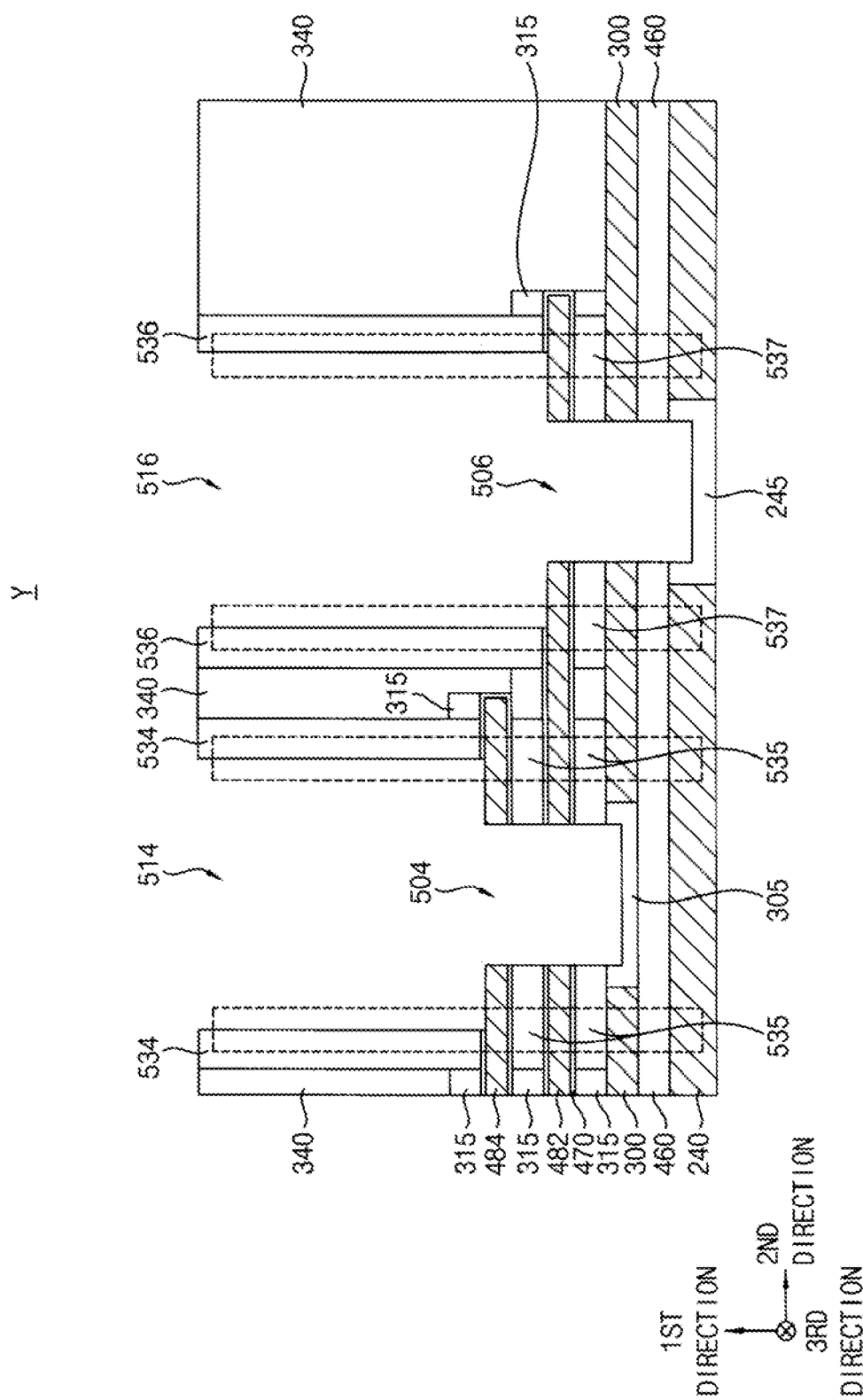

Referring to FIGS. 42 and 43, processes substantially the same as or similar to FIGS. 21 to 24 may be performed so that the second spacer 532 may be formed on the sidewall of the sixth opening 512 and that the first burying pattern 533 may be formed between the second gate electrodes 484 and in the lower portion of the third opening 502.

The third spacer 534 may be formed on the sidewall of the seventh opening 514, and the second burying pattern 535 may remain between the first and second gate electrodes 482 and 484 and between the support layer 300 and the first gate electrode 482. The fourth spacer 536 may be formed on the sidewall of the eighth opening 516, and the third burying pattern 537 may remain between the support layer 300 and the first gate electrode 482.

Figure 44:
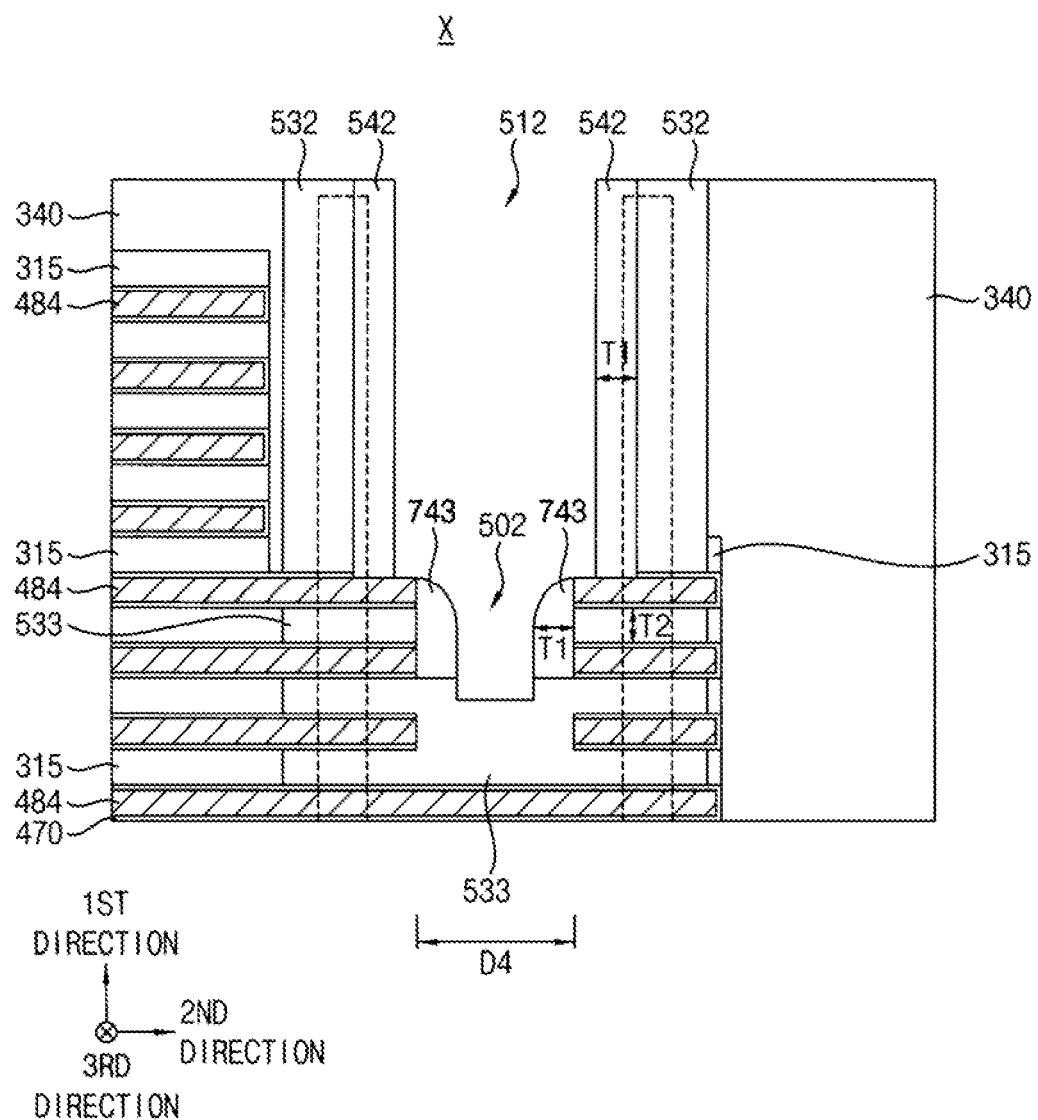
Figure 45:
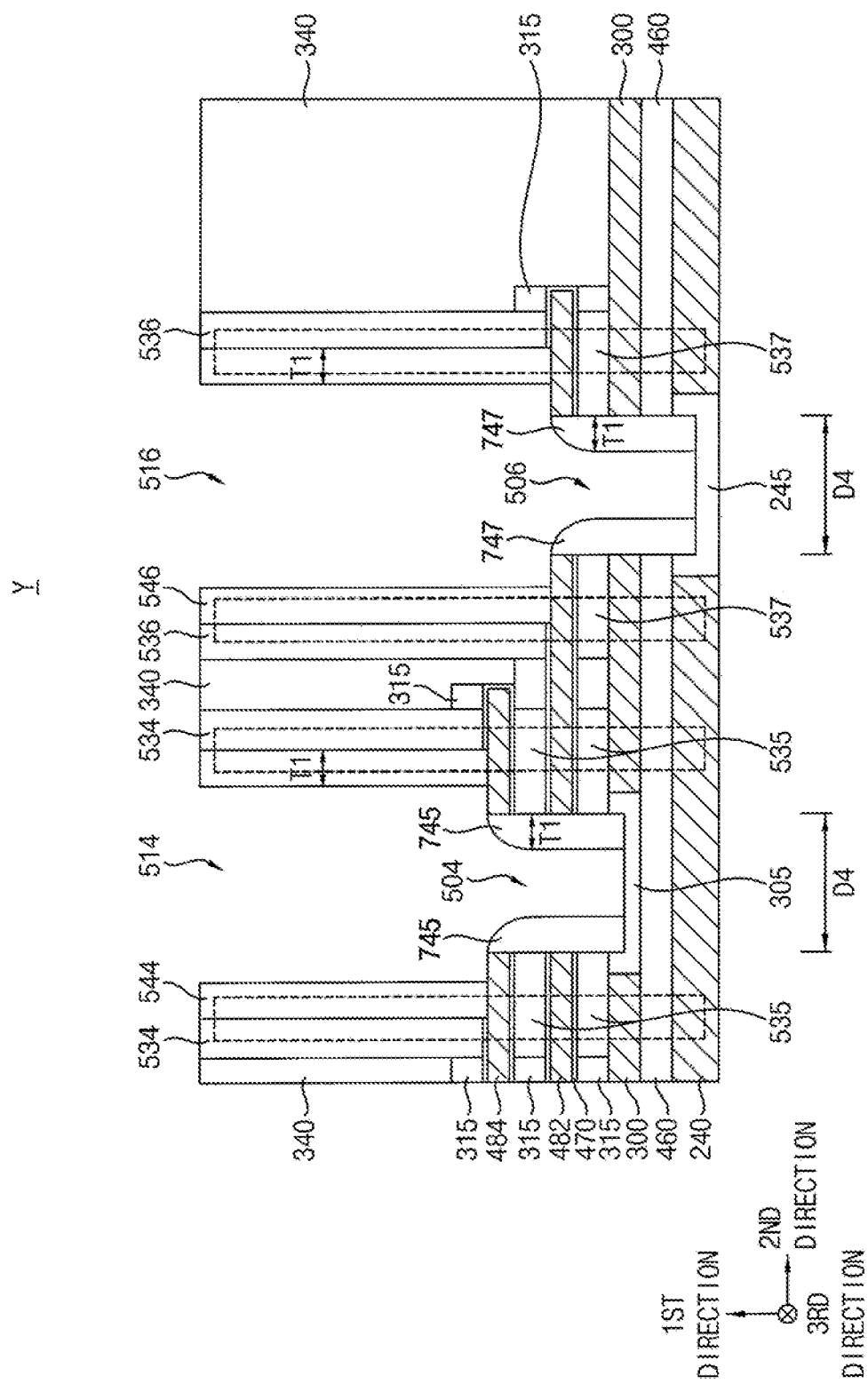

Referring to FIGS. 44 and 45, processes substantially the same as or similar to FIGS. 25 to 28 may be performed.

In an implementation, a first thickness T1 (e.g., in the second direction) of the third spacer layer 540 may be equal to or greater than a second thickness T2 (in the first direction) of the first insulation pattern 315, and may be less than half the fourth diameter D4 of each of the third to fifth openings 502, 504 and 506.

Accordingly, by the etch back process, the fifth spacer 542 may be formed on the inner sidewall of the second spacer 532, the upper surface of the uppermost one of the second gate electrodes 484 under the sixth opening 512 may be partially exposed, and a ninth spacer 743 may be formed on the sidewall of the third opening 502 on the first burying pattern 533. The ninth spacer 743 may not entirely fill the third opening 502 (unlike the fourth burying pattern 543 shown in FIG. 27), and thus an upper portion of the first burying pattern 533 may be partially removed.

Likewise, the sixth spacer 544 may be formed on the inner sidewall of the third spacer 534, the upper surface of the second gate electrode 484 may be partially exposed, and a tenth spacer 745 may be formed on the sidewall of the fourth opening 504, which may not fill a central portion of the fourth opening 504.

Additionally, the seventh spacer 546 may be formed on the inner sidewall of the fourth spacer 536, the upper surface of the first gate electrode 482 may be partially exposed, and an eleventh spacer 747 may be formed on the sidewall of the fifth opening 506, which may not fill a central portion of the fifth opening 506.

Referring to FIGS. 46 and 47, processes substantially the same as or similar to FIGS. 29 and 30 may be performed, so that the first to third upper contact plugs 572, 574 and 576 may be formed to fill the sixth to eighth openings 512, 514 and 516, respectively.

In an implementation, the first to third upper contact plugs 572, 574 and 576 may also fill the third to fifth openings 502, 504 and 506, respectively, under the sixth to eighth openings 512, 514 and 516, respectively. The first upper contact plug 572 may include a lower portion 572a filling the third opening 502 and an upper portion 572b filling the sixth opening 512 and having a width greater than that of the lower portion 572a, the second upper contact plug 574 may include a lower portion 574a filling the fourth opening 504 and an upper portion 574b filling the seventh opening 514 and having a width greater than that of the lower portion 574a, and the third upper contact plug 576 may include a lower portion 576a filling the fifth opening 506 and an upper portion 576b filling the eighth opening 516 and having a width greater than that of the lower portion 576a.

In an implementation, the second and third upper contact plugs 574 and 576 may be electrically insulated from the support layer 300 and the CSP 240 by the third and second insulation patterns 305 and 245 in the support layer 300 and the CSP 240, respectively.

Referring to FIG. 48, processes substantially the same as or similar to FIGS. 31 to 35 may be performed to complete the fabrication of the vertical memory device. However, in order to avoid the complexity of drawings, in FIG. 48, the first to third burying patterns 533, 535 and 537 and the second to seventh spacers 532, 534, 536, 542, 544 and 546 are not shown (refer to FIGS. 46 and 47), which may be the same hereinafter.

As described above, in this method of manufacturing the vertical memory device, the widths of the third to fifth openings 502, 504 and 506 may be greater than those of FIGS. 1 to 35, and the ninth to eleventh spacers 743, 745 and 747 may not entirely fill the third to fifth openings 502, 504 and 506, respectively. In an implementation, the ninth to eleventh spacers 743, 745 and 747 may at least cover the sidewalls of the gate electrodes exposed by the third to fifth openings 502, 504 and 506.

Each of the first to third upper contact plugs 572, 574 and 576 may contact an upper surface of an uppermost one among the gate electrodes through which each of the first to third upper contact plugs 572, 574 and 576 may extend, and may be electrically connected thereto, but may be electrically insulated from the underlying gate electrodes by a corresponding one of the ninth to eleventh spacers 743, 745 and 747. In an implementation, the ninth to eleventh spacers 743, 745 and 747 may have a thickness equal to or greater than a distance between the gate electrodes 482, 484 and 486, and the insulation between the first to third upper contact plugs 572, 574 and 576 and the gate electrodes may be sufficient.

For example, even though the first to third upper contact plugs 572, 574 and 576 have the sufficiently large size, they may be electrically connected to only a desired one of the gate electrodes, and may be electrically insulated from the underlying gate electrodes.

Even though the first to third upper contact plugs 572, 574 and 576 may have the sufficiently large size between the dummy channels 385 on the pad of the gate electrode, they may be electrically insulated from the dummy channels 385 by the fifth to seventh spacers 542, 544 and 546, the ninth to eleventh spacers 743, 745 and 747, and the first to third burying patterns 533, 535 and 537.

The vertical memory device may further include the following features beside the common features with the vertical memory device of FIG. 35.

In an implementation, each of the first upper contact plugs 572 may contact an upper surface of an uppermost one of corresponding ones among the first to third gate electrodes 482, 484 and 486 to extend through the pad of the uppermost one, and may extend through other portions of other ones of the corresponding ones among the first to third gate electrodes 482, 484 and 486.

In an implementation, referring to FIG. 15, one of the first upper contact plugs 572 extending through a pad of a gate electrode at a relatively higher level (e.g., at a step of the staircase shape farther from the substrate 100 in the first direction) may extend through a greater number of gate electrodes than that of another one of the first upper contact plugs 572 extending through a pad of a gate electrode at a relatively lower level (e.g., at a step of the staircase shape closer to the substrate 100 in the first direction). In an implementation, one of the first upper contact plugs 572 extending through a pad of a gate electrode at a relatively higher level may have a bottom surface higher than that of another one of the first upper contact plugs 572 extending through a pad of a gate electrode at a relatively lower level.

In an implementation, the vertical memory device may further include the ninth spacer 743 between each of the first upper contact plugs 572 and sidewalls of the corresponding ones of the gate electrodes, which may electrically insulate other ones except for an uppermost one among the corresponding ones of the gate electrodes from the first upper contact plugs 572, and the first burying pattern 533 contacting bottom surfaces of each of the first upper contact plugs 572 and the ninth spacer 743.

In an implementation, each of the first upper contact plugs 572 may include the lower portion 572a extending through the corresponding ones of the gate electrodes, and the upper portion 572b on the lower portion 572a and having a width greater than that of the lower portion 572a.

In an implementation, the vertical memory device may further include the fifth spacer 542 covering a sidewall of each of the first upper contact plugs 572 and including the same material as the ninth spacer 743, and the second spacer 532 on an outer sidewall of the fifth spacer 542 and including the same material as the first burying pattern 533. A maximum thickness of the ninth spacer 743 may be substantially equal to the first thickness T1 of the fifth spacer 542.

In an implementation, the first burying pattern 533 may be formed between other ones of the corresponding ones of the gate electrodes, and a width (e.g., in the second direction) of the first burying pattern 533 may be substantially equal to a width (e.g., in the second direction) by an outer sidewall of the second spacer 532.

In an implementation, the first burying pattern 533 may be also formed between the uppermost one of the corresponding ones of the gate electrodes and one of the corresponding ones directly under the uppermost one to surround an outer sidewall of the ninth spacer 743, and width by an outer sidewall of the first burying pattern 533 may be substantially equal to the width by the outer sidewall of the second spacer 532.

In an implementation, upper and lower surfaces and a sidewall of each of the gate electrodes 482, 484 and 486 may be covered by the second blocking pattern 470 including a metal oxide, and the second blocking pattern 470 may not cover sidewalls of openings in the gate electrodes through which each of the first upper contact plugs 572 extends, which may face each of the first upper contact plugs 572. The ninth spacer 743 may directly contact the sidewalls of openings in the gate electrodes, the sidewalls of the openings facing each of the first upper contact plugs 572.

In an implementation, the second blocking pattern 470 may not cover an upper surface of the uppermost one of the corresponding ones among the gate electrodes adjacent each of the first upper contact plugs 572, e.g., a portion of the uppermost one thereof being overlapped with the fifth spacer 542 in the first direction, and the portion may directly contact the fifth spacer 542.

In an implementation, the second blocking pattern 470 may cover a sidewall of each of the gate electrodes 482, 484 and 486 facing the charge storage structure 370 on an outer sidewall of the channel 380, and the sidewall of each of the gate electrodes 482, 484 and 486 may not directly contact the charge storage structure 370.

In an implementation, the vertical memory device may further include the third upper contact plug 576 extending through a pad of the first gate electrode 482 at a lowermost level among the first to third gate electrodes 482, 484 and 486 to contact an upper surface of the first gate electrode 482 and extending through the support layer 300, the channel connection pattern 460 and an upper portion of the CSP 240, the eleventh spacer 747 extending through the sidewall of the first gate electrode 482 facing the third upper contact plug 576, the support layer 300, the channel connection pattern 460 and an upper portion of the CSP 240 to surround the third upper contact plug 576, and the second insulation pattern 245 in the CSP 240 and contacting bottom surface of the third upper contact plug 576 and the eleventh spacer 747.

In an implementation, the vertical memory device may further include the second upper contact plug 574 extending through a pad of one of the gate electrodes 482, 484 and 486 at a second level from below, e.g., a lowermost one of the second gate electrodes 484 and the first gate electrode 482 to contact an upper surface of the lowermost one of the second gate electrodes 484 and extending through a portion of the support layer 300, the tenth spacer 745 between the second upper contact plug 574 and sidewalls of the lowermost one of the second gate electrodes 484 and the first gate electrode 482 facing the second upper contact plug 574 to electrically insulate the second upper contact plug 574 from the first gate electrode 482, and the third insulation pattern 305 on the support layer 300 and contacting bottom surfaces of the second upper contact plug 574 and the tenth spacer 745.

Figure 49:
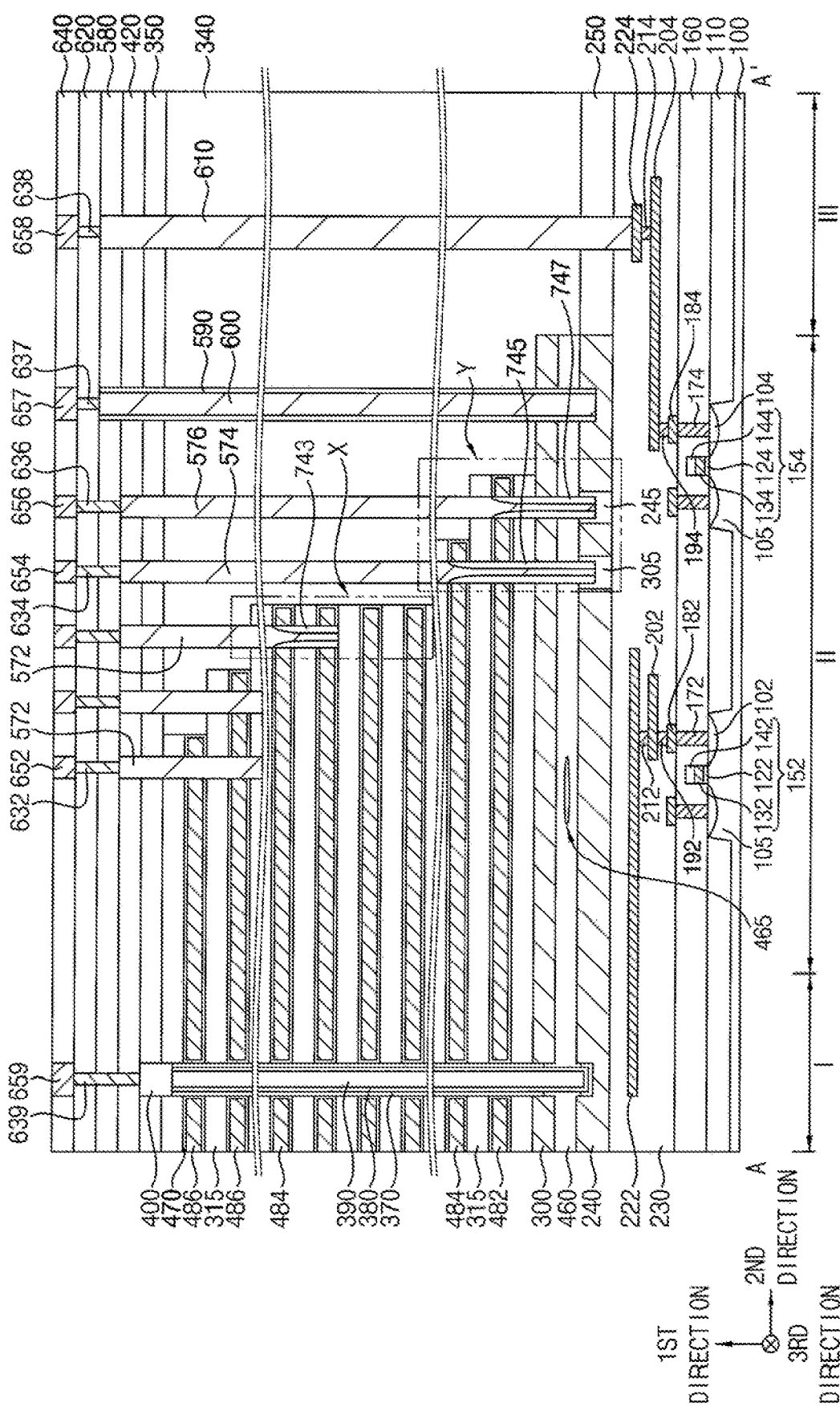
FIG. 49 illustrates a cross-sectional view of a vertical memory device in accordance with example embodiments.

FIG. 49 is a cross-sectional view of a vertical memory device in accordance with example embodiments. This vertical memory device may be substantially the same as or similar to that of FIG. 48, except for some elements. Like reference numerals refer to like elements, and repeated descriptions thereon may be omitted herein.

Referring to FIG. 49, like the third upper contact plug 576 and the eleventh spacer 747, the second upper contact plug 574 and the tenth spacer 745 may extend to the CSP 240, and may contact the second insulation pattern 245 in the CSP 240.

Figure 50:
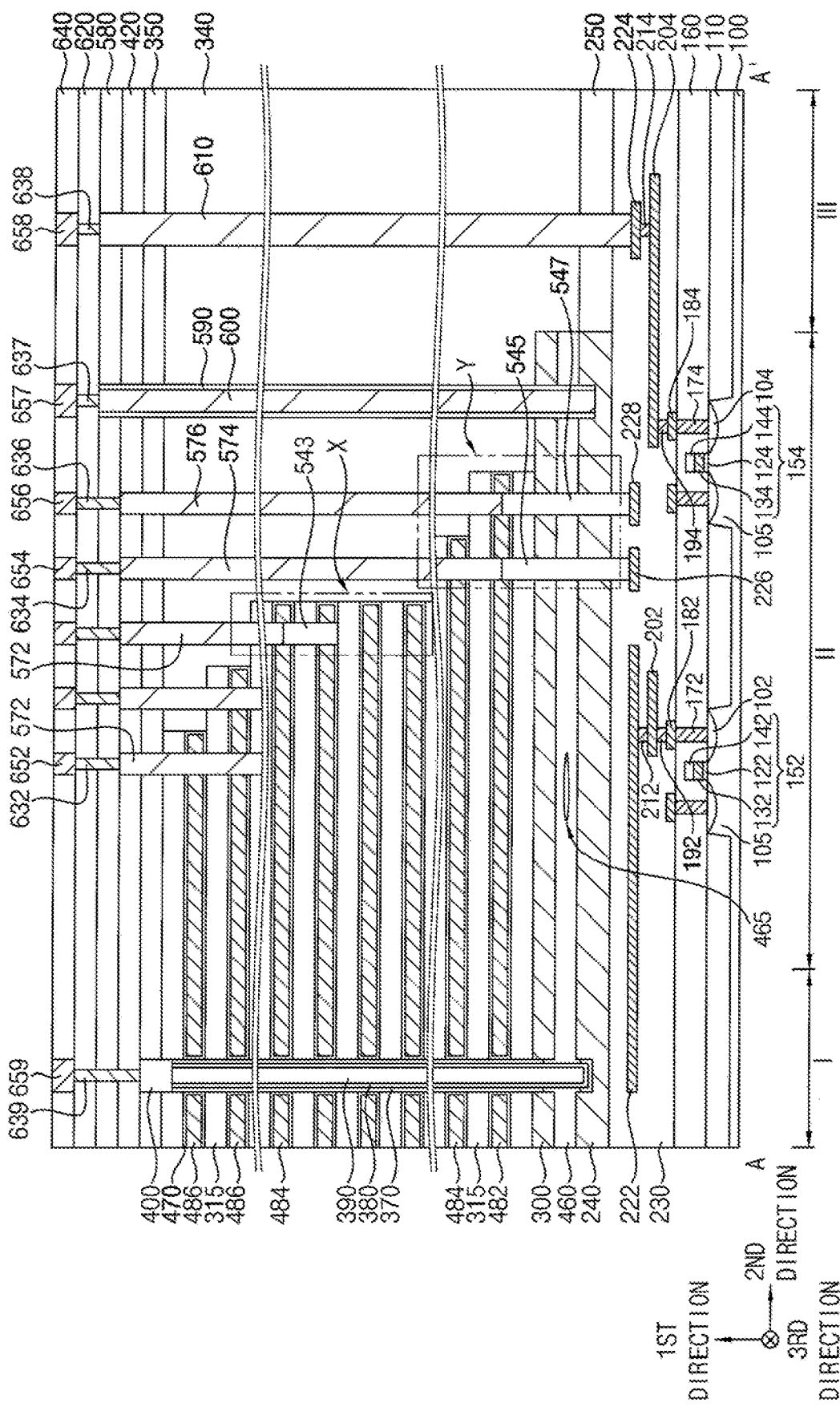
FIGS. 50 and 51 illustrate cross-sectional views of vertical memory devices in accordance with example embodiments.
Figure 51:
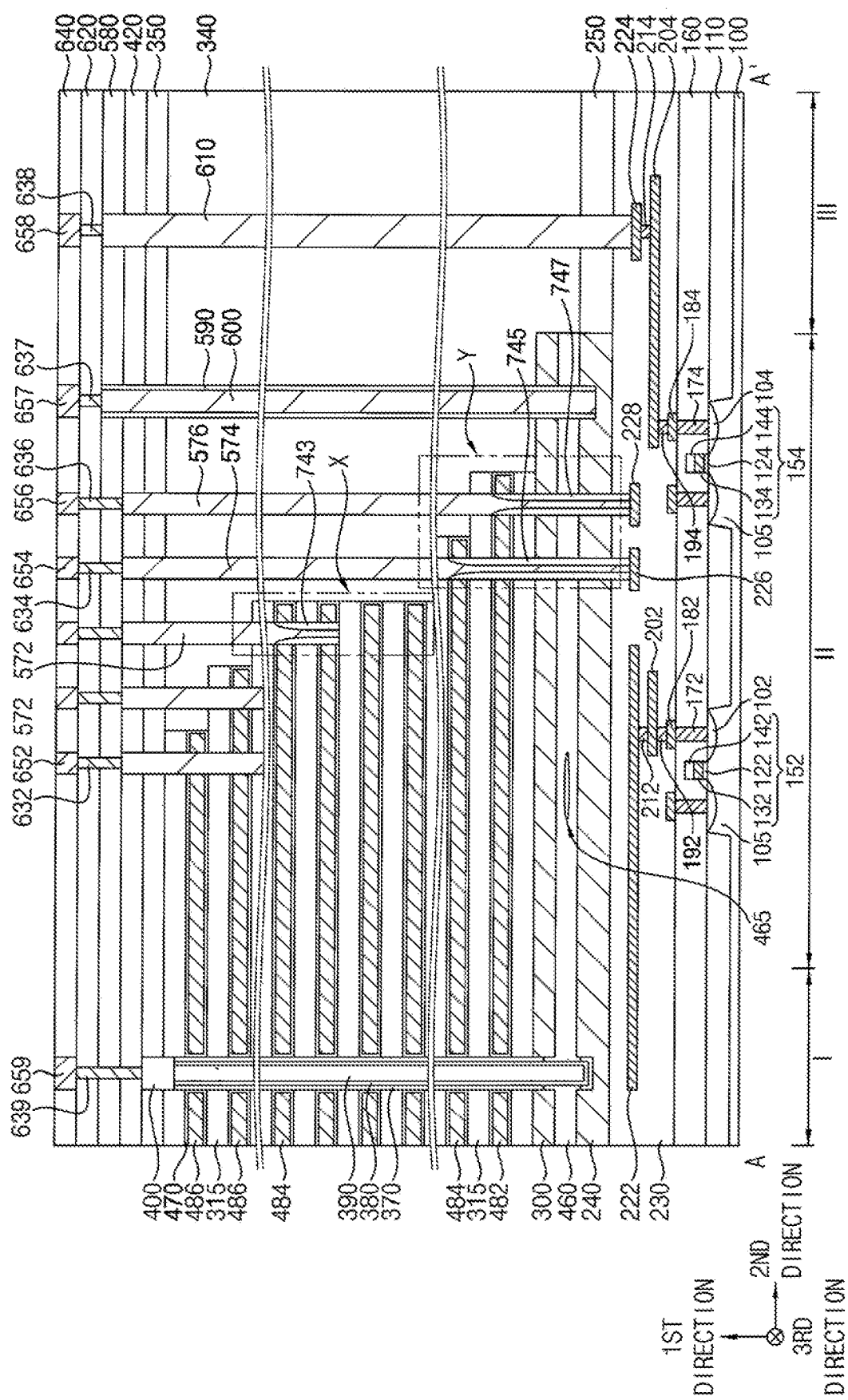

FIGS. 50 and 51 are cross-sectional views of vertical memory devices in accordance with example embodiments. These vertical memory devices may be substantially the same as or similar to those of FIGS. 35 and 48, respectively, except for some elements. Like reference numerals refer to like elements, and repeated descriptions thereon are omitted herein.

Referring to FIG. 50, the fifth and sixth burying patterns 545 and 547 under the second and third upper contact plugs 574 and 576 may further extend downwardly to extend through the CSP 240 and an upper portion of the second insulating interlayer 230, and may contact first and second etch stop patterns 226 and 228, respectively, in the second insulating interlayer 230.

The first and second etch stop patterns 226 and 228 may be formed by the process for forming the fifth and sixth lower wirings 222 and 224, and may include the same material as that of the fifth and sixth lower wirings 222 and 224. The first and second etch stop patterns 226 and 228 may not be electrically connected to other elements of the lower circuit pattern.

The fifth opening 506 and/or the fourth opening 504 may extend downwardly through the CSP 240, and when the third to fifth openings 502, 504 and 506 for forming the first to third upper contact plugs 572, 574 and 576 are formed, the first and second etch stop patterns 226 and 228 may help prevent the third upper contact plug 576 and/or the second upper contact plug 574 from being electrically connected to the lower circuit pattern.

Referring to FIG. 51, the second and third upper contact plugs 574 and 576 and the tenth and eleventh spacers 745 and 747 may extend downwardly through the CSP 240 and an upper portion of the second insulating interlayer 230, and may contact the first and second etch stop patterns 226 and 228, respectively, in the second insulating interlayer 230.

By way of summation and review, if openings for forming contact plugs were to be formed at the same time not only a desired gate electrode: but also other gate electrodes thereunder could be etched due to the height difference, so that an electrical short could occur between the desired gate electrode and the underlying gate electrodes.

One or more embodiments may provide a vertical memory device having improved electrical characteristics.

In the vertical memory device in accordance with example embodiments, each of upper contact plugs electrically connected to each of gate electrodes may be electrically insulated from other gate electrodes thereunder, and may have improved electrical characteristics. Even though each of the upper contact plugs may have a desired size, it may be electrically insulated from dummy channels.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:
a substrate;
gate electrodes on the substrate, the gate electrodes being spaced apart from each other in a first direction that is substantially perpendicular to an upper surface of the substrate and the gate electrodes being stacked in a staircase arrangement;
a channel extending through the gate electrodes in the first direction;
at least one first contact plug extending through a pad of a first gate electrode among the gate electrodes to contact an upper surface of the first gate electrode, the at least one first contact plug extending through at least a portion of a second gate electrode among the gate electrodes, and the second gate electrode being adjacent to the first gate electrode such that the second gate electrode is a next closest gate electrode under the first gate electrode in the first direction;
a first spacer between the at least one first contact plug and sidewalls of the first gate electrode and the second gate electrode facing the at least one first contact plug, the first spacer electrically insulating the at least one first contact plug from the second gate electrode; and
a first burying pattern contacting bottom surfaces of the at least one first contact plug and the first spacer, the first burying pattern including an insulating material.

2. The vertical memory device as claimed in claim 1, wherein the at least one first contact plug includes:
a lower portion extending through the first gate electrode and the portion of the second gate electrode; and
an upper portion on the lower portion and connected thereto, the upper portion having a width greater than that of the lower portion in a second direction substantially parallel to the upper surface of the substrate.

3. The vertical memory device as claimed in claim 2, further comprising a second spacer covering a sidewall of the upper portion of the at least one first contact plug and including a material substantially the same as that of the first spacer.

4. The vertical memory device as claimed in claim 3, wherein a maximum thickness of the first spacer is substantially equal to a thickness of the second spacer.

5. The vertical memory device as claimed in claim 3, further comprising a third spacer on an outer sidewall of the second spacer, the third spacer including a material substantially the same as that of the first burying pattern.

6. The vertical memory device as claimed in claim 5, wherein:
the first burying pattern extends between the second gate electrode and a next closest one of the gate electrodes under the second gate electrode in the first direction, and
a width of the first burying pattern in the second direction is substantially equal to a distance between outer sidewalls of the third spacer in the second direction.

7. The vertical memory device as claimed in claim 6, wherein:
an upper part of the first burying pattern is between the first gate electrode and the second gate electrode and surrounds an outer sidewall of the first spacer,
a distance between outer sidewalls of the upper part of the first burying pattern in the second direction is substantially equal to the distance between outer sidewalls of the third spacer in the second direction.

8. The vertical memory device as claimed in claim 1, wherein the first burying pattern extends through a next closest one of the gate electrodes under the second gate electrode in the first direction.

9. The vertical memory device as claimed in claim 1, wherein:
each of the gate electrodes extends in a second direction substantially parallel to the upper surface of the substrate, and
a plurality of first contact plugs is arranged in the second direction, each first contact plug of the plurality of first contact plugs extends through a pad of an assigned gate electrode.

10. The vertical memory device as claimed in claim 9, wherein one of the first contact plugs extending through a pad of a gate electrode that is distal to the substrate has a bottom surface that is farther from the substrate in the first direction than that of another one of the first contact plugs extending through a pad of a gate electrode that is proximate to the substrate.

11. The vertical memory device as claimed in claim 9, wherein:
each of the first contact plugs extends through the second gate electrode and at least one third gate electrode among the gate electrodes, the at least one third gate electrode being under the second gate electrode, and
one of the first contact plugs extending through a pad of a gate electrode distal to the substrate extends through a greater number of the gate electrodes than that of another one of the first contact plugs extending through a pad of a gate electrode proximate to the substrate.

12. The vertical memory device as claimed in claim 1, further comprising:
a lower circuit pattern on the substrate;
an insulating interlayer on the substrate, the insulating interlayer covering the lower circuit pattern; and
a common source plate (CSP) on the insulating interlayer, wherein the gate electrodes are on the CSP.

13. The vertical memory device as claimed in claim 12, further comprising:
a second contact plug extending through a pad of a third gate electrode at a lowermost level among the gate electrodes to contact an upper surface of the third gate electrode, the second contact plug extending to a portion of the CSP;
a second spacer extending from a sidewall of the third gate electrode facing the second contact plug to the portion of the CSP to surround a lower part of the second contact plug; and
a first insulation pattern in the CSP, the first insulation pattern contacting bottom surfaces of the second contact plug and the second spacer.

14. The vertical memory device as claimed in claim 13, further comprising a channel connection pattern and a support layer sequentially stacked between the CSP and the third gate electrode,
wherein the second contact plug and the second spacer extend through the channel connection pattern and the support layer.

15. The vertical memory device as claimed in claim 14, further comprising:
- a fourth gate electrode disposed between the second gate electrode and the third gate electrode,
- a third contact plug extending through a pad of the fourth gate electrode at a second level from below among the gate electrodes and the third gate electrode to contact an upper surface of the fourth gate electrode, the third contact plug extending to a portion of the support layer;
- a third spacer between the third contact plug and sidewalls of the third gate electrode and the fourth gate electrode facing the third contact plug, the third spacer electrically insulating the third contact plug from the third gate electrode; and
- a second insulation pattern in the support layer, the second insulation pattern contacting bottom surfaces of the third contact plug and the third spacer.

16. A vertical memory device, comprising:
- a substrate;
- gate electrodes on the substrate and spaced apart from each other in a vertical direction substantially perpendicular to an upper surface of the substrate, the gate electrodes being stacked in a staircase shape;
- a blocking pattern covering most of a lower surface, an upper surface, and a sidewall of each of the gate electrodes;
- a channel extending through the gate electrodes in the vertical direction;
- a contact plug extending through a pad of a first gate electrode among the gate electrodes to directly contact an upper surface of the first gate electrode, the contact plug extending through at least a portion of a second gate electrode among the gate electrodes, and the second gate electrode being adjacent to the first gate electrode such that the second gate electrode is a next closest gate electrode under the first gate electrode in the vertical direction; and
- a first spacer between the contact plug and sidewalls of openings in the first gate electrode and the second gate electrode facing the contact plug, the first spacer electrically insulating the contact plug from the second gate electrode,
- wherein the blocking pattern does not cover the sidewalls of the openings in the first gate electrode and the second gate electrode facing the contact plug such that the first spacer directly contacts the sidewalls of the openings in the first and second gate electrodes, the sidewalls of the openings in the first and second gate electrodes facing the contact plug.

17. The vertical memory device as claimed in claim 16, wherein the contact plug includes:
- a lower portion extending through the first gate electrode and the at least the portion of the second gate electrode; and
- an upper portion on the lower portion and connected thereto, the upper portion having a width in a horizontal direction substantially parallel to the upper surface of the substrate that is greater than that of the lower portion.

18. The vertical memory device as claimed in claim 17, further comprising a second spacer covering a sidewall of the upper portion of the contact plug, the second spacer including a material substantially the same as that of the first spacer.

19. The vertical memory device as claimed in claim 18, wherein the blocking pattern does not cover a portion of an upper surface of the first gate electrode that is overlapped with the second spacer in the vertical direction such that the second spacer directly contacts the upper surface of the first gate electrode.

20. A vertical memory device, comprising:
- a lower circuit pattern on a substrate;
- a common source plate (CSP) on the lower circuit pattern;
- gate electrodes spaced apart from each other on the CSP in a first direction substantially perpendicular to an upper surface of the substrate, the gate electrodes being stacked in a staircase shape;
- a channel extending through the gate electrodes in the first direction;
- at least one first contact plug extending through a pad of a first gate electrode among the gate electrodes to contact an upper surface of the first gate electrode, the at least one first contact plug extending through at least a portion of a second gate electrode among the gate electrodes, and the second gate electrode being adjacent to the first gate electrode such that the second gate electrode is a next closest gate electrode under the first gate electrode in the first direction; and
- a first spacer between the at least one first contact plug and sidewalls of the first gate electrode and the second gate electrode facing the at least one first contact plug, the first spacer electrically insulating the at least one first contact plug from the second gate electrode;
- a second contact plug extending through a third gate electrode at a lowermost level among the gate electrodes to contact an upper surface of the third gate electrode, the second contact plug extending to a portion of the CSP;
- a second spacer extending from a sidewall of the third gate electrode facing the second contact plug to the portion of the CSP to surround the second contact plug; and
- a first insulation pattern in the CSP, the first insulation pattern contacting bottom surfaces of the second contact plug and the second spacer.

* * * * *